(12) United States Patent
Jinbo et al.

(10) Patent No.: US 9,997,576 B2
(45) Date of Patent: Jun. 12, 2018

(54) DISPLAY DEVICE

(71) Applicant: Semiconductor Energy Laboratory Co., Ltd., Atsugi-shi, Kanagawa-ken (JP)

(72) Inventors: Yasuhiro Jinbo, Isehara (JP); Kohei Yokoyama, Fujisawa (JP); Yuki Tamatsukuri, Atsugi (JP); Naoto Goto, Tochigi (JP); Masami Jintyou, Shimotsuga (JP); Masayoshi Dobashi, Shimotsuga (JP); Masataka Nakada, Tochigi (JP); Akihiro Chida, Isehara (JP); Naoyuki Senda, Kyoto (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days. days.

(21) Appl. No.: 15/456,887

(22) Filed: Mar. 13, 2017

(65) Prior Publication Data
US 2017/0271421 A1 Sep. 21, 2017

(30) Foreign Application Priority Data
Mar. 18, 2016 (JP) .................................. 2016-054682

(51) Int. Cl.
*H01L 27/32* (2006.01)
*H01L 51/52* (2006.01)

(52) U.S. Cl.
CPC ...... *H01L 27/3258* (2013.01); *H01L 51/5253* (2013.01); *H01L 2251/301* (2013.01); *H01L 2251/5338* (2013.01)

(58) Field of Classification Search
CPC ........... H01L 27/3258; H01L 2251/301; H01L 2251/5338
See application file for complete search history.

(56) References Cited

U.S. PATENT DOCUMENTS 8,809,879 B2   8/2014 Yoshizumi et al.
9,088,006 B2   7/2015 Yamazaki et al.
(Continued)

FOREIGN PATENT DOCUMENTS

CN   102738200 A   10/2012
CN   105280676 A    1/2016
(Continued)

OTHER PUBLICATIONS

International Search Report (Application No. PCT/IB2017/051374) dated Jul. 4, 2017.
(Continued)

*Primary Examiner* — Fernando L Toledo
*Assistant Examiner* — Neil Prasad
(74) *Attorney, Agent, or Firm* — Robinson Intellectual Property Law Office; Eric J. Robinson

(57) ABSTRACT

To provide a display device with a manufacturing yield and/or a display device with suppressed mixture of colors between adjacent pixels. The display device includes a first pixel electrode, a second pixel electrode, a first insulating layer, a second insulating layer, and an adhesive layer. The first insulating layer includes a first opening. The second insulating layer includes a second opening. The first opening and the second opening are provided between the first pixel electrode and the second pixel electrode. In a top view, a periphery of the second opening is positioned on an inner side than a periphery of the first opening. The adhesive layer has a region overlapping with the second insulating layer below the second insulating layer.

11 Claims, 33 Drawing Sheets

(56) References Cited

U.S. PATENT DOCUMENTS

| | | | |
|---|---|---|---|
| 9,231,043 B2 * | 1/2016 | Sato | .................... H01L 27/3276 |
| 9,373,809 B2 | 6/2016 | Adachi et al. | |
| 2003/0015961 A1 | 1/2003 | Yamazaki | |
| 2012/0248475 A1 | 10/2012 | Yamada et al. | |
| 2013/0248867 A1 | 9/2013 | Kim et al. | |
| 2015/0325812 A1 | 11/2015 | Yamazaki et al. | |
| 2015/0357388 A1 | 12/2015 | Pang | |

FOREIGN PATENT DOCUMENTS

| | | | |
|---|---|---|---|
| EP | 2955766 A | 12/2015 |
| JP | 2003-092191 A | 3/2003 |
| JP | 2010-097697 A | 4/2010 |
| JP | 2012-216338 A | 11/2012 |
| JP | 2014-197522 | 10/2014 |
| KR | 2012-0112067 A | 10/2012 |
| KR | 2013-0107883 A | 10/2013 |
| KR | 2015-0141338 A | 12/2015 |
| TV | 201306349 | 2/2013 |

OTHER PUBLICATIONS

Written Opinion (Application No. PCT/IB2017/051374) dated Jul. 4, 2017.

\* cited by examiner

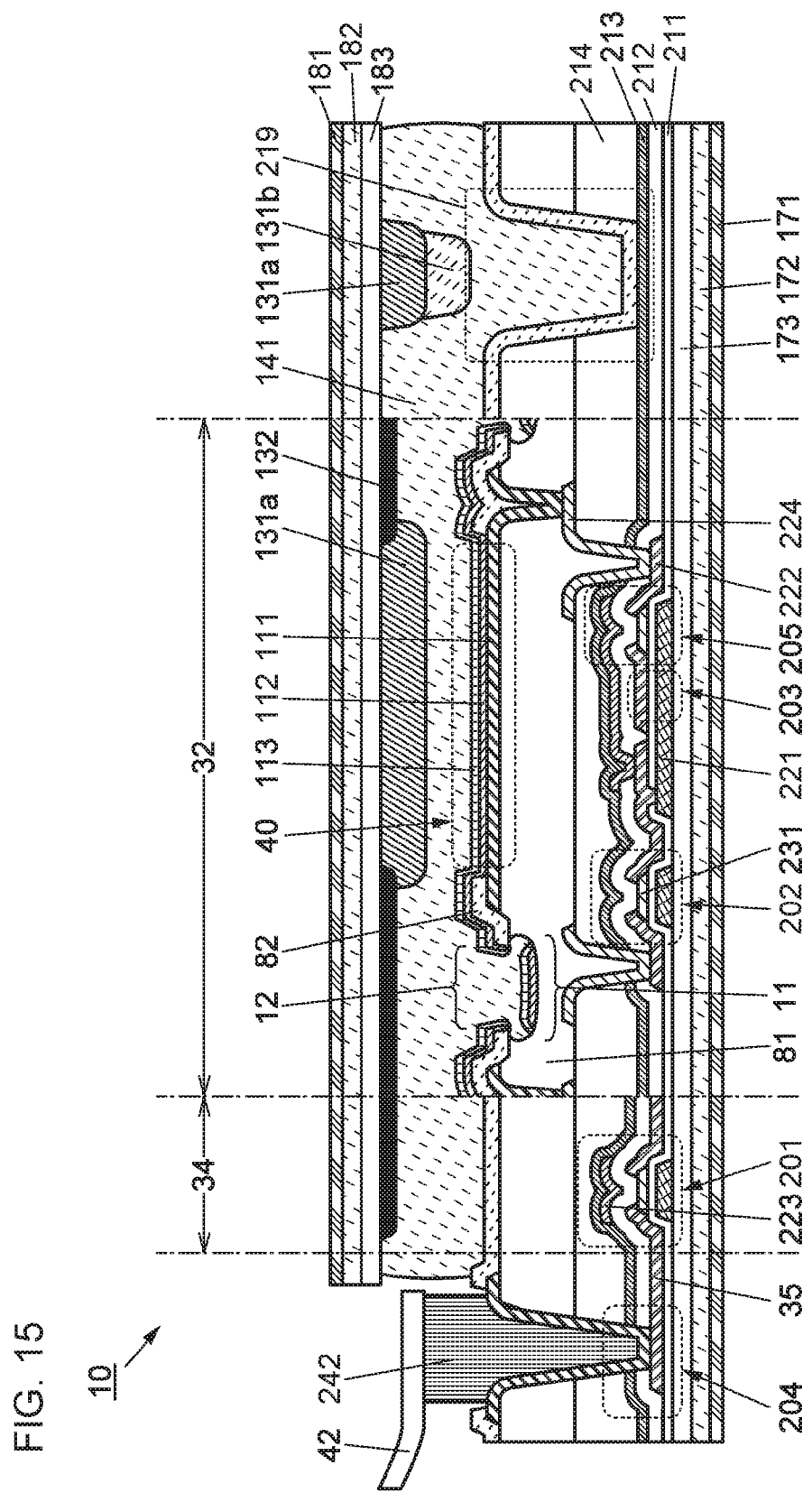

FIG. 18A
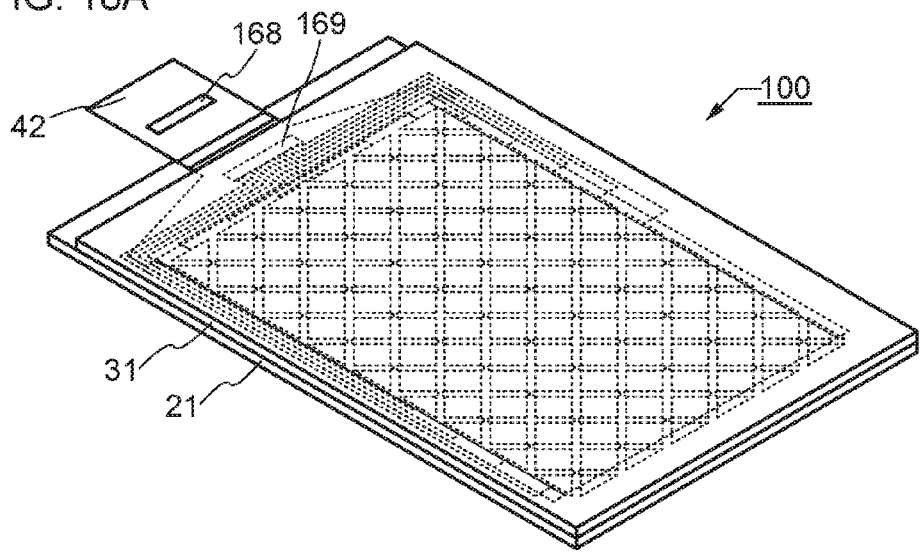
FIG. 18B
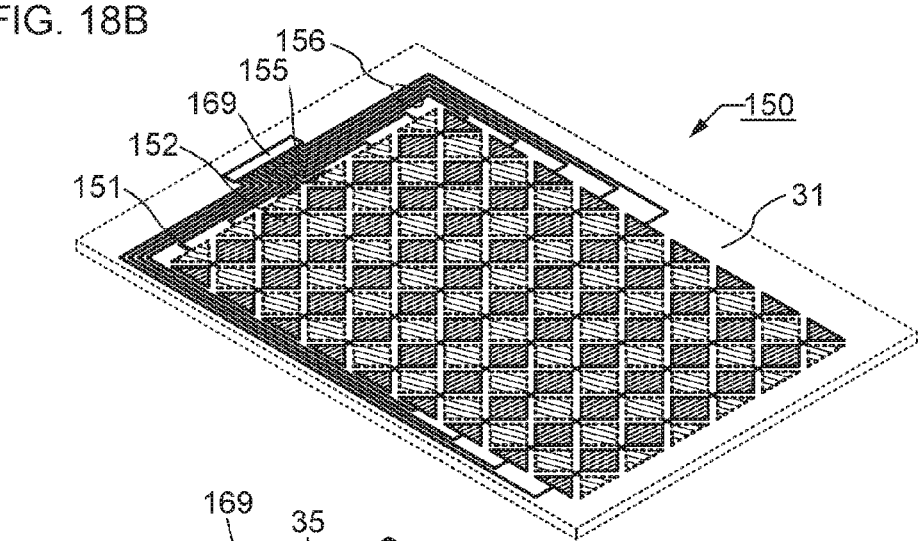
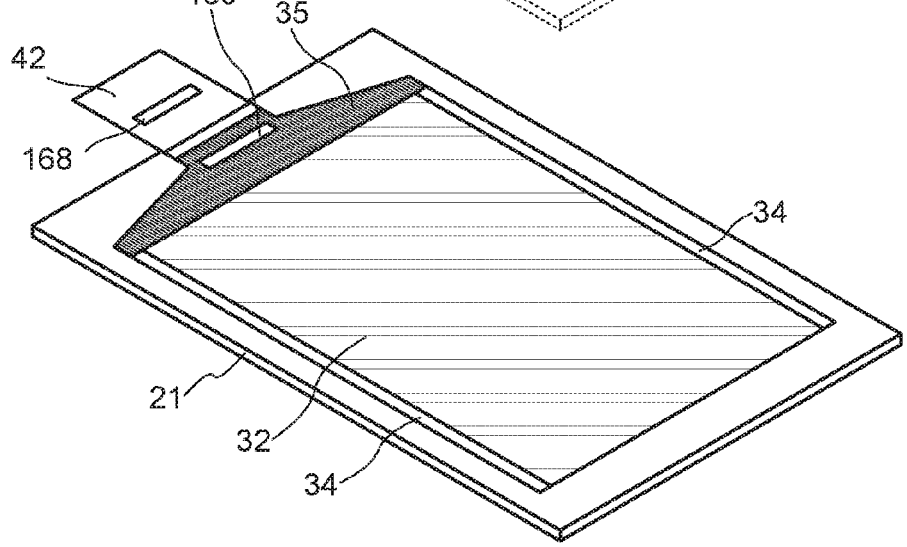

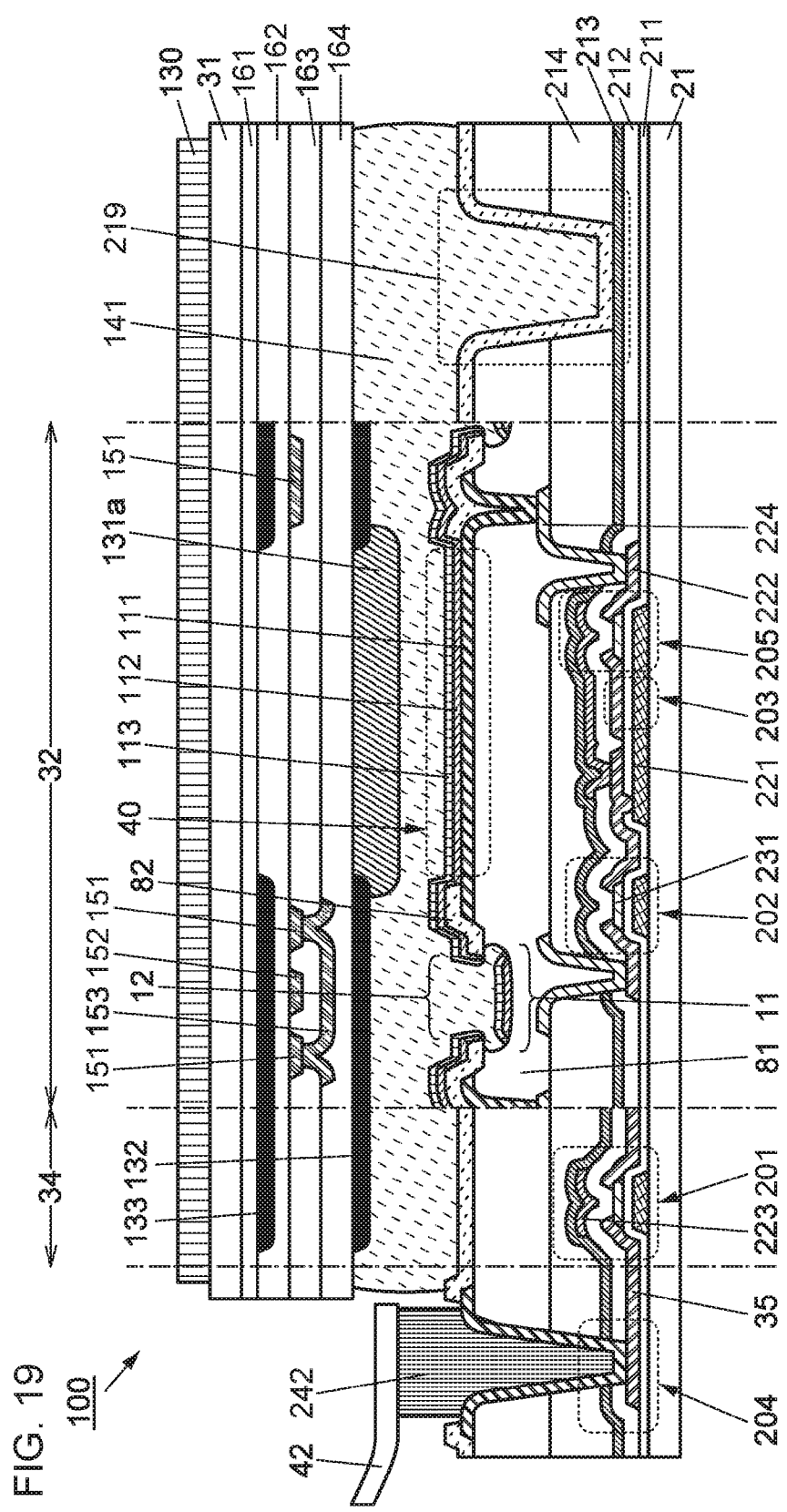

FIG. 21A
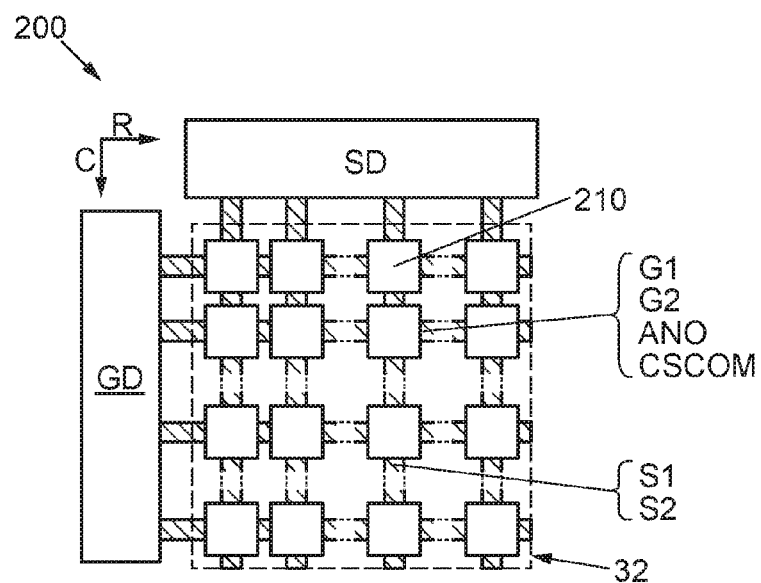
FIG. 21B1
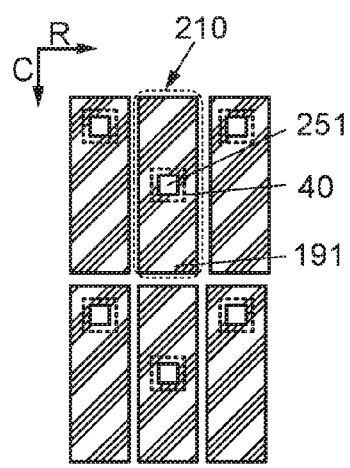
FIG. 21B2
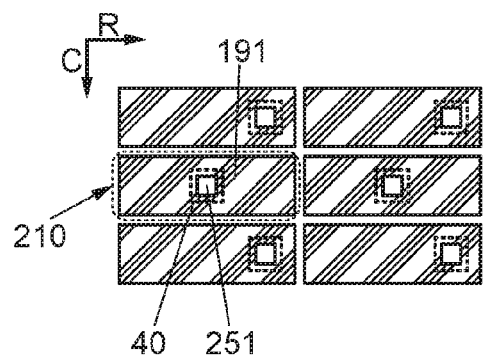

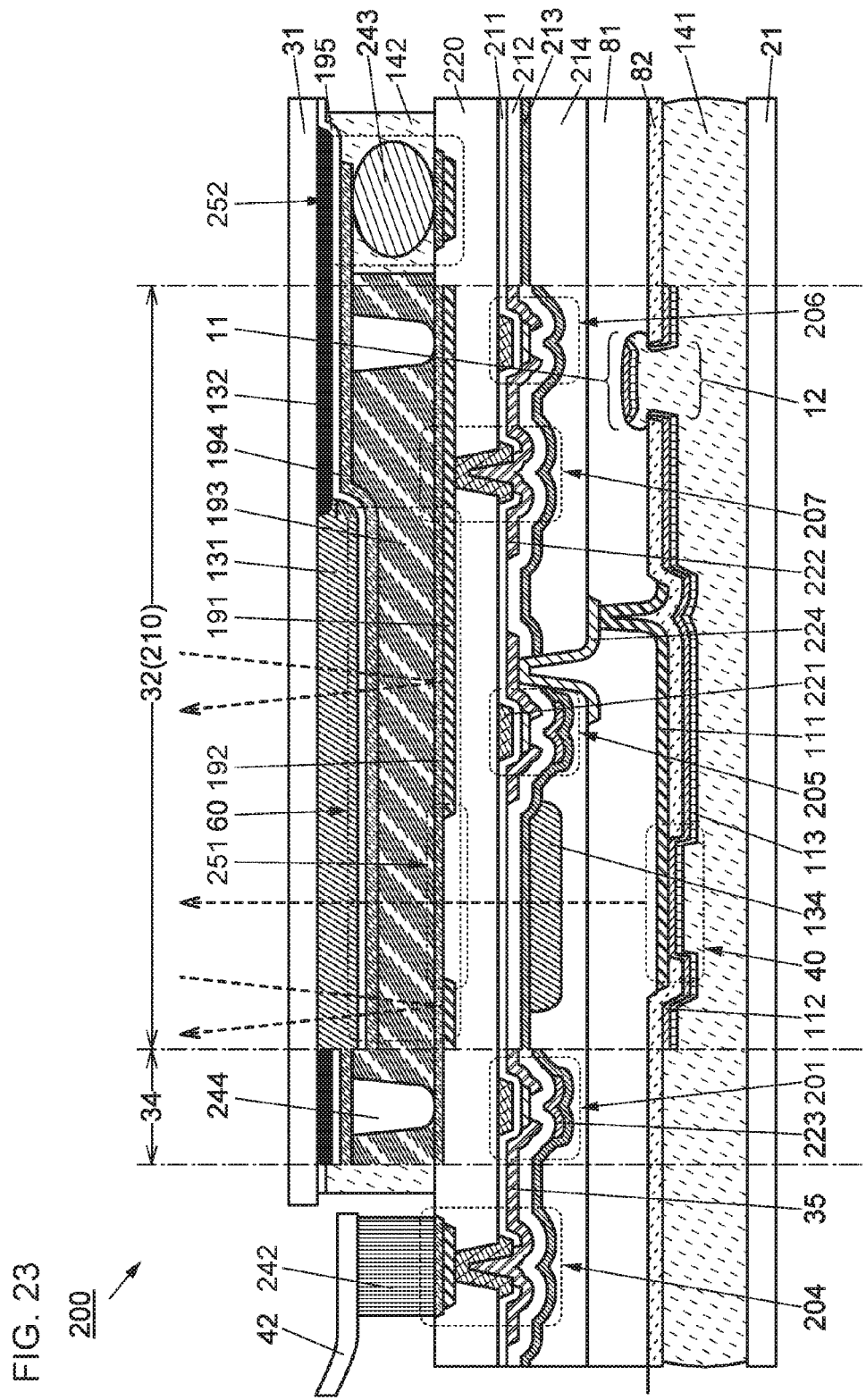

FIG. 25A1
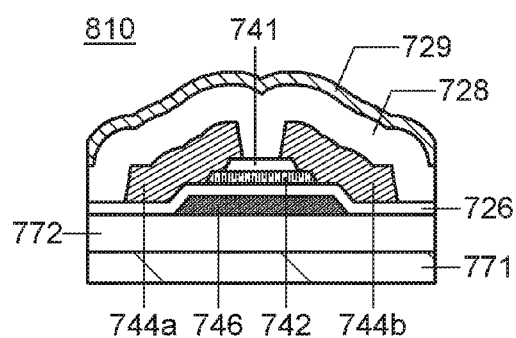
FIG. 25A2
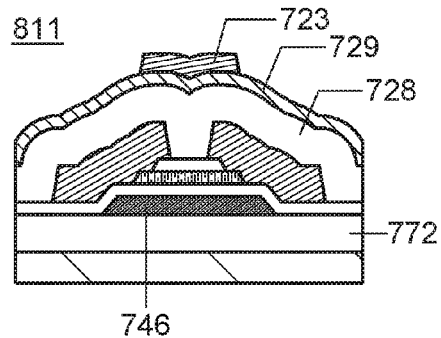
FIG. 25B1
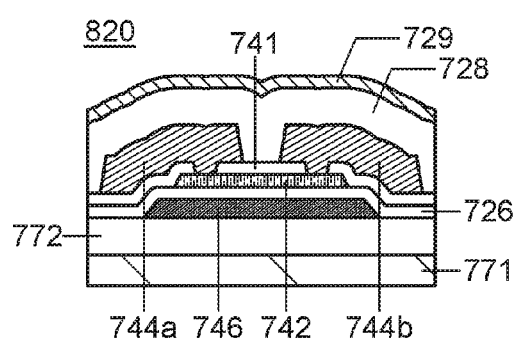
FIG. 25B2
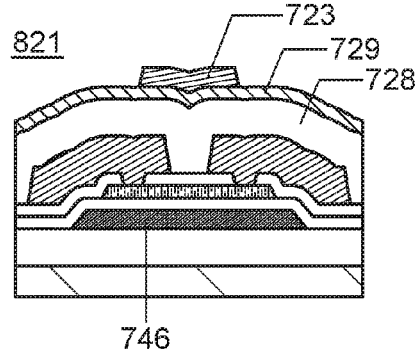
FIG. 25C1
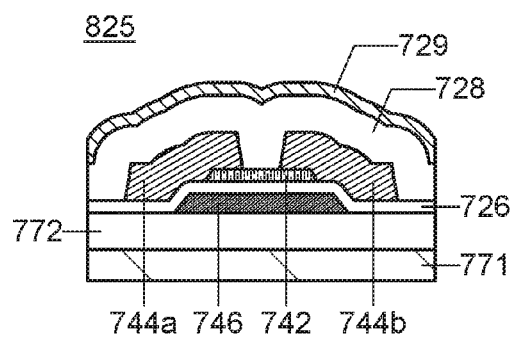
FIG. 25C2
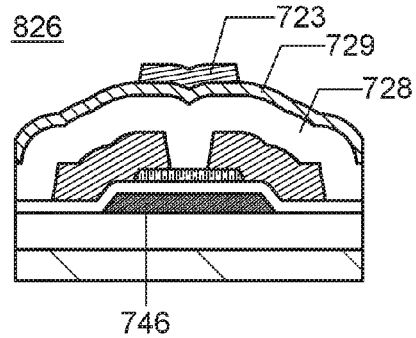

FIG. 26A1
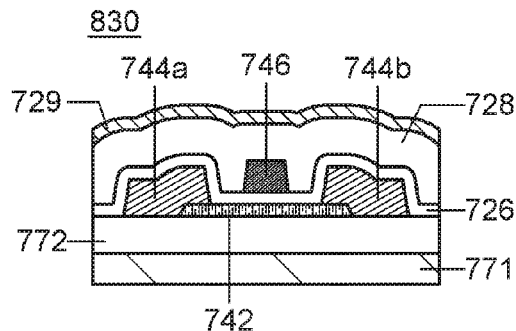
FIG. 26A2
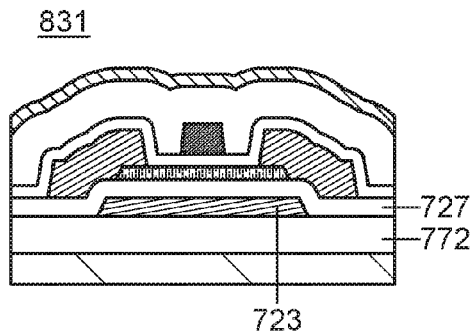
FIG. 26A3
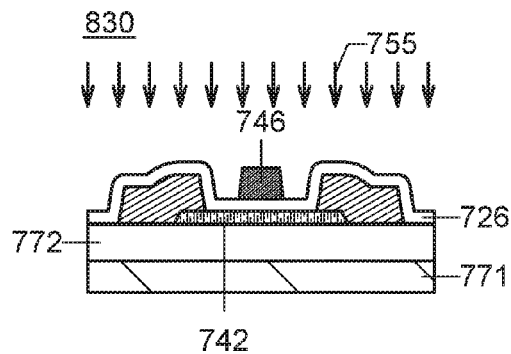
FIG. 26B1
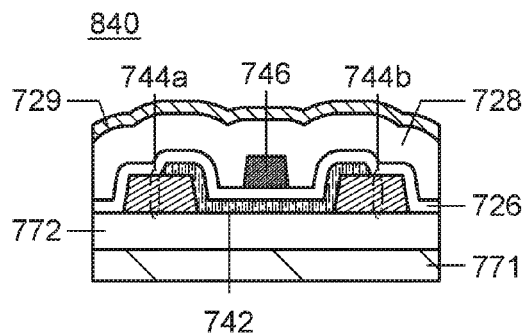
FIG. 26B2
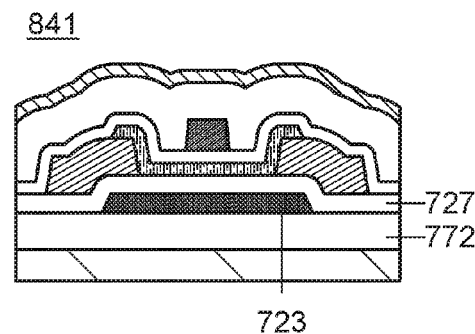

FIG. 27A1
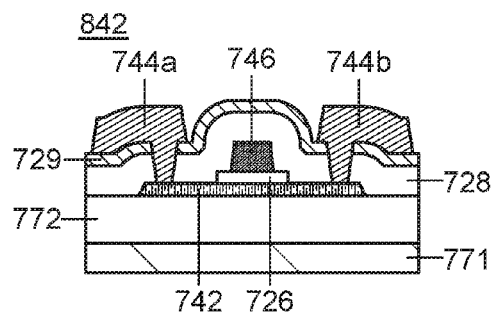
FIG. 27A2
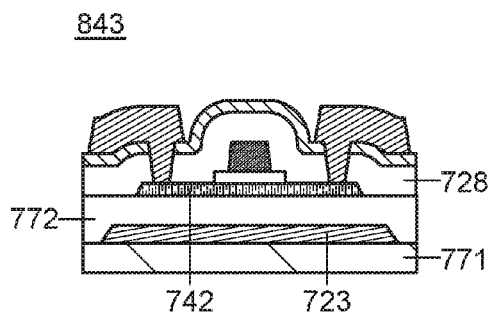
FIG. 27A3
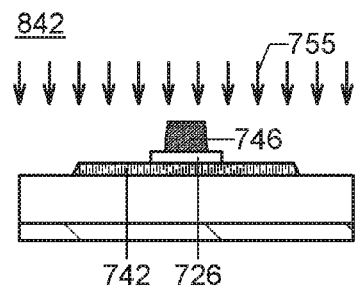
FIG. 27B1
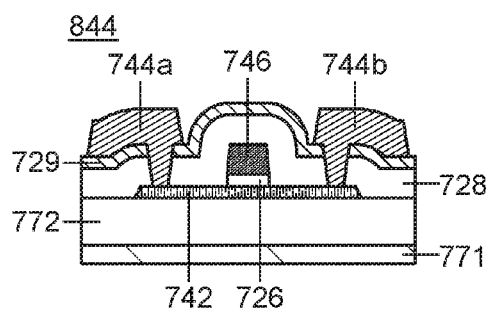
FIG. 27B2
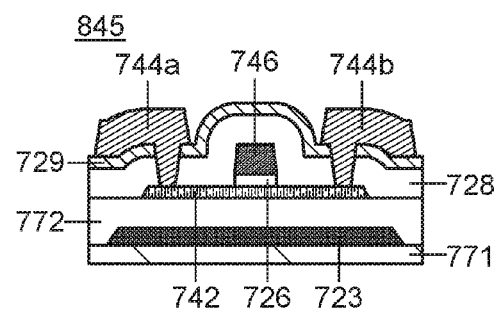
FIG. 27C1
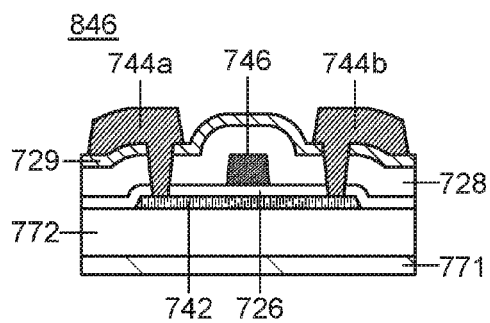
FIG. 27C2
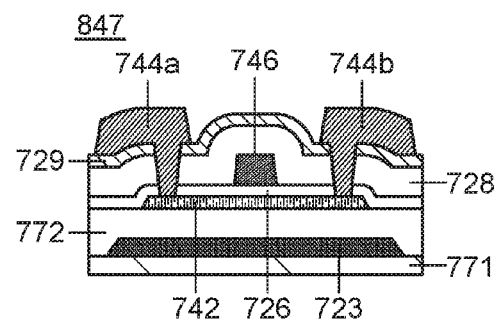

FIG. 31A
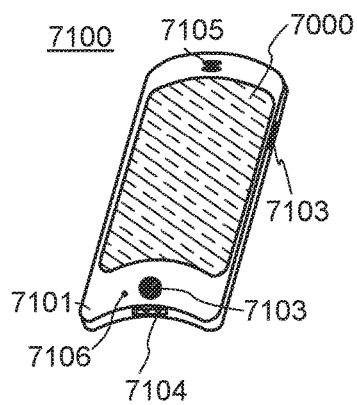
FIG. 31B
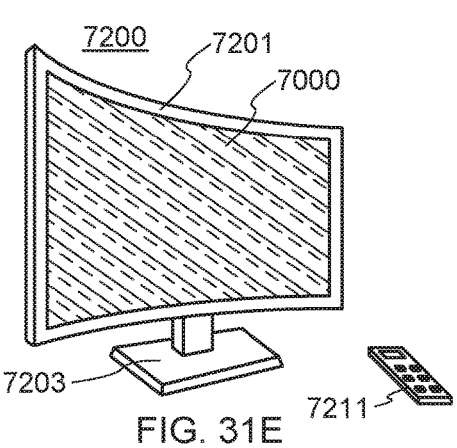
FIG. 31C1
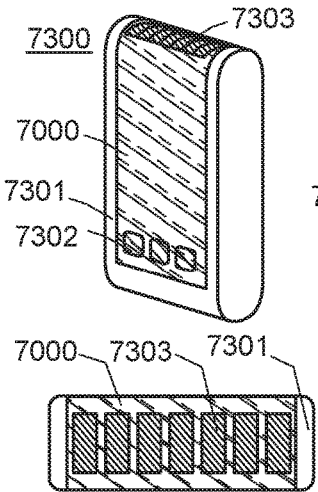
FIG. 31D
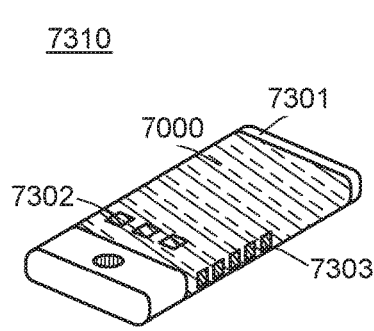
FIG. 31E
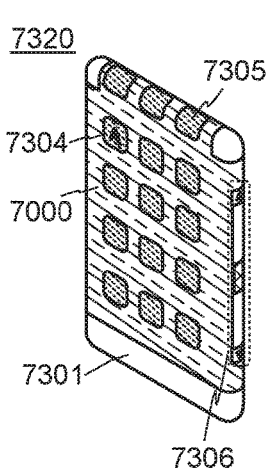
FIG. 31C2
FIG. 31F
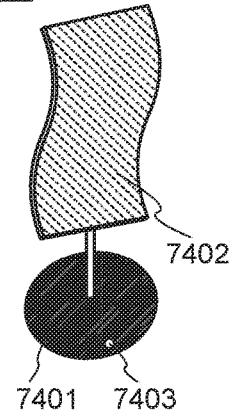
FIG. 31G
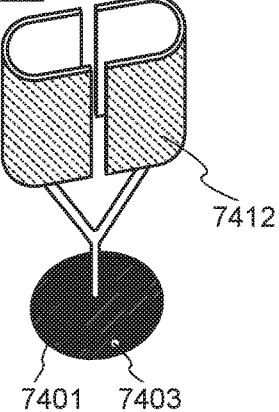
FIG. 31H
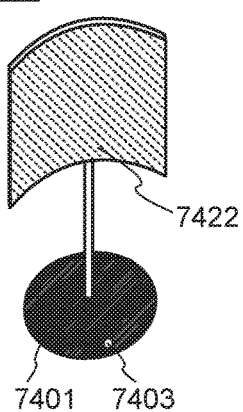

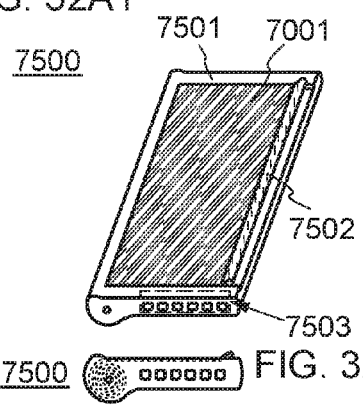
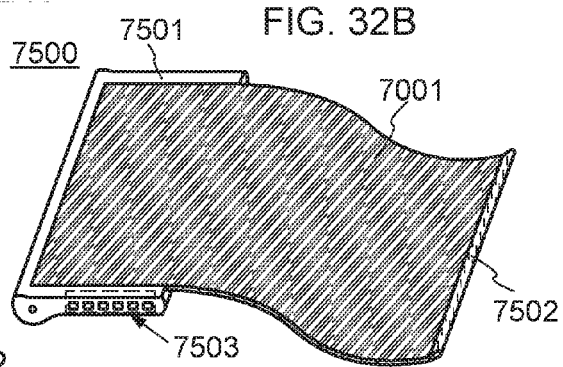
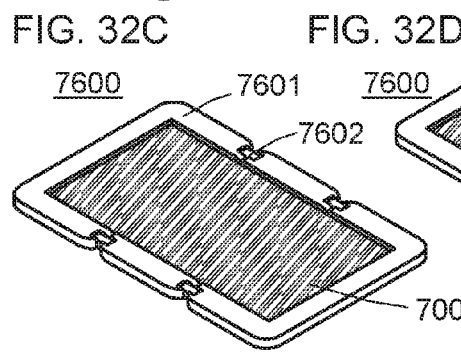
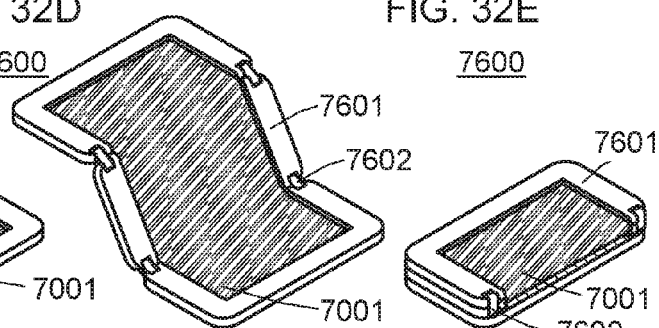
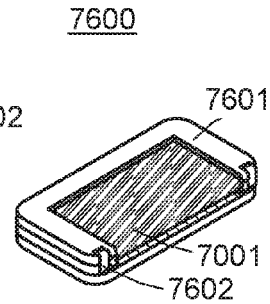
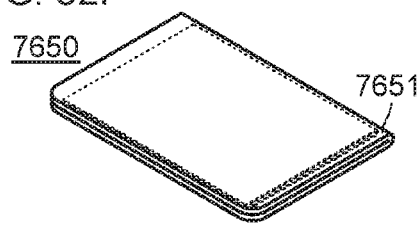
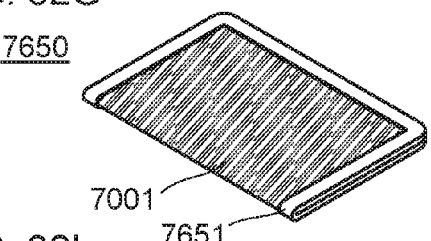
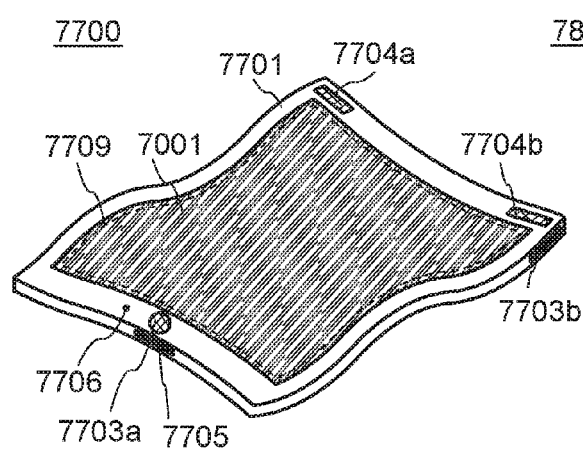
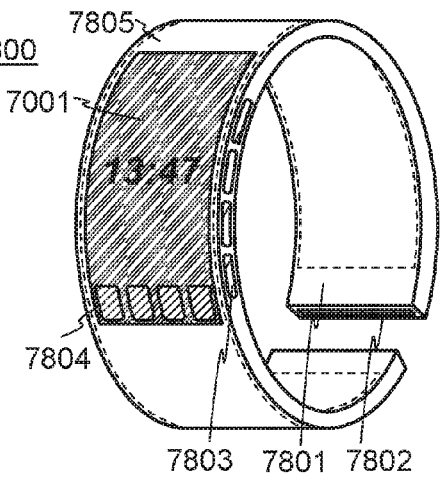

DISPLAY DEVICE

TECHNICAL FIELD

One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

Note that in this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

BACKGROUND ART

Display devices using organic electroluminescent (EL) elements or liquid crystal elements have been known. Examples of the display device also include a light-emitting device provided with a light-emitting element such as a light-emitting diode (LED), and electronic paper performing display with an electrophoretic method or the like.

The organic EL element generally has a structure in which a layer containing a light-emitting organic compound is provided between a pair of electrodes. When voltage is applied to this element, light emission can be obtained from the light-emitting organic compound. With use of such an organic EL element, thin, lightweight, high-contrast, and low-power-consumption display devices can be achieved.

Patent Document 1 discloses a flexible light-emitting device using an organic EL element.

REFERENCE

Patent Document

[Patent Document 1] Japanese Published Patent Application No. 2014-197522

DISCLOSURE OF INVENTION

An object of one embodiment of the present invention is to provide a display device with a high manufacturing yield. Another object of one embodiment of the present invention is to provide a display device with suppressed mixture of colors between adjacent pixels. Another object of one embodiment of the present invention is to provide a display device with high color reproducibility. Another object of one embodiment of the present invention is to provide a thin display device. Another object of one embodiment of the present invention is to provide a display device easily manufactured. Another object of one embodiment of the present invention is to provide a low-power-consumption display device. Another object of one embodiment of the present invention is to provide a highly reliable display device.

Note that the description of these objects does not preclude the existence of other objects. In one embodiment of the present invention, there is no need to achieve all the objects. Other objects can be derived from the description of the specification and the like.

One embodiment of the present invention is a display device including a first pixel electrode, a second pixel electrode, a first insulating layer, a second insulating layer, and an adhesive layer. The first pixel electrode and the second pixel electrode are over the first insulating layer. The second insulating layer is over the first insulating layer, the first pixel electrode, and the second pixel electrode. The adhesive layer is over the first insulating layer, the second insulating layer, the first pixel electrode, and the second pixel electrode. The first insulating layer includes a first opening. A bottom surface of the first opening is positioned above a bottom surface of the first insulating layer. The second insulating layer includes a second opening. The second opening penetrates the second insulating layer to be integrated with the first opening. The first opening and the second opening are between the first pixel electrode and the second pixel electrode. A periphery of the second opening is positioned on an inner side than a periphery of the first opening in a top view. The adhesive layer includes a region overlapping with the second insulating layer below the second insulating layer.

Another embodiment of the present invention is a display device with the above structure, in which the length of an eave-shaped projecting portion of the second insulating layer over the first insulating layer is greater than or equal to 0.05 μm and less than or equal to 5.0 μm.

Another embodiment of the present invention is a display device with any of the above structures, in which the width of a short side of the second opening in a top view is greater than or equal to 0.5 μm and less than or equal to 20 μm.

Another embodiment of the present invention is a display device including a first pixel electrode, a second pixel electrode, a first insulating layer, a second insulating layer, and an adhesive layer. The first pixel electrode and the second pixel electrode are over the first insulating layer. The second insulating layer is over the first insulating layer, the first pixel electrode, and the second pixel electrode. The adhesive layer is over the second insulating layer, the first pixel electrode, and the second pixel electrode. The first insulating layer includes a first opening. A top surface of the first opening is covered with the second insulating layer. A bottom surface of the first opening is positioned above a bottom surface of the first insulating layer. The first opening is between the first pixel electrode and the second pixel electrode. The second insulating layer includes a first projecting portion that is an eave-shaped portion positioned above a side surface of the second insulating layer in the first opening. The adhesive layer includes a region overlapping with the second insulating layer below the first projecting portion.

Another embodiment of the present invention is a display device with the above structure, in which the length of the first projecting portion is greater than or equal to 0.05 μm and less than or equal to 5.0 μm.

Another embodiment of the present invention is a display device with any of the above structures, in which the first insulating layer includes an organic resin material, and the second insulating layer comprises an inorganic insulating material.

Another embodiment of the present invention is a display device with any of the above structures, in which the first insulating layer includes acrylic, and the second insulating layer includes silicon oxynitride.

According to one embodiment of the present invention, a display device with a high manufacturing yield can be provided. A display device with suppressed mixture of colors between adjacent pixels can be provided. A display device with high color reproducibility can be provided. A thin display device can be provided. A display device easily manufactured can be provided. A low-power-consumption display device can be provided. A highly reliable display device can be provided.

Note that one embodiment of the present invention does not necessarily achieve all the effects listed above. Other effects can be derived from the description of the specification, the drawings, the claims, and the like.

BRIEF DESCRIPTION OF DRAWINGS

FIG. 15 illustrates a structure example of a display device of one embodiment.

FIGS. 18A and 18B illustrate a structure example of a display device of one embodiment.

FIG. 19 illustrates a structure example of a display device of one embodiment.

FIGS. 21A, 21B1, and 21B2 illustrate structure examples of a display device of one embodiment.

FIG. 23 illustrates a structure example of a display device of one embodiment.

FIGS. 25A1, 25A2, 25B1, 25B2, 25C1, and 25C2 illustrate structure examples of a transistor of one embodiment.

FIGS. 26A1, 26A2, 26A3, 26B1, and 26B2 illustrate structure examples of a transistor of one embodiment.

FIGS. 27A1, 27A2, 27A3, 27B1, 27B2, 27C1, and 27C2 illustrate structure examples of a transistor of one embodiment.

FIGS. 31A, 31B, 31C1, 31C2, and 31D to 31H illustrate electronic devices of one embodiment.

FIGS. 32A1, 32A2, and 32B to 32I illustrate electronic devices of one embodiment.

BEST MODE FOR CARRYING OUT THE INVENTION

Figure 1A:
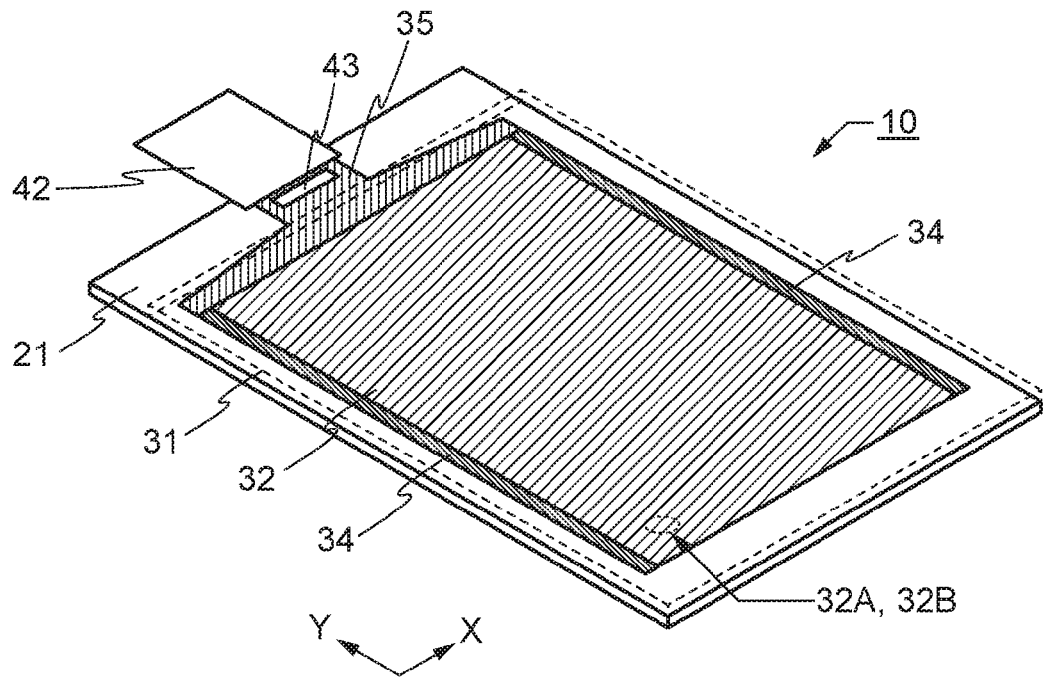
FIGS. 1A and 1B illustrate a structure example of a display device of one embodiment.

Embodiments will be described in detail with reference to the drawings. Note that the present invention is not limited to the description below, and it is easily understood by those skilled in the art that the mode and details can be variously changed without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and the description of such portions is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases, and therefore, it is not limited to the illustrated scale.

Note that in this specification and the like, ordinal numbers such as "first" and "second" are used in order to avoid confusion among components and do not limit the components numerically.

Embodiment 1

In this embodiment, structure examples of a display device of one embodiment of the present invention will be described.

The display device of one embodiment of the present invention includes a plurality of pixels (subpixels). Each pixel includes a display element including a pixel electrode. The pixel electrode is provided over a first insulating layer. A second insulating layer is provided over the pixel electrode and the first insulating layer. An adhesive layer is provided over the first insulating layer, the pixel electrode, and the second insulating layer.

Each of the first insulating layer and the second insulating layer has an opening between adjacent pixels. A bottom surface of the opening in the first insulating layer (referred to as a first opening) is positioned above a bottom surface of the first insulating layer. The opening in the second insulating layer (referred to as a second opening) penetrates the second insulating layer to be integrated with the first opening.

The display device can have a structure, for example, in which a display element, an insulating layer, and an adhesive layer are interposed between a pair of substrates. For example, one of the substrates can be provided with a pixel electrode of the display element and the like, and bonded to the other substrate with the adhesive layer.

In a top view, a periphery of the second opening is positioned on an inner side than a periphery of the first opening. The adhesive layer has a region overlapping with the second insulating layer below the second insulating layer. Preferably, the first opening and the second opening are filled with the adhesive layer. In that case, in a cross-sectional view of adjacent pixels, a wedge-shaped (or anchor-shaped or double-headed hammer shaped) adhesive layer fits an opening in which the first opening and the second opening are integrated.

Such a structure can increase the adhesion between the first insulating layer and the second insulating layer and the adhesive layer. For example, in the case where the display device includes an EL element as a display element, an EL layer and a conductive film are provided between the adhesive layer and the pixel electrode, the first insulating layer, and the second insulating layer. Since the adhesion at an interface between the EL layer and the conductive film is low, film separation might occur at the interface when outward forces (forces in directions opposite to directions in which the EL layer and the conductive film face to each other) are applied to the EL layer and the conductive film. The film separation is likely to occur particularly in manufacturing of a flexible display device; however, the display device with the above structure can suppress the film separation. Therefore, a highly reliable display device can be obtained.

Furthermore, with such a structure, the EL layer is disconnected or significantly thin in the first opening and the second opening, whereby leakage current between adjacent EL elements can be suppressed. That is, the first opening and/or the second opening have a function of suppressing mixture of colors between adjacent pixels. Therefore, a display device capable of performing display with high color reproducibility can be obtained.

As the display element, an LED, an organic light-emitting diode (OLED), or a quantum-dot light-emitting diode (QLED) can be used. The luminance of light emitted from or through such an element is controlled by current or voltage.

More specific structure examples will be described below with reference to drawings.

[Structure Example 1]

FIG. 1A is a schematic perspective view illustrating a display device 10 of one embodiment of the present invention. The display device 10 includes a substrate 21 and a substrate 31 which are bonded to each other. In FIG. 1A, the substrate 31 is denoted by a dashed line.

The display device 10 includes a display portion 32, a circuit 34, a wiring 35, and the like. For example, the circuit 34, the wiring 35, the display portion 32, a pixel electrode 23 (see FIG. 1B), and the like are provided on the substrate 21. FIG. 1A illustrates an example in which an IC 43 and an FPC 42 are mounted on the substrate 21.

A circuit serving as a scan line driver circuit can be used as the circuit 34, for example.

The wiring 35 is configured to supply a signal or electric power to the display portion 32 or the circuit 34. The signal or electric power is input to the wiring 35 from the outside through the FPC 42 or from the IC 43.

In FIG. 1A, the IC 43 is mounted on the substrate 21 by a chip on glass (COG) method as an example. As the IC 43, for example, an IC serving as a scan line driver circuit or a signal line driver circuit can be used. Note that it is possible that the IC 43 is not provided when, for example, the display device 10 includes circuits serving as a scan line driver circuit and a signal line driver circuit and when the circuits serving as a scan line driver circuit and a signal line driver circuit are provided outside and a signal for driving the display device 10 is input through the FPC 42. Alternatively, the IC 43 may be mounted on the FPC 42 by a chip on film (COF) method.

[Pixel Structure Example 1]
[Pixel Structure Example 1-1]

Figure 1B:
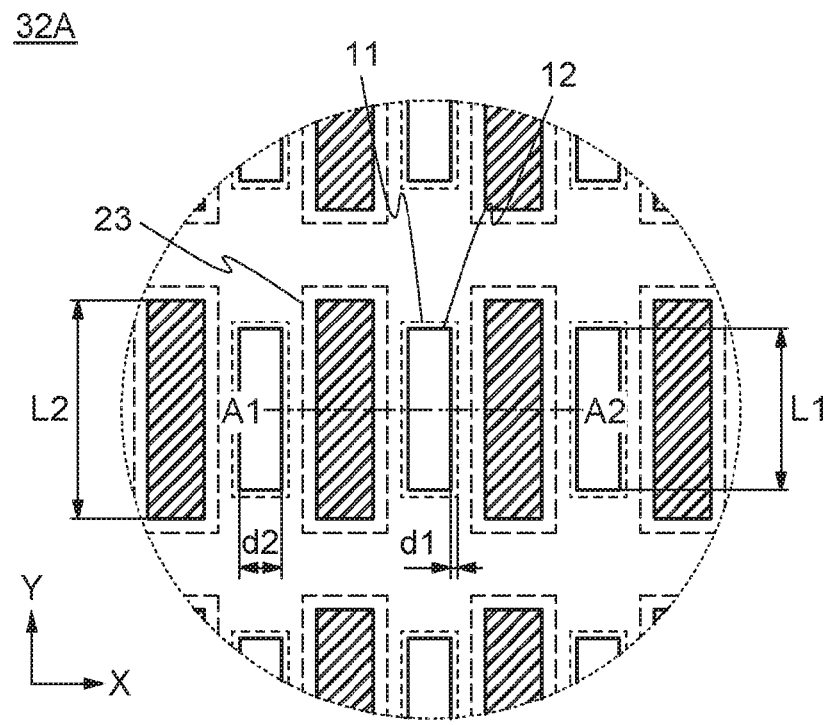

FIG. 1B is an enlarged top view of a region 32A that is part of the display portion 32 denoted by a dashed line in FIG. 1A. FIG. 1B illustrates only part of a structure of the display portion 32 needed for explanation.

The pixel electrodes 23 included in a plurality of display elements are arranged in a matrix in the display portion 32. An opening 11 and an opening 12 are provided between two adjacent pixel electrodes 23. The periphery of the opening 12 is positioned on an inner side than the periphery of the opening 11. In FIG. 1B, the periphery of the opening 11 covered with an insulating layer 82 (not illustrated) is denoted by a dashed line, and the periphery of the opening 12 is denoted by a solid line. The periphery of the pixel electrode 23 covered with the insulating layer 82 is denoted by a dashed line, and a region in the pixel electrode 23 not covered with the insulating layer 82 is hatched.

Note that the term "the periphery of an opening" in this specification refers to an outline of the opening having the maximum area in a top view. For example, in the case of an opening that widens from the top surface to the bottom surface, the periphery is an outline of the bottom surface of the opening.

Each of the openings 11 and 12 is preferably provided between two pixel electrodes 23 included in two pixels corresponding to different colors. Alternatively, each of the openings 11 and 12 may be provided between two pixel electrodes 23 included in two pixels corresponding to the same color.

Figure 2A:
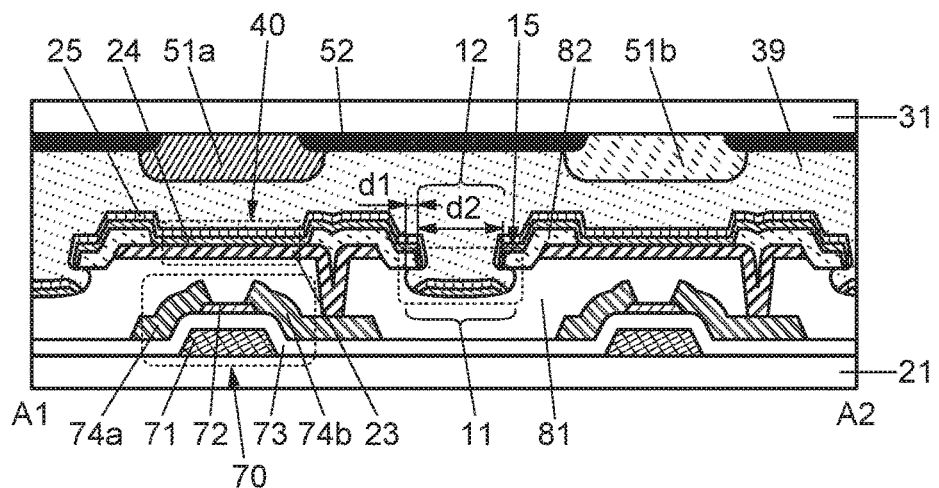
FIGS. 2A and 2B illustrate structure examples of a display device of one embodiment.

FIG. 2A illustrates an example of a cross section taken along a cutting-plane line A1-A2 in FIG. 1B. FIG. 2A illustrates the cross section of a region including two adjacent pixels. In this example, a light-emitting element 40 with a top-emission structure is used as a display element; thus, the display surface is the substrate 31 side.

The display device 10 has a structure in which the substrate 21 is bonded to the substrate 31 with an adhesive layer 39. In other words, the light-emitting element 40 is sealed with the adhesive layer 39. The substrates 21 and 31 may have flexibility, in which case the display device 10 is a flexible display device.

A transistor 70, the light-emitting element 40, and the like are provided over the substrate 21. In addition, insulating layers 73, 81, and 82, and the like are provided over the substrate 21. On the surface of the substrate 31 that faces the substrate 21, provided are a coloring layer 51a, a coloring layer 51b, a light-blocking layer 52, and the like. Light that penetrates the coloring layer 51a and light that penetrates the coloring layer 51b have different wavelength ranges.

The transistor 70 includes a conductive layer 71 serving as a gate, a semiconductor layer 72, the insulating layer 73 serving as a gate insulating layer, a conductive layer 74a serving as one of a source and a drain, a conductive layer 74b serving as the other of the source and the drain, and the like.

The insulating layer 81 is provided to cover the transistor 70, and the pixel electrode 23 is provided over the insulating layer 81. The pixel electrode 23 is electrically connected to the conductive layer 74b through an opening in the insulating layer 81.

The insulating layer 82 is provided to cover an edge of the pixel electrode 23. The insulating layer 82 preferably has a tapered shape.

The light-emitting element 40 includes an EL layer 24 and a conductive layer 25 which are provided over the pixel electrode 23. Part of the conductive layer 25 serves as a common electrode of the light-emitting element 40. When a potential difference is generated between the pixel electrode 23 and the conductive layer 25 and current flows through the EL layer 24, the light-emitting element 40 emits light.

The opening 11 is formed in the insulating layer 81 and the opening 12 is formed in the insulating layer 82. The bottom surface of the opening 11 is positioned above the bottom surface of the insulating layer 81. The opening 12 penetrates the insulating layer 82 to be integrated with the opening 11.

Since the periphery of the opening 12 is positioned on an inner side than the periphery of the opening 11 in a top view (see FIG. 1B), the insulating layer 82 has an eave-shaped projecting portion over the insulating layer 81 in a cross-sectional view (see FIG. 2A). In addition, since the opening 11 is filled with the adhesive layer 39, the adhesive layer 39 has a region overlapping with the insulating layer 82 below the insulating layer 82. Accordingly, as illustrated in FIG. 2A, in the cross-sectional view, the adhesive layer 39 includes a wedge-shaped region 15 that fits the opening formed by integration of the opening 11 and the opening 12.

The region 15 included in the adhesive layer 39 can enhance the adhesion between the insulating layers 81 and 82 and the adhesive layer 39. Note that the opening 11 is preferably filled with the adhesive layer 39, but not necessarily filled with the adhesive layer 39 and part of the opening 11 may be hollow as long as the adhesive layer 39 has a region overlapping with the insulating layer 82 below the insulating layer 82.

Here, an example of a method for manufacturing the flexible display device 10 will be described. The manufacturing method has the following steps, for example. First, the transistor 70 and the like are provided on one support substrate, and coloring layers (e.g., the coloring layers 51a and 51b) and the like are provided on the other support substrate. Next, these support substrates are bonded to each other with the adhesive layer 39 to form a process member. Then, the process member is separated from the support substrates and bonded to flexible substrates.

In the steps of separating the support substrates from the process member, if the process member has a stacked structure including two films in contact with each other with weak adhesion, the two films might be separated at the interface (hereinafter this phenomenon is also referred to as film separation). For example, since the adhesion between the EL layer 24 and the conductive layer 25 is weak, when the display device 10 including the light-emitting element 40 is manufactured by the above manufacturing method, film separation might occur between the EL layer 24 and the conductive layer 25, which might cause a decrease in the manufacturing yield.

The display device 10 of one embodiment of the present invention includes the region 15 between two pixel electrodes 23 in two adjacent pixels. Thus, the insulating layers 81 and 82 and the adhesive layer 39, between which the EL layer 24 and the conductive layer 25 are sandwiched, have high adhesion. Accordingly, in the method for manufacturing the flexible display device 10, film separation that occurs when outward forces (forces in directions opposite to directions in which the EL layer 24 and the conductive layer 25 face to each other) are applied to the EL layer 24 and the conductive layer 25 can be suppressed. Therefore, one embodiment of the present invention can provide the display device 10 with a high manufacturing yield.

The effect of suppressing the film separation can be determined by a length d1 (the length of the eave-shaped projecting portion of the insulating layer 82 over the insulating layer 81) (see FIG. 1B and FIG. 2A). The longer the length d1 is, the larger the effect is; however, the length d1 is preferably small in order that the display device 10 has high resolution.

Accordingly, for example, by setting the length d1 to be greater than or equal to 0.05 µm and less than or equal to 5.0 µm, preferably greater than or equal to 0.1 µm and less than or equal to 1.0 µm, the film separation can be effectively suppressed.

The effect of suppressing the film separation can be determined by a width d2 of a short side of the opening 12 in a top view (see FIG. 1B and FIG. 2A). In order to make the display device 10 a high-resolution display device, the width d2 is preferably small; however, when the width d2 is too small, the region 15 is separated from the adhesive layer 39 that is above the opening 12 in the steps of separating the support substrates from the process member in the method for manufacturing the display device 10, whereby the effect might disappear.

Accordingly, for example, by setting the width d2 to be greater than or equal to 0.5 µm and less than or equal to 20 µm, preferably greater than or equal to 2.0 µm and less than or equal to 10 µm, the film separation can be effectively suppressed.

Figure 3A:
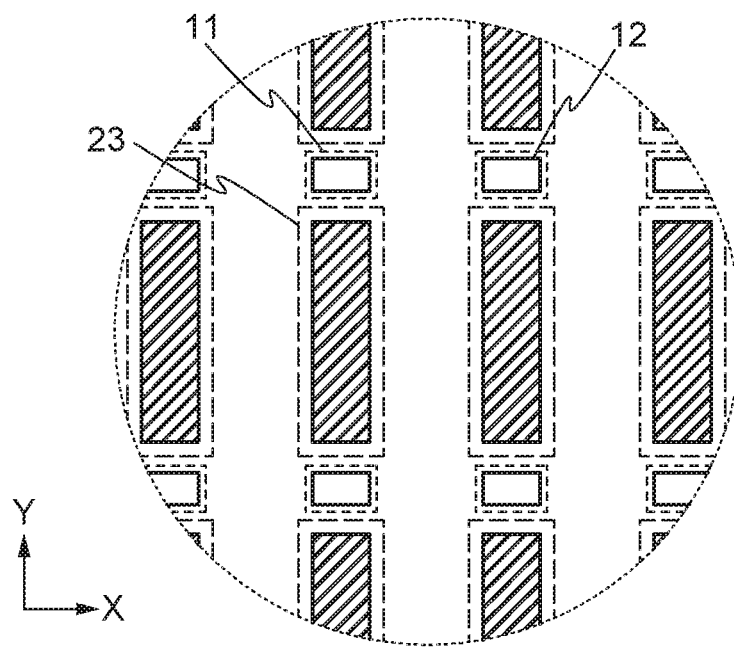
FIGS. 3A and 3B illustrate structure examples of a display device of one embodiment.

Note that FIG. 1B illustrates an example in which the opening 11 and the opening 12 are provided between two pixel electrodes 23 in two adjacent pixels which correspond to different colors (i.e., two adjacent pixels in the X direction in FIG. 1B), but one embodiment of the present invention is not limited to this. The opening 11 and the opening 12 may be provided between two adjacent pixel electrodes 23 in the Y direction in FIG. 1B (see FIG. 3A). Alternatively, the opening 11 and the opening 12 may be provided to be surrounded by four pixel electrodes 23 (two adjacent pixel electrodes 23 in the X direction and two adjacent pixel electrodes 23 which face to the former two adjacent pixel electrodes 23 on one side in the Y direction) (see FIG. 3B).

Figure 4A:
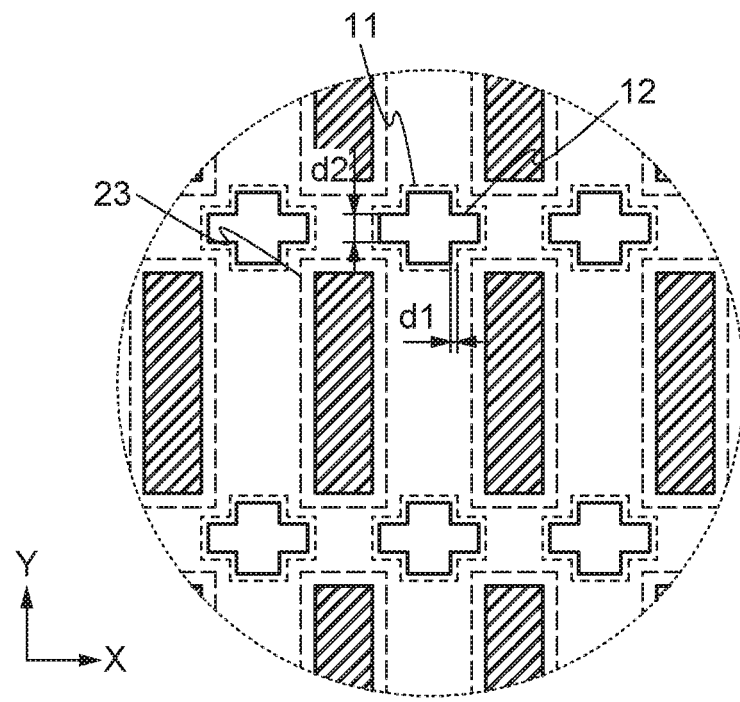
FIGS. 4A and 4B illustrate structure examples of a display device of one embodiment.
Figure 4B:
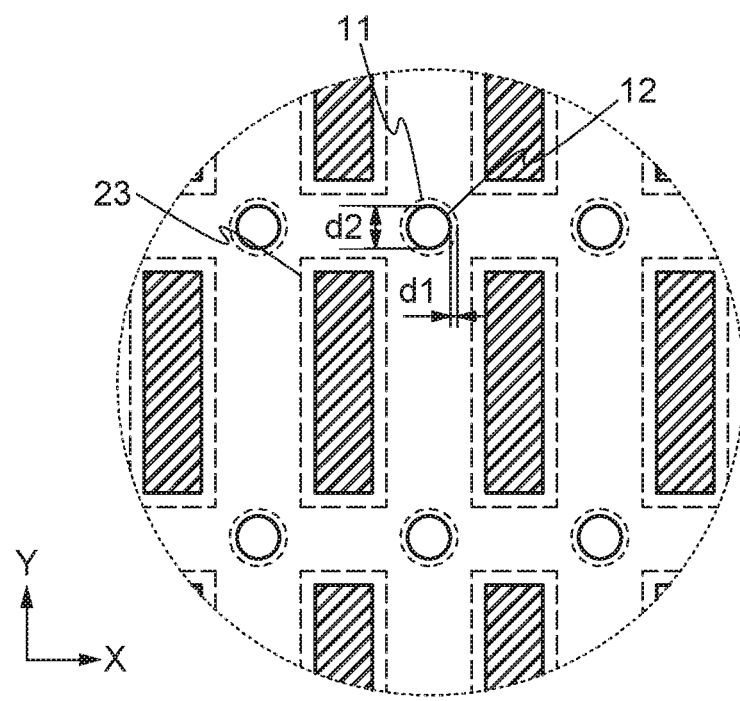

Each of top surface shapes of the opening 11 and the opening 12 is not limited to a rectangle, and may be a polygon, a zig-zag shape, a meander shape, or a closed curve such as a circle or an ellipse. FIG. 4A and FIG. 4B illustrate examples in which the top surface shapes of the opening 11 and the opening 12 provided to be surrounded by four pixel electrodes 23 (two adjacent pixel electrodes 23 in the X direction and two adjacent pixel electrodes 23 which face to the former two adjacent pixel electrodes 23 on one side in the Y direction) are cross shapes and circular shapes, respectively. Note that in each of FIGS. 4A and 4B, the length d1 and the width d2 are shown.

Figure 5A:
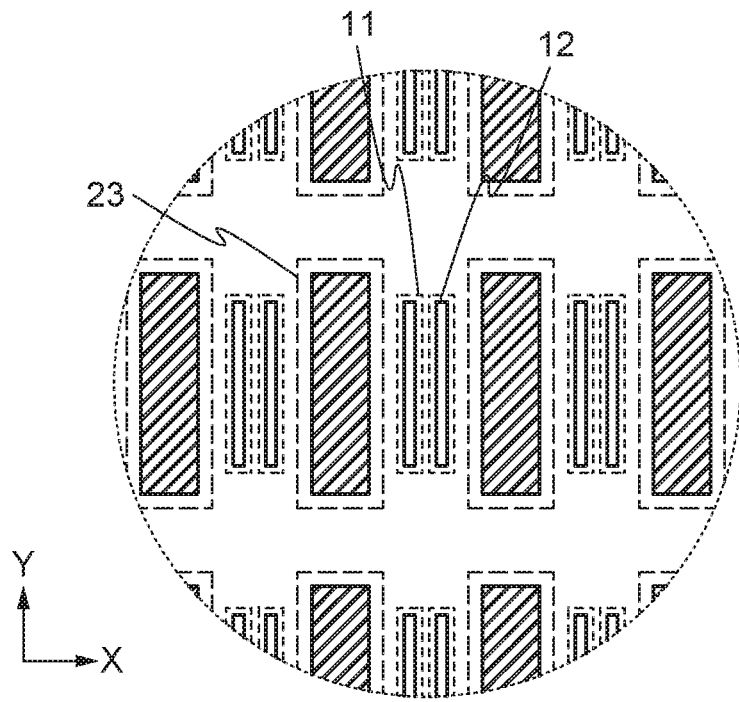
FIGS. 5A and 5B illustrate structure examples of a display device of one embodiment.
Figure 5B:
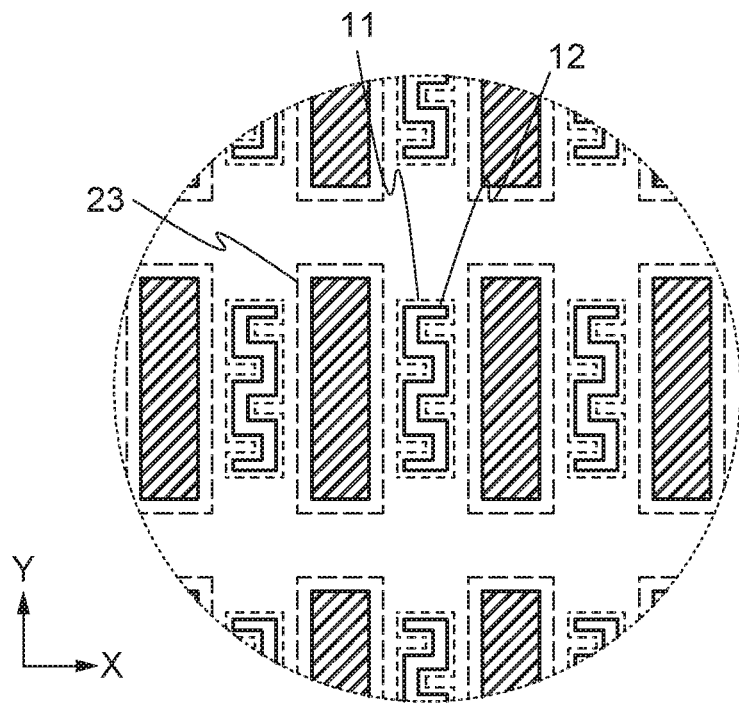

FIG. 5A illustrates an example in which two rectangular openings 11 and two rectangular openings 12 are horizontally provided between two pixel electrodes 23 in two pixels that are adjacent to each other in the X direction. FIG. 5B illustrates an example in which the top surface shapes of the opening 11 and the opening 12 provided between two pixel electrodes 23 in two pixels that are adjacent to each other in the X direction are meander shapes. With any of these structures, the area of the eave-shaped projecting portion of the insulating layer 82 (the area surrounded by the peripheries of the opening 11 and the opening 12 in FIG. 1B and the like) can be larger than that in FIG. 1B, without increasing the areas of the opening 11 and the opening 12. As a result, the effect of suppressing the film separation can be further enhanced.

FIG. 2A illustrates an example in which the EL layer 24 and the conductive layer 25 are shared with a plurality of pixels. The EL layer 24 covers the insulating layer 82 and the insulating layer 81 as well as an exposed portion of the pixel electrode 23. The conductive layer 25 covers the EL layer 24.

In a display device including a light-emitting element including an EL layer, in the case where the EL layer is shared with a plurality of pixels, if the EL layer includes a highly conductive layer, current might flow to the light-emitting element in an adjacent pixel through the highly conductive layer. The same applies to the case where the EL layer includes a layer containing both a donor substance and an acceptor substance. This causes light emission of the light-emitting element in the adjacent pixel, which should not emit light, and mixture of colors between adjacent pixels occurs, leading to a problem of a reduction in color reproducibility of the display device. Such a phenomenon can be referred to as crosstalk.

The display device 10 of one embodiment of the present invention includes openings (the openings 11 and 12) between two adjacent pixels. In the openings (specifically, portions of the opening 11 which correspond to a bottom surface of the eave-shaped projecting portion of the insulating layer 82 and a side surface of the insulating layer 81), the EL layer 24 that is shared with two pixel electrodes 23 is disconnected. Thus, mixture of colors between adjacent pixels can be suppressed, so that the display device 10 can perform display with high color reproducibility.

Figure 2B:
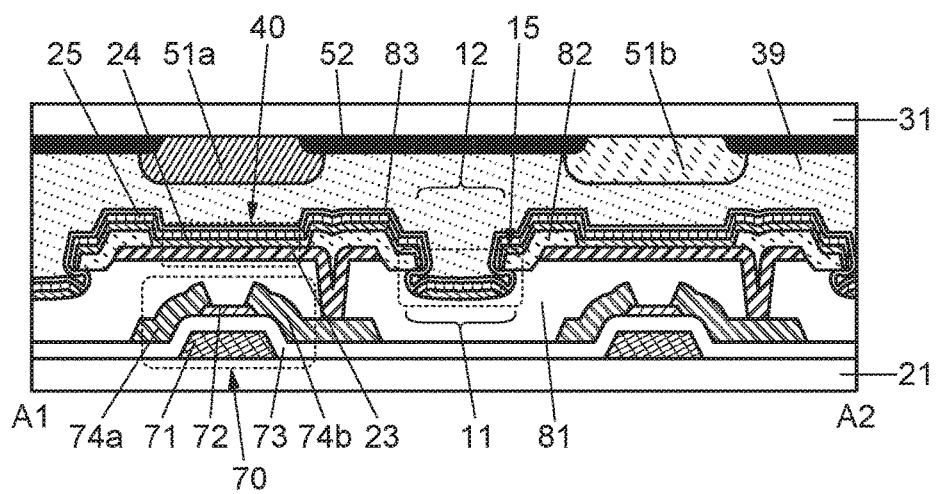

When the EL layer 24 and/or the conductive layer 25 are disconnected near the light-emitting element 40 as illustrated in FIG. 2A, moisture or the like might enter the EL layer 24 from the disconnected portion, which might lower the reliability of the display device 10. For this reason, an insulating layer 83 that prevents moisture or the like from entering the EL layer 24 is preferably provided over the conductive layer 25 to cover the disconnected portion (see FIG. 2B). The insulating layer 83 is preferably formed by, for example, an atomic layer deposition (ALD) method, in which case a film can be formed on a process member having large (deep) uneven portions (like a process member with the openings 11 and 12) because a deposition material can fill the uneven portions.

Figure 6A:
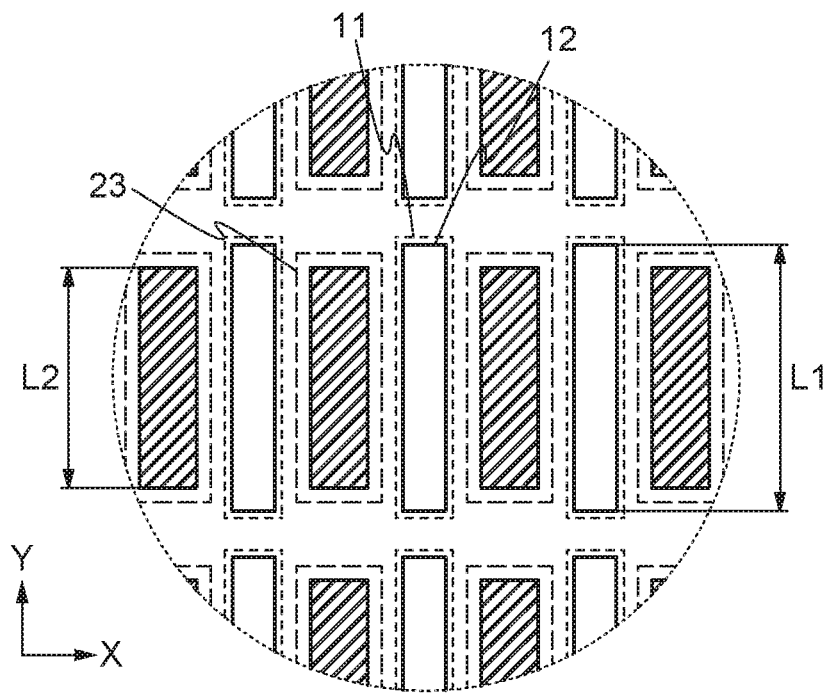
FIGS. 6A and 6B illustrate structure examples of a display device of one embodiment.

The effect of suppressing the mixture of colors between adjacent pixels can be controlled by, for example, the size of an opening between the two adjacent pixels. FIG. 1B illustrates an example in which a length L1 of a long side of the opening 12 is smaller than a length L2 of a region (a hatched region in FIG. 1B) of the pixel electrode 23 not covered with the insulating layer 82, but one embodiment of the present invention is not limited to this. For example, L1 may be larger than L2 (see FIG. 6A). Alternatively, a plurality of openings 11 in FIG. 1B may be connected and a plurality of openings 12 in FIG. 1B may be connected in the major axis direction (the Y direction in FIG. 1B) (see FIG. 6B).

Figure 3B:
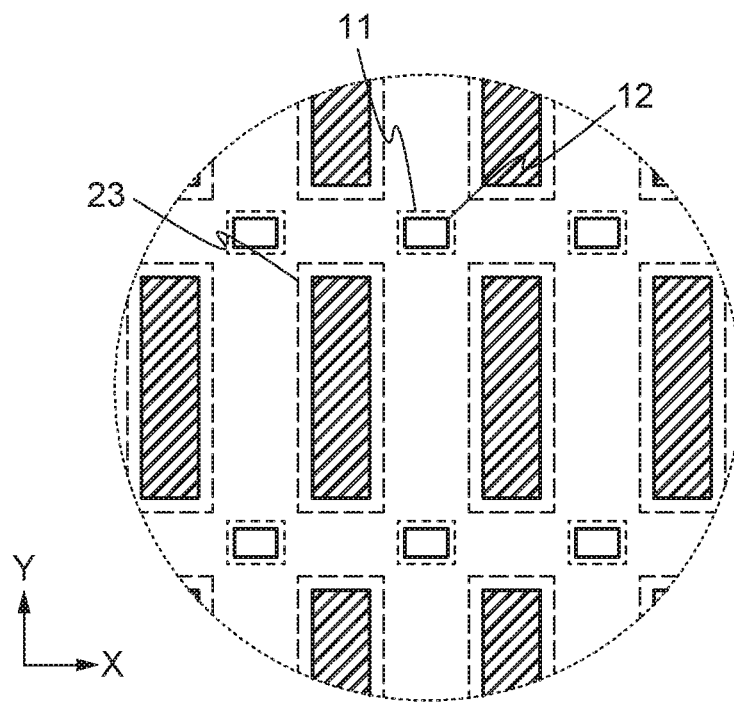
Figure 6B:
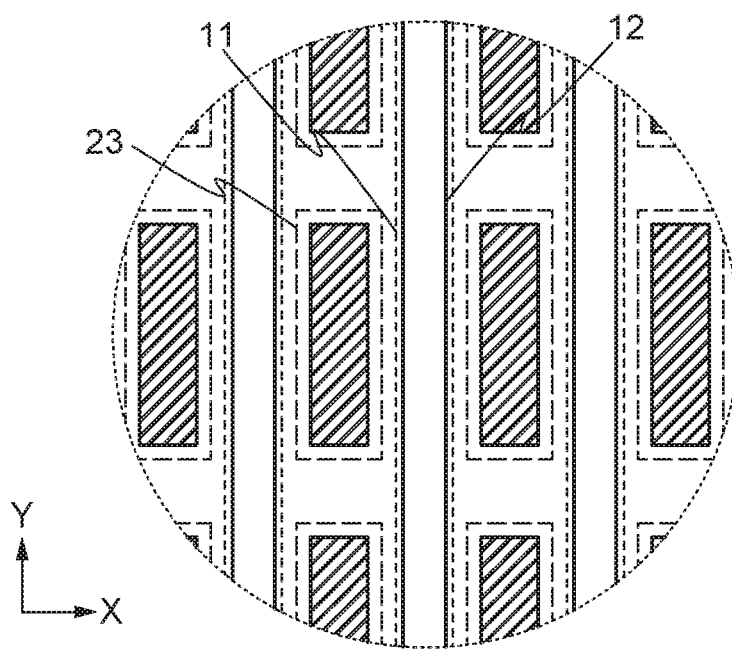

Alternatively, the opening 11 illustrated in FIG. 3B and the opening 12 in FIG. 6B may be provided. That is, the opening 11 is provided to be surrounded by four pixel electrodes 23 (two adjacent pixel electrodes 23 in the X direction and two adjacent pixel electrodes 23 which face to the former two adjacent pixel electrodes 23 on one side in the Y direction) and the opening 12 that extends in the Y direction is provided (see FIG. 7A).

Figure 7A:
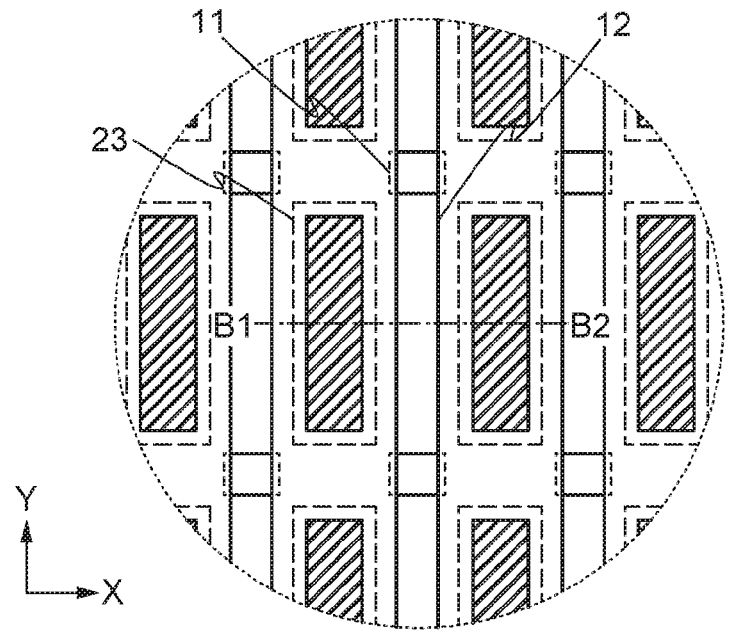
FIGS. 7A and 7B illustrate a structure example of a display device of one embodiment.
Figure 7B:
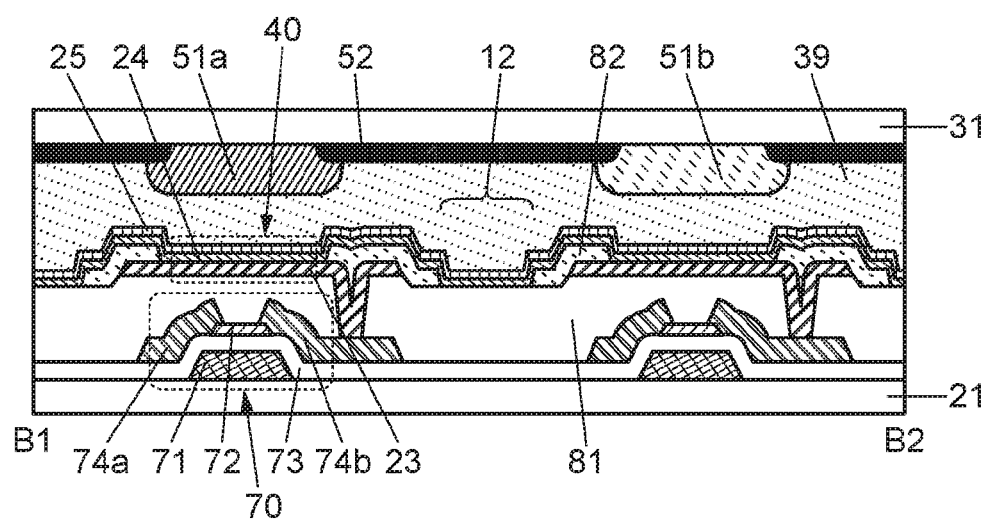

FIG. 7B illustrates an example of a cross section taken along the cutting-plane line B1-B2 in FIG. 7A. FIG. 7B differs from FIG. 2A in that the opening 11 is not provided. In the structure in FIGS. 7A and 7B, each of the EL layer 24 and the conductive layer 25 is connected between two adjacent pixel electrodes 23 in the X direction. Thus, the display device 10 with the structure in FIGS. 7A and 7B can have high reliability as compared with the display device 10 with the structure in FIG. 2A.

Although the display device 10 described here is an active matrix display device including an active element such as the transistor 70, a passive matrix display device including no active elements can also be used. In that case, the transistor 70 is not necessary and for example, components between the pixel electrode 23 and the substrate 21 can be omitted.

[Pixel Structure Example 1-2]

Figure 8A:
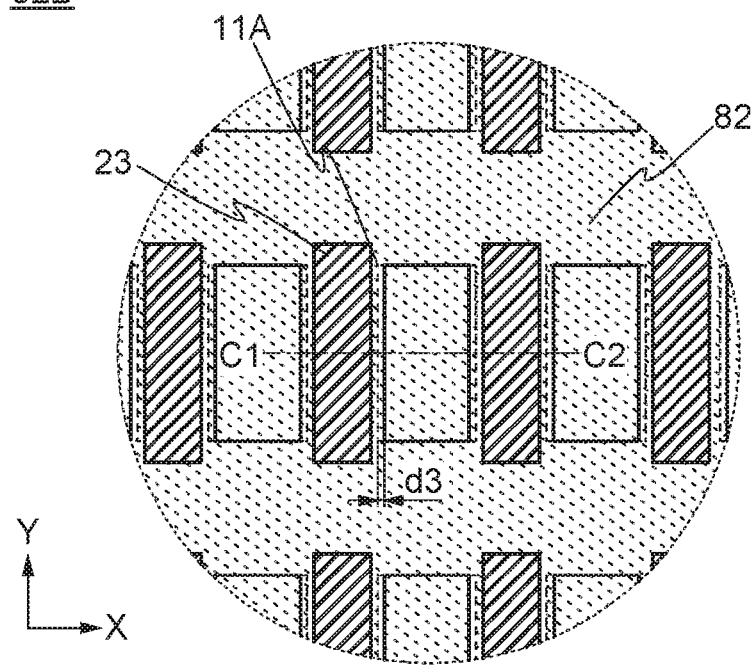
FIGS. 8A and 8B illustrate a structure example of a display device of one embodiment.
Figure 8B:
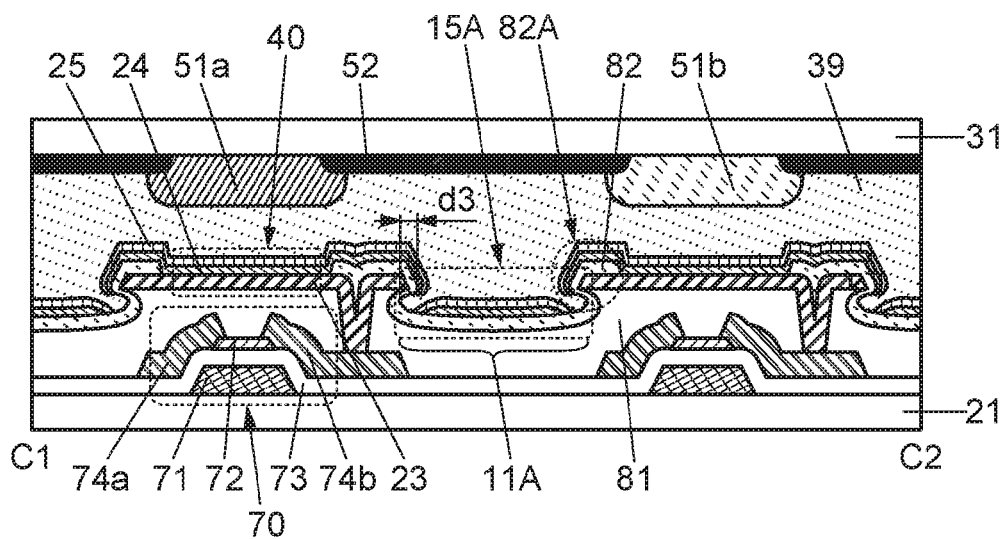

FIG. 8A is an enlarged view of a region 32B that is part of the display portion 32 and partly different from the region 32A in FIG. 1B. FIG. 8B illustrates an example of a cross section taken along the cutting-plane line C1-C2 in FIG. 8A. The structure in FIG. 8A differs from the structure in FIG. 1B in that the size of the opening provided in the insulating layer 81 is different and no opening is provided in the insulating layer 82. The description of FIG. 1B can be referred to for components in FIG. 8A which are the same as those in FIG. 1B.

Note that in FIG. 8A, the insulating layer 82 is hatched and step portions of the insulating layer 82 are denoted by solid lines. In addition, the periphery of the pixel electrode 23 covered with the insulating layer 82 is not illustrated.

The pixel electrodes 23 included in a plurality of display elements are arranged in a matrix in the display portion 32. An opening 11A is provided between two adjacent pixel electrodes 23. The opening 11A is formed in such a manner that the opening in insulating layer 81 is covered with the insulating layer 82. The insulating layer 82 is provided to cover an edge of the pixel electrode 23 (see FIG. 8B). In FIG. 8A, a periphery of the opening 11A is denoted by a dashed line.

Part of the periphery of the opening in the insulating layer 81 is positioned on an inner side than the edge of the pixel electrode 23 in a top view. Thus, the display device 10 in FIGS. 8A and 8B includes an eave-shaped projecting portion of the insulating layer 82 (a projecting portion 82A in FIG. 8B) that covers the edge of the pixel electrode 23, above the side surface of the insulating layer 82 in the opening 11A.

The opening 11A is filled with the adhesive layer 39, and the adhesive layer 39 has a region overlapping with the insulating layer 82 below the projecting portion 82A. Thus, the adhesive layer 39 includes the wedge-shaped region 15A that fits the opening 11A in a cross-sectional view, as illustrated in FIG. 8B. The region 15A in the adhesive layer 39 can increase the adhesion between the insulating layer 82 and the adhesive layer 39.

Since the insulating layer 82 and the adhesive layer 39, between which the EL layer 24 and the conductive layer 25 are sandwiched, have high adhesion, in the method for manufacturing the flexible display device, film separation can be suppressed. Therefore, one embodiment of the present invention can provide a display device with a high manufacturing yield.

The effect of suppressing the film separation can be determined by a length d3 of the eave-shaped projecting portion 82A (see FIGS. 8A and 8B). For example, the length d3 is greater than or equal to 0.05 µm and less than or equal to 5.0 µm, preferably greater than or equal to 0.1 µm and less than or equal to 1.0 µm, in which case the film separation can be effectively suppressed.

In the opening 11A (specifically, bottom and side surfaces of the projecting portion 82A in the opening 11A), the EL layer 24 is disconnected between two pixel electrodes 23. Thus, mixture of colors between adjacent pixels can be suppressed, so that the display device 10 can perform display with high color reproducibility.

Figure 9A:
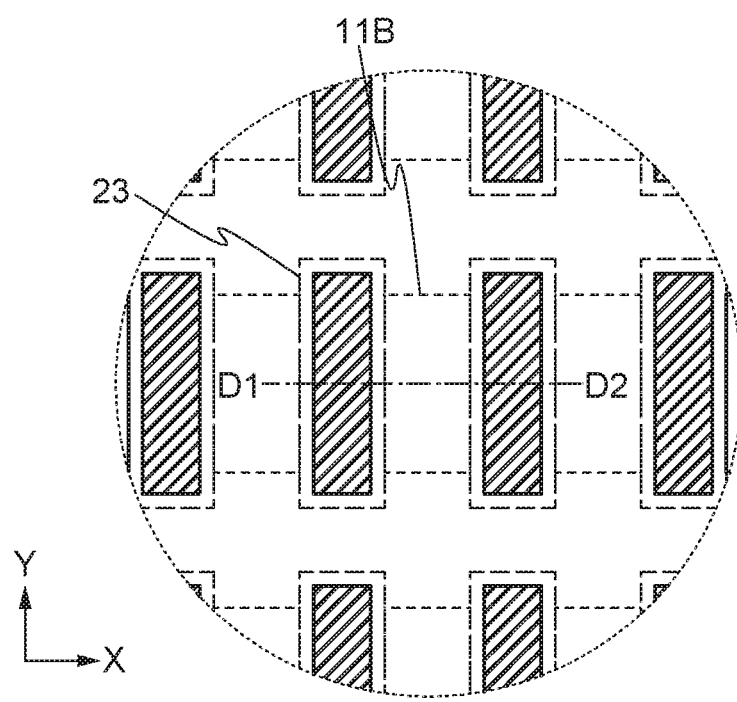
FIGS. 9A and 9B illustrate a structure example of a display device of one embodiment.
Figure 9B:
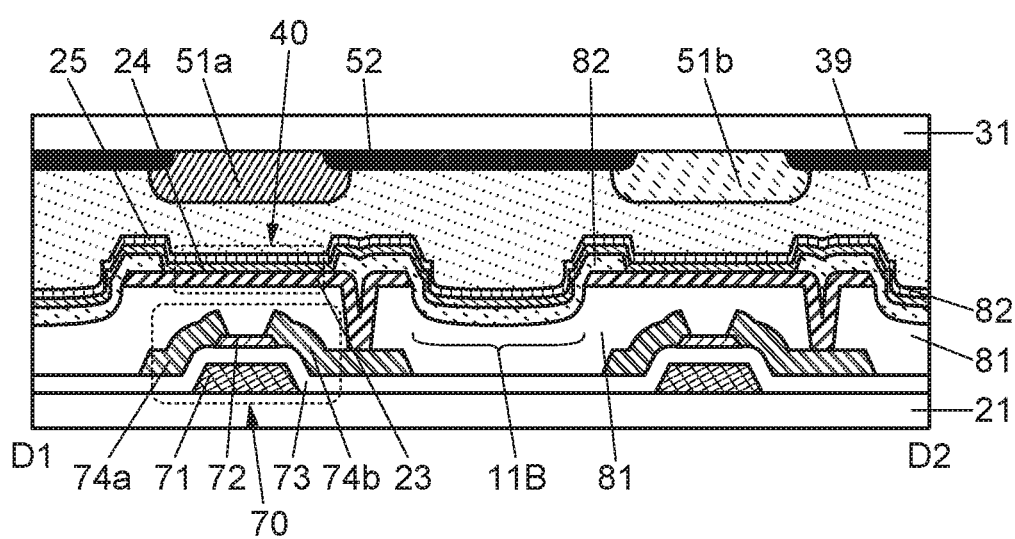

Note that part of the periphery of the opening 11A may be substantially aligned with the edge of the pixel electrode 23 in a top view. Alternatively, the periphery of the opening 11A may be positioned on an outer side than the edge of the pixel electrode 23. FIG. 9A illustrates an example of a top view in which an opening 11B is provided. Part of a periphery of the opening 11B is substantially aligned with the edge of the pixel electrode 23. FIG. 9B illustrates an example of a cross section taken along the cutting-plane line D1-D2 in FIG. 9A. In FIG. 9A, the periphery of the pixel electrode 23 and the periphery of the opening 11B are denoted by different dashed lines.

With such a structure, the EL layer 24 does not have a disconnected portion in the opening 11B provided between two pixel electrodes 23, whereby the reliability of the display device 10 can be increased.

Figure 10A:
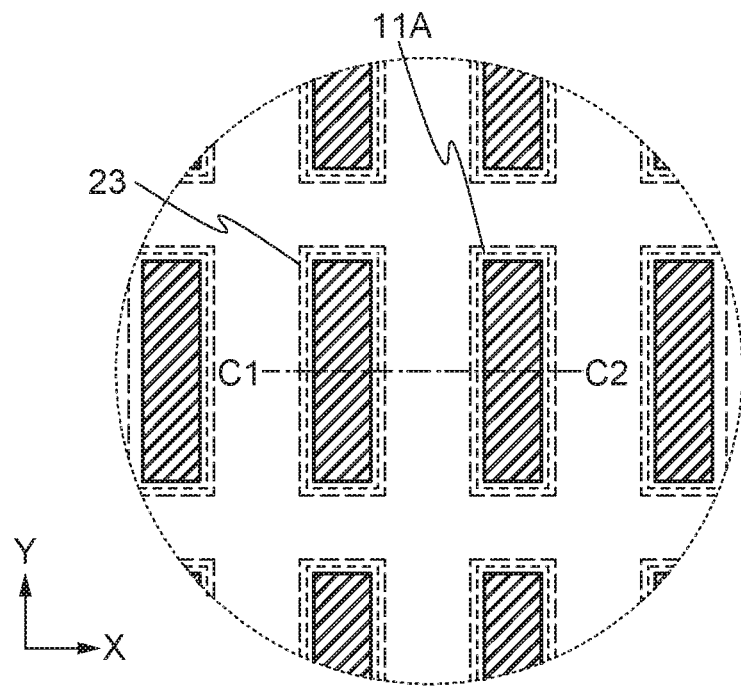
FIGS. 10A and 10B illustrate structure examples of a display device of one embodiment.
Figure 10B:
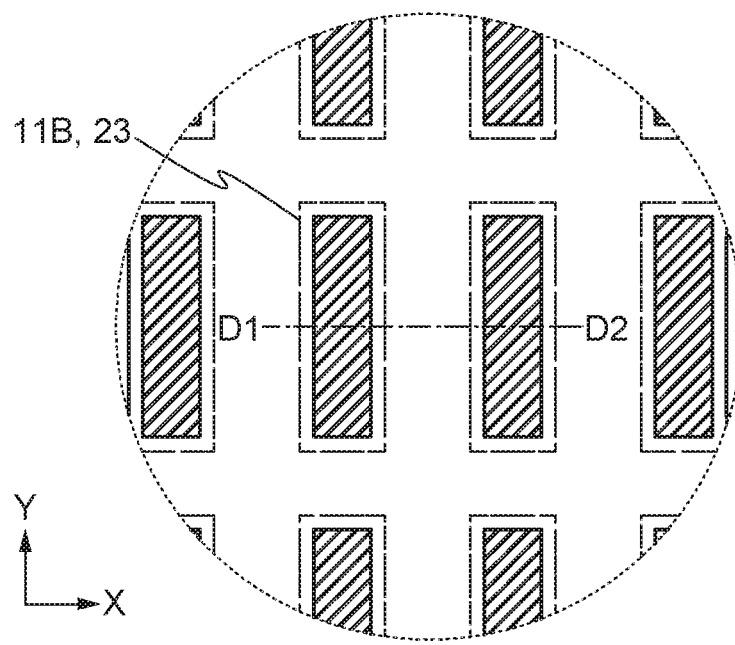

Examples in which the opening is provided between two pixel electrodes in the X direction and/or between two pixel electrodes in the Y direction are described above, but one embodiment of the present invention is not limited thereto. FIG. 10A illustrates an example of a top view of the display portion 32 in which the opening 11A is provided in a region of the insulating layer 81 where the pixel electrode 23 is not provided. FIG. 10B illustrates an example of a top view of the display portion 32 in which the opening 11B is provided in a region of the insulating layer 81 where the pixel electrode 23 is not provided.

In the structures in FIGS. 10A and 10B, the opening 11A and the opening 11B can be formed by etching using the pixel electrode 23 as a mask. By employing these structures, the number of steps for manufacturing the display device 10 can be reduced. Note that cross-sectional views taken along the cutting-plane lines (the cutting-plane line C1-C2 and the cutting-plane line D1-D2) in FIG. 10A and FIG. 10B are FIG. 8B and FIG. 9B, respectively.

[Pixel Structure Example 2]

Hereinafter, the cross-sectional structure example of the display device 10 of one embodiment of the present invention will be described more specifically. In particular, a top-emission light-emitting element is used as the display element.

[Pixel Structure Example 2-1]

Figure 11:
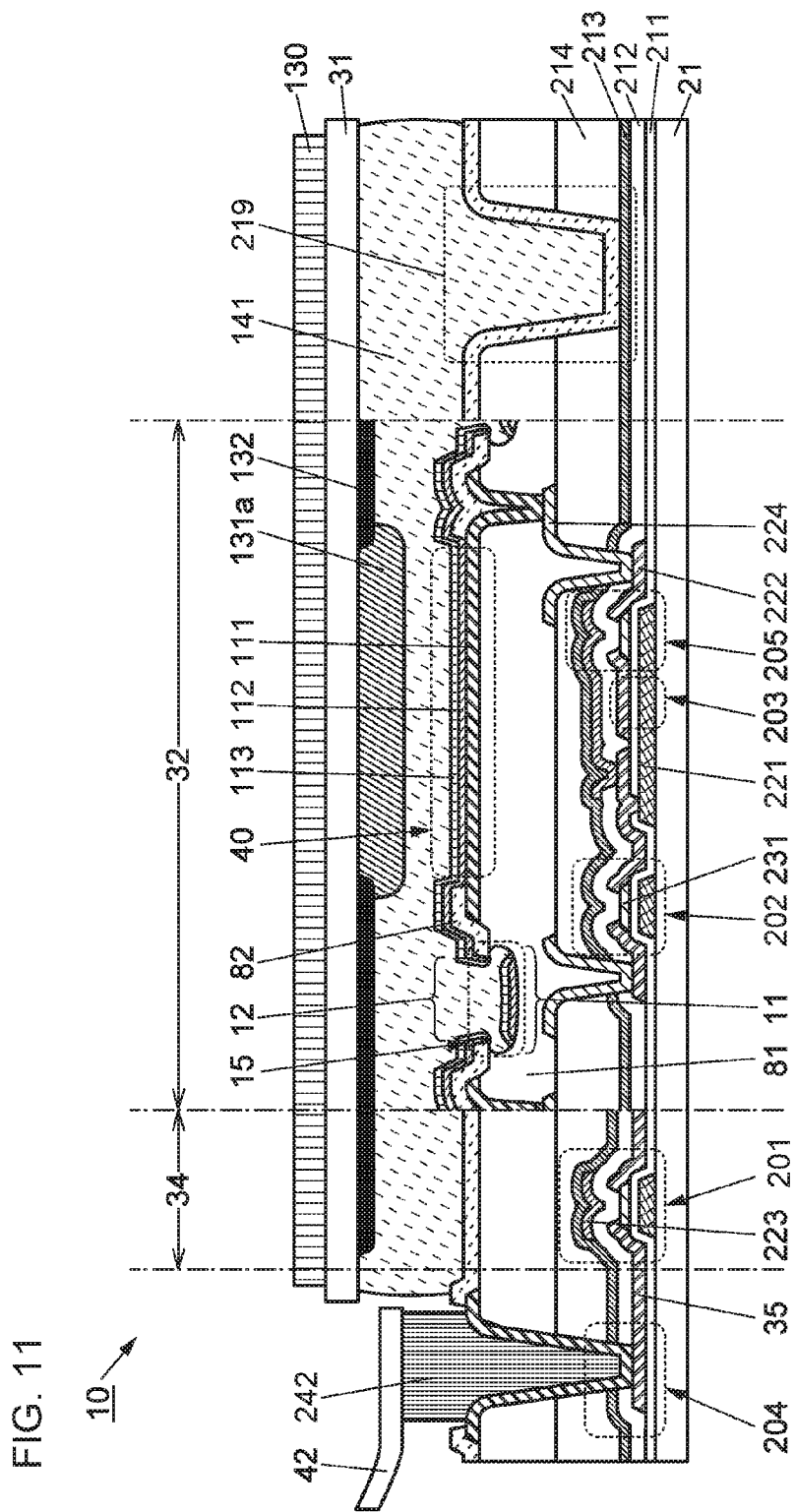
FIG. 11 illustrates a structure example of a display device of one embodiment.

FIG. 11 is a schematic cross-sectional view of the display device 10. FIG. 11 illustrates an example of the cross sections of a region including the FPC 42, a region including the circuit 34, a region including the display portion 32, a region including the periphery of the display device 10, and the like in FIG. 1A.

The substrates 21 and 31 are bonded with an adhesive layer 141. Part of the adhesive layer 141 has a function of sealing the light-emitting element 40. The polarizing plate 130 is preferably provided on the outer side of the substrate 31.

The light-emitting element 40, a transistor 201, a transistor 202, a transistor 205, a capacitor 203, a terminal portion 204, the wiring 35, and the like are provided over the substrate 21. A coloring layer 131a, a light-blocking layer 132, and the like are provided on the substrate 31 side. The light-emitting element 40 has a stacked structure of a conductive layer 111, an EL layer 112, and a conductive layer 113. Part of the conductive layer 111 serves as a pixel electrode whereas part of the conductive layer 113 serves as a common electrode. The light-emitting element 40 is a top-emission light-emitting element which emits light to the substrate 31 side.

FIG. 11 illustrates a cross section including one subpixel as an example of the display portion 32. The subpixel includes, for example, the transistor 202, the capacitor 203, the transistor 205, the light-emitting element 40, and the coloring layer 131a. For example, the transistor 202 is a switching transistor (a selection transistor), and the transistor 205 is a transistor for controlling current flowing in the light-emitting element 40 (a driving transistor).

In FIG. 11, a cross section including the transistor 201 is illustrated as an example of the circuit 34.

For the coloring layers (including the coloring layer 131a) included in the display device 10, a plurality of materials which transmit light with different colors can be used. For example, when a subpixel exhibiting a red color, a subpixel exhibiting a green color, and a subpixel exhibiting a blue color are arranged, full-color display can be achieved.

Insulating layers such as insulating layers 211, 212, 213, 214, 81, and 82 are provided over the substrate 21. A portion of the insulating layer 211 serves as a gate insulating layer of each of the transistors (e.g., the transistors 201, 202, and 205), and another portion thereof serves as a dielectric of the capacitor 203. The insulating layers 212, 213, and 214 are provided to cover the transistors, the capacitor 203, and the like. The insulating layer 214 serves as a planarization layer. Shown here is an example in which the three insulating layers 212, 213, and 214 are provided to cover the transistors and the like; however, one embodiment of the present invention is not limited to this example, and the number of provided insulating layers may be one, two, or four or more. The insulating layer 214 serving as a planarization layer is not necessarily provided when not needed. The insulating layer 81 is provided to cover a conductive layer 224. The insulating layer 81 may have a function as a planarization layer. The insulating layer 82 is provided to cover an end portion of the conductive layer 111, a contact portion that electrically connects the conductive layers 111 and 224, and the like.

The opening 11 and the opening 12 are provided in each of the insulating layer 81 and the insulating layer 82. In a top view, the periphery of the opening 12 is positioned on an inner side than the periphery of the opening 11. The opening 11 and the opening 12 are integrated to form a wedge-shaped opening in a cross-sectional view. The opening is filled with the adhesive layer 141.

Different insulating materials are preferably used for the insulating layer 81 and the insulating layer 82. Specifically, for the insulating layer 81 and the insulating layer 82, a combination of insulating materials with different etch rates (the amount of a reduction in film thickness per unit time) is preferable. More specifically, for example, the insulating layer 81 contains an organic resin material such as acrylic or polyimide, and the insulating layer 82 contains an inorganic insulating material such as silicon oxynitride or silicon nitride.

After the formation of the opening 12 in the insulating layer 82, etching which proceeds not only in a depth direction but also in a planar direction and which has a high etch rate of an organic resin material to an inorganic material is performed, whereby the opening 11 whose periphery is larger than that of the opening 12 can be formed in the insulating layer 81. An example of the etching is ashing using oxygen plasma.

Note that the etching is preferably anisotropy etching. By the anisotropy etching, the opening 11 whose periphery is larger than that of the opening 12 and whose depth is shallower than that of the opening 12 can be formed. That is, the insulating layer 81 can have a small thickness.

Each of the transistors 201, 202, and 205 includes a conductive layer 221 part of which serves as a gate electrode, a conductive layer 222 part of which serves as a source electrode or a drain electrode, and a semiconductor layer 231. Here, a plurality of layers obtained by processing the same conductive film are shown with the same hatching pattern.

In the example in FIG. 11, the capacitor 203 includes part of the conductive layer 221 serving as a gate electrode of the transistor 205, part of the insulating layer 211, and part of the conductive layer 222 serving as a source electrode or a drain electrode of the transistor 205.

In the transistor 202, one of the pair of conductive layers 222 which is not electrically connected to the capacitor 203 serves as part of a signal line. The conductive layer 221 serving as a gate electrode of the transistor 202 also serves as part of a scan line.

FIG. 11 illustrates an example in which the transistor 202 includes one gate electrode. The transistors 201 and 205 are each a transistor in which the semiconductor layer 231 where a channel region is formed is sandwiched between two gate electrodes (the conductive layers 221 and 223). When the transistor has the two gate electrodes, the threshold voltage thereof can be controlled more surely. Alternatively, the two gate electrodes may be connected to each other and supplied with the same signal to operate the transistor. Such a transistor can have a higher on-state current than other transistors and thus have a higher field-effect mobility. Consequently, a circuit capable of high-speed operation can be obtained. Furthermore, the area occupied by a circuit can be reduced. The use of the transistor having a high on-state current can reduce signal delay in wirings and can reduce display unevenness even in a large-sized or higher-resolution display device which has an increased number of wirings.

Note that the transistor (e.g., the transistor 201) included in the circuit 34 and the transistor (e.g., the transistors 202 and 205) included in the display portion 32 may have the same structure. A plurality of transistors included in the circuit 34 may have the same structure or different structures. A plurality of transistors included in the display portion 32 may have the same structure or different structures.

A material through which impurities such as water or hydrogen are not easily diffused is preferably used for at least one of the insulating layers 212 and 213 covering the transistors. Such an insulating layer can serve as a barrier film. This structure can effectively suppress the diffusion of impurities into the transistors from the outside, and the display device 10 can have high reliability.

The conductive layer 224 over the insulating layer 214 serves as a wiring. The conductive layer 224 is electrically connected to one of a source and a drain of the transistor 205 through an opening provided in the insulating layers 214, 213, and 212. Furthermore, the conductive layer 111 serving as a pixel electrode is provided over the insulating layer 81. The conductive layer 111 is electrically connected to any of the conductive layers 224 through an opening provided in the insulating layer 81. In FIG. 11, the conductive layer 111 is electrically connected to one of the source and the drain of the transistor 205 through the conductive layer 224.

The insulating layer 82 is provided to cover an end portion of the conductive layer 111. The EL layer 112 is provided over the conductive layer 111, the insulating layer 81, and the insulating layer 82. The conductive layer 113 is provided to cover the EL layer 112. The EL layer 112 and the conductive layer 113 which are shared with two conductive layers 111 are each disconnected in the opening 11.

In the light-emitting element 40, a material reflecting visible light is used for the conductive layer 111 and a material transmitting visible light is used for the conductive layer 113. With such a structure, a top-emission light-emitting element which emits light to the substrate 31 side can be provided. Components such as the transistors and capacitors can be positioned under the top-emission light-emitting element, leading to improved aperture ratio. Note that a material transmitting visible light may be used for both of the conductive layers 111 and 113, in which case a dual-emission light-emitting element emitting light to both of the substrate 31 side and the substrate 21 side is obtained.

A light-emitting element exhibiting a white color can be suitably used as the light-emitting element 40. Thus, the light-emitting elements 40 do not need to be separately fabricated in subpixels corresponding to different colors; accordingly, the display device 10 with an extremely high resolution can be provided. In that case, when light from the light-emitting element 40 passes through the coloring layer 131a or the like, light out of a specific wavelength range is absorbed by the coloring layer 131a or the like. Consequently, emitted light is red light, for example.

Alternatively, the light-emitting element 40 may have a microcavity structure by using a material reflecting visible light for the conductive layer 111, using a semi-transmissive or semi-reflective material for the conductive layer 113, and providing an optical adjustment layer transmitting visible light between the conductive layers 111 and 113. In that case, the optical adjustment layer preferably has a different thickness in each subpixel corresponding to a different color. A subpixel including the optical adjustment layer may be provided in combination with a subpixel including no optical adjustment layer.

The light-blocking layer 132 is provided on the surface of the substrate 31 that faces the substrate 21. The coloring layer 131a and the like are provided to cover end portions of the light-blocking layer 132 and an opening in the light-blocking layer 132. The coloring layer 131a and the like each overlap with the light-emitting element 40. Part of the light-blocking layer 132 overlaps with the region 15.

FIG. 11 illustrates an example in which a polarizing plate 130 is provided on the surface of the substrate 31 that is opposite to the surface facing the substrate 21. As the polarizing plate 130, a circularly polarizing plate is preferably used. As the circularly polarizing plate, for example, a stack including a linear polarizing plate and a quarter-wave retardation plate can be used. This results in suppression of external light reflection on a reflective member (e.g., the conductive layer 111) provided in the display portion 32.

FIG. 11 illustrates an example in which the light-emitting element 40 is sealed with the adhesive layer 141. When the adhesive layer 141 is formed using a material having a higher refractive index than air, the efficiency of extraction of light emitted from the light-emitting element 40 can be increased as compared with the case where a space is made between the light-emitting element 40 and the substrate 31.

Note that the adhesive layer 141 may be arranged on the outer edge of the display portion 32, i.e., a sealed hollow structure may be employed. In that case, a space formed by the substrates 21 and 31 and the adhesive layer 141 may be filled with air; preferably, filled with an inert gas such as a rare gas or a nitrogen gas. When the space in a steady state is under reduced pressure relative to the atmospheric pressure, the following phenomenon can be prevented: the space expands depending on the usage environment (e.g., pressure or temperature) and thus the substrate 21 or the substrate 31 expands. Meanwhile, when the space is under positive pressure relative to the atmospheric pressure, impurities such as moisture can be prevented from being diffused from the substrate 21, the substrate 31, the adhesive layer 141, or a gap therebetween into the space.

The terminal portion 204 is provided in a region near an end portion of the substrate 21. The terminal portion 204 is electrically connected to the FPC 42 through a connection layer 242. In the structure in FIG. 11, the terminal portion 204 is formed by stacking part of the wiring 35 and the conductive layer 111.

FIG. 11 illustrates an example of a cross section of the region including the periphery of the display device 10. In the periphery of the display device 10, an opening 219 is formed in the insulating layer 214 and the insulating layer 81. The opening 219 is provided to surround the display portion 32 in a top view.

An organic resin such as acrylic or polyimide can be applied on a substrate with a coater, and thus can provide a film with high planarity. For this reason, the organic resin can be suitably used for the insulating layer 214 and the insulating layer 81. The organic resin has higher water permeability than an inorganic insulating material. In view of the above, the opening 219 that surrounds the display portion 32 can prevent impurities such as water from entering the inside of the display portion 32, whereby the reliability of the display device 10 can be increased.

Note that in the case where the organic resin material is used for the insulating layer 82, an opening is preferably formed in a region of the insulating layer 82 which overlaps with the opening 219. Furthermore, for example, in the case where a material with low water permeability is used for the insulating layer 214 and the insulating layer 81, the opening 219 is not necessarily provided.

The above is the description of Pixel structure example 2-1.

[Pixel Structure Example 2-2]

Figure 12:
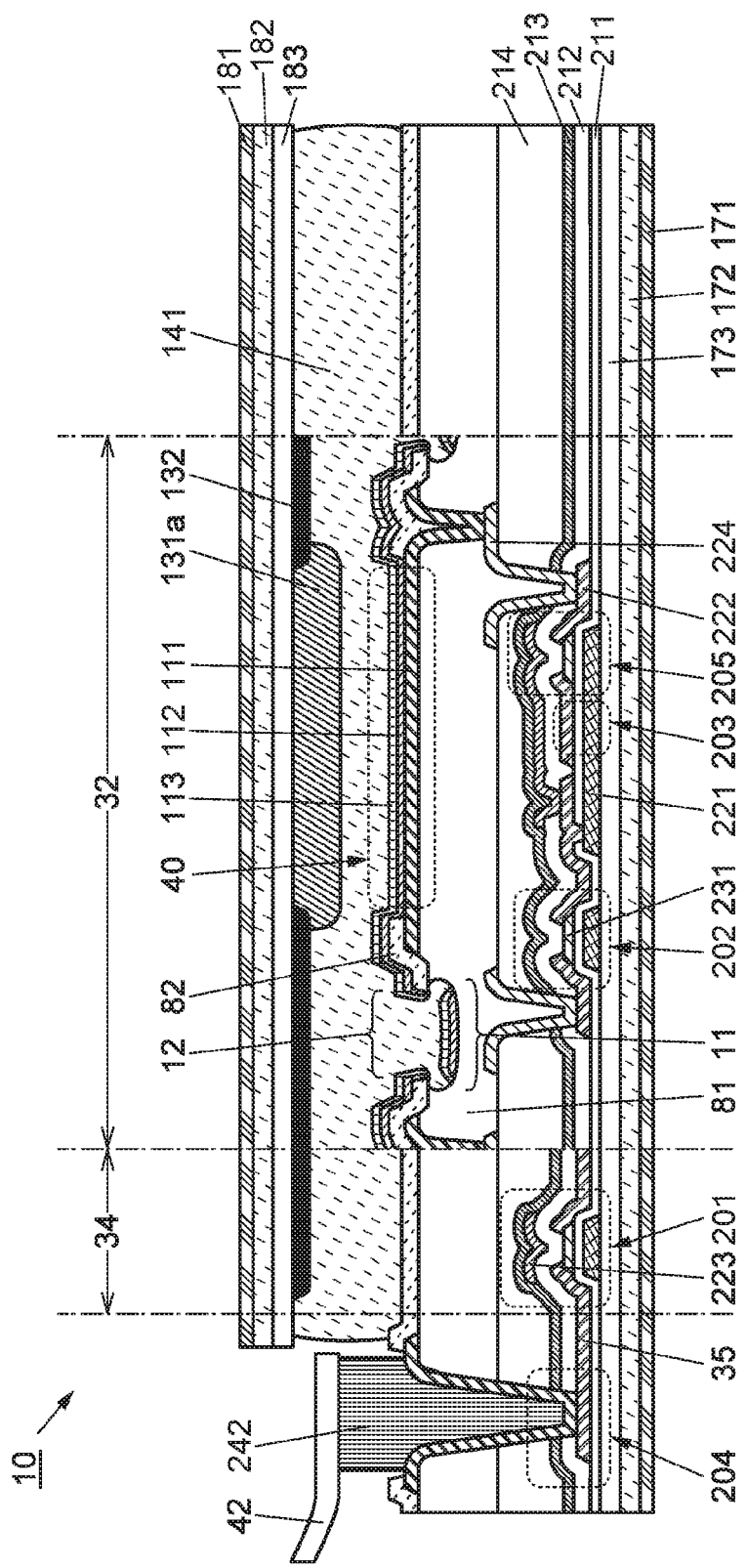
FIG. 12 illustrates a structure example of a display device of one embodiment.

FIG. 12 illustrates a cross-sectional structure example of the display device 10 in which a substrate 171 and a substrate 181 each having flexibility are used as a pair of substrates. Part of a display surface of the display device 10 in FIG. 12 is bendable.

In the display device 10 illustrated in FIG. 12, the substrate 171, an adhesive layer 172, and an insulating layer 173 are provided instead of the substrate 21 in FIG. 11. Furthermore, the substrate 181, an adhesive layer 182, and an insulating layer 183 are provided instead of the substrate 31.

The insulating layers 173 and 183 are preferably formed using a material through which impurities such as water are not easily diffused.

The display device 10 in FIG. 12 has a structure in which transistors (e.g., the transistors 201, 202, and 205) and the light-emitting element 40 are sandwiched between the insulating layers 173 and 183. Thus, even in the case where the substrate 171, the substrate 181, the adhesive layer 172, the adhesive layer 182, or the like is formed using a material through which impurities such as water or hydrogen are easily diffused, the insulating layers 173 and 183 positioned further inward (closer to the transistors and the light-emitting element 40) than the substrates 171 and 181 and the adhesive layers 172 and 182 can prevent impurities from being diffused into the insulating layers 173 and 183, so that the reliability of the display device 10 can be increased. In addition, a variety of materials can be used because there is no need to consider the diffusion properties of impurities in the selection of materials for the substrates 171 and 181, the adhesive layers 172 and 182, and the like.

FIG. 12 illustrates an example in which the opening 219 is not provided on the periphery of the display device 10.

[Manufacturing Method Example]

Here, a method for manufacturing a flexible display device will be described.

For convenience, a layered structure including a pixel and a circuit, a layered structure including an optical member such as a coloring layer (a color filter), a layered structure including an electrode or a wiring of a touch sensor, or the like is referred to as an element layer. The element layer includes, for example, a display element, and may additionally include a wiring electrically connected to the display element or an element such as a transistor used in a pixel or a circuit.

Here, a substrate refers to a flexible member that eventually supports an element layer (e.g., the substrate 171 and the substrate 181 in FIG. 12). For example, an extremely thin (greater than or equal to 10 nm and less than or equal to 200 μm) film is also referred to a substrate.

As a method for forming an element layer over a flexible substrate provided with an insulating surface, the following two methods can be typically used: a method in which an element layer is formed directly over a substrate; and a method in which an element layer is formed over a support substrate that is different from the substrate and then the element layer is separated from the support substrate and transferred to the substrate.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, selected is a material with which separation at an interface between the support substrate and the separation layer, at an interface between the separation layer and the insulating layer, or in the separation layer occurs. In this method, a high heat-resistant material is preferably used for the support substrate and the separation layer, because the upper temperature limit in manufacturing the element layer can be increased and thus an element layer including a more highly reliable element can be formed.

For example, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer, be used as the insulating layer over the separation layer. Note that in this specification, oxynitride contains more oxygen than nitrogen, and nitride oxide contains more nitrogen than oxygen.

The element layer and the support substrate can be separated by applying mechanical power, by etching the separation layer, by injecting a liquid into the separation interface, or the like. Alternatively, separation may be performed by heating or cooling two layers of the separation interface by utilizing a difference in thermal expansion coefficient.

The separation layer is not necessarily provided in the case where separation can occur at an interface between the support substrate and the insulating layer.

For example, glass can be used as the support substrate and an organic resin such as polyimide can be used as the insulating layer. In that case, a separation trigger may be formed by, for example, locally heating part of the organic resin with laser light or the like, or by physically cutting part of or making a hole through the organic resin with a sharp tool, so that separation may be performed at an interface between the glass and the organic resin.

Alternatively, a heat-generation layer may be provided between the support substrate and the insulating layer formed of an organic resin, and separation may be performed at an interface between the heat-generation layer and the insulating layer by heating the heat-generation layer. The heat-generation layer can be formed using a variety of materials such as a material that generates heat when current flows therethrough, a material that generates heat when absorbs light, or a material that generates heat when applied with a magnetic field. For example, a semiconductor, a metal, or an insulator can be selected for the heat-generation layer.

In the aforementioned methods, the insulating layer formed of an organic resin can be used as a substrate after the separation.

In the structure illustrated in FIG. 12, for example, a first separation layer and the insulating layer 173 are formed in this order over a first support substrate, and then components in a layer thereover are formed. Separately, a second separation layer and the insulating layer 183 are formed in this order over a second support substrate, and then components in a layer thereover are formed. Next, components on the first support substrate and components on the second support substrate are bonded to each other with the adhesive layer 141. After that, separation at an interface between the second separation layer and the insulating layer 183 is conducted so that the second support substrate and the second separation layer are removed, and then the insulating layer 183 is bonded to the substrate 181 with the adhesive layer 182. Further, separation at an interface between the first separation layer and the insulating layer 173 is conducted so that the first support substrate and the first separation layer are removed, and then the insulating layer 173 is bonded to the substrate 171 with the adhesive layer 172. Note that either the first support substrate side or the second support substrate side may be subjected to separation and bonding first.

The above is the description of a method for manufacturing a flexible display device.

[Pixel Structure Example 2-3]

Figure 13:
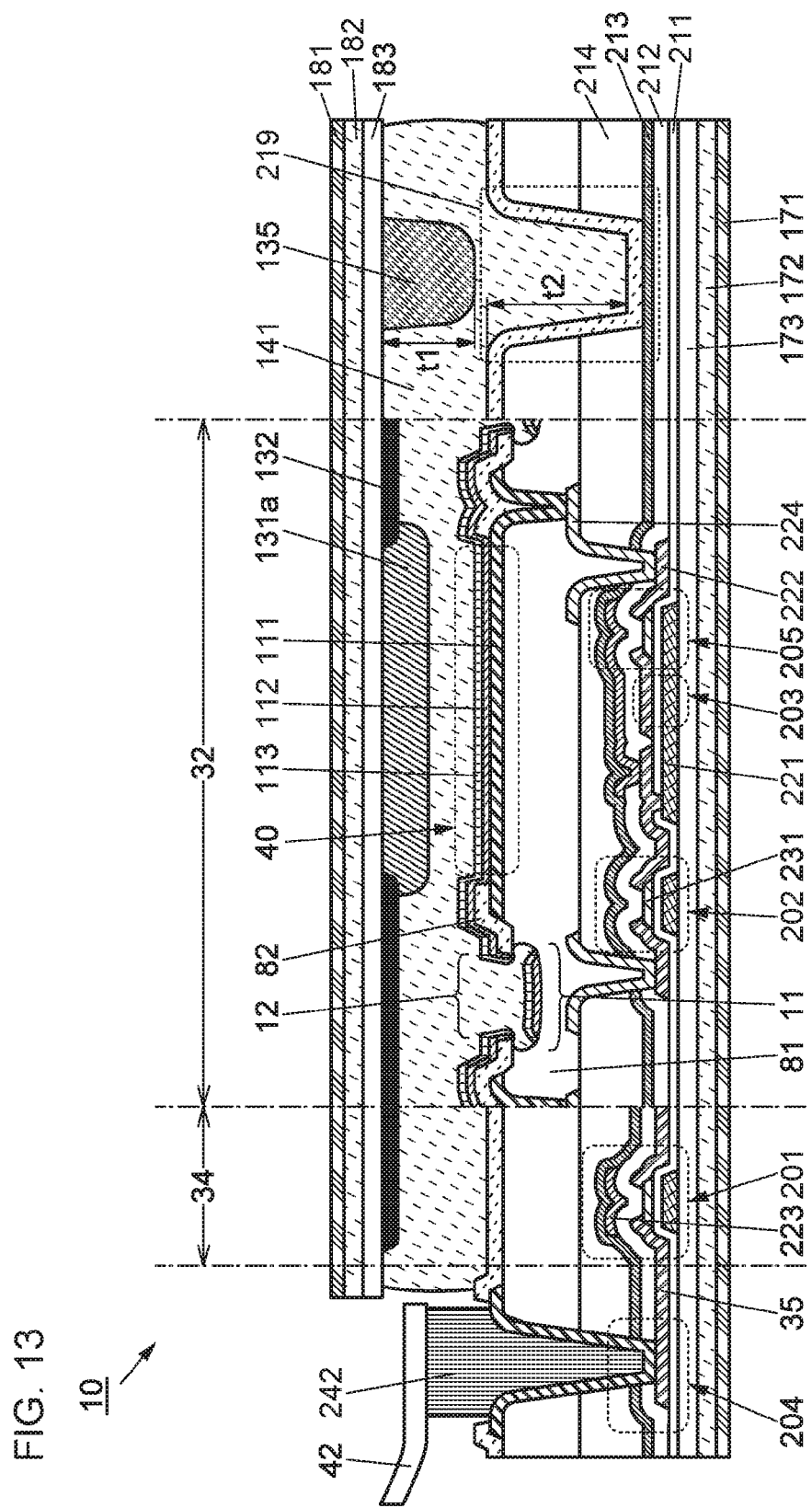
FIG. 13 illustrates a structure example of a display device of one embodiment.

FIG. 13 illustrates a cross-sectional structure example of the display device 10 that is partly different from the display device 10 in FIG. 11. The display device 10 in FIG. 13 differs from the display device 10 in FIG. 11 in that the pair of flexible substrates 171 and 181 is used as a pair of substrates, the polarizing plate 130 is not included, and a structure body 135 is included.

The method for manufacturing the display device 10 includes a step of bonding the first support substrate and the second support substrate through the adhesive layer 141. The first support substrate is provided with an element layer positioned between the adhesive layer 141 and the substrate 21 in FIG. 13. The second support substrate is provided with an element layer positioned between the adhesive layer 141 and the substrate 31 in FIG. 13. The bonding is performed in such a manner that an adhesive to be the adhesive layer 141 by being cured is applied on a surface of the element layer of the first support substrate or a surface of the element layer of the second support substrate, a space between the first support substrate and the second support substrate is filled with the adhesive by attaching the both surfaces of the element layers, and then the adhesive is cured.

When the space between the first support substrate and the second support substrate is filled with the adhesive, if the surface of the element layer of the first support substrate or the surface of the element layer of the second support substrate has a highly uneven portion such as the opening 219, a space formed by the uneven portion cannot be sufficiently filled with the adhesive and a void is formed in the uneven portion in some cases. The void might cause film separation from the void in the step of separating the support substrate in the manufacturing method described above as an example.

In the display device 10 in FIG. 13, the structure body 135 is provided to overlap with the opening 219 over the substrate 171. A periphery of the structure body 135 is preferably positioned on an inner side than a periphery of the opening 219 in a top view. It is preferable that a height t1 of the structure body 135 be larger than a half of a depth t2 of the opening 219 and smaller than the depth t2.

Such a structure can prevent a rapid change of a cell gap (a distance between a surface of the substrate 171 and a surface of the substrate 181 which face to each other) near the opening 219 in the display device 10, whereby the opening 219 can be filled with the adhesive. Thus, the display device 10 can have a high manufacturing yield.

A material for the structure body 135 is not particularly limited, and for example, a resin such as acrylic, polyimide, or epoxy can be used.

Figure 14:
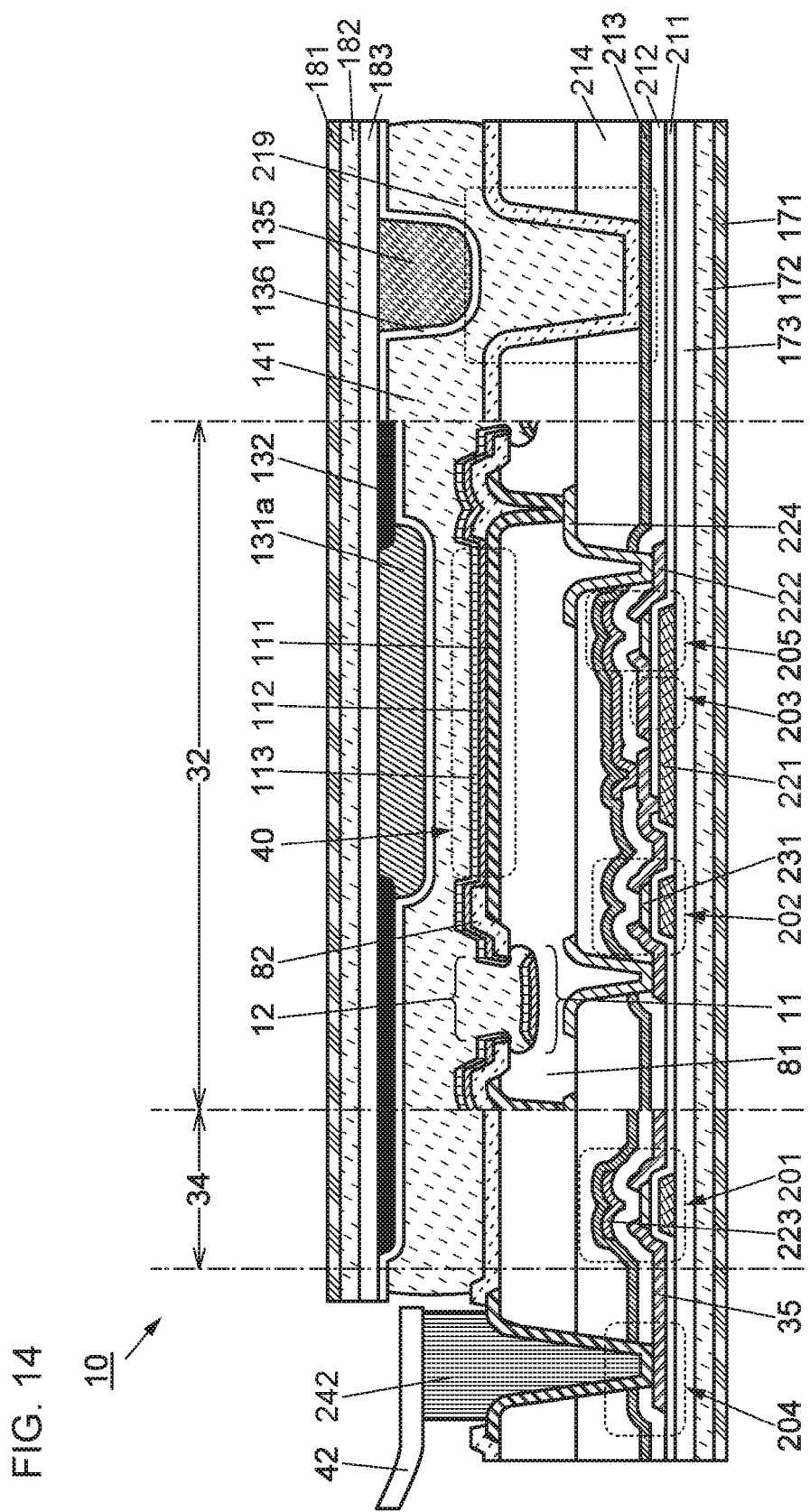
FIG. 14 illustrates a structure example of a display device of one embodiment.

Note that when the structure body 135 is covered with or formed with a material having low water permeability, the amount of moisture that enters the EL layer 112 through the adhesive layer 141 can be reduced. Therefore, the reliability of the display device 10 can be increased. FIG. 14 illustrates an example of a cross-sectional view of the display device 10 in which the structure body 135 is covered with an insulating layer 136. For the insulating layer 136, a material similar to a material of the insulating layer 212 or the insulating layer 213 can be used.

A coloring layer may be provided in a position overlapping with the opening 219 instead of the structure body 135. FIG. 15 illustrates an example in which the coloring layer 131a and the coloring layer 131b are formed in the position overlapping with the opening 219. In that case, by a step of forming a coloring layer in the display portion 32, a structure body having a function similar to that of the structure body 135 can be formed in the position overlapping with the opening 219, whereby the number of steps for manufacturing the display device 10 can be reduced. Note that the coloring layer 131b is used for a subpixel that exhibits a color different from a subpixel using the coloring layer 131a in the display portion 32.

[Components]

The above components will be described below.

[Substrate]

A material having a flat surface can be used as the substrate included in the display device 10. The substrate on the side from which light from the display element is extracted is formed using a material transmitting the light. For example, a material such as glass, quartz, ceramics, sapphire, or an organic resin can be used.

The weight and thickness of the display device 10 can be reduced by using a thin substrate. The display device 10 can have flexibility by using a substrate that is thin enough to have flexibility.

Since the substrate through which light emission is not extracted does not need to have a light-transmitting property, a metal substrate or the like can be used in addition to the above-mentioned substrates. A metal material, which has high thermal conductivity, is preferable because it can easily conduct heat to the whole substrate and accordingly can prevent a local temperature rise in the display device 10. To obtain flexibility and bendability, the thickness of a metal substrate is preferably greater than or equal to 10 µm and less than or equal to 200 µm, more preferably greater than or equal to 20 µm and less than or equal to 50 µm.

Although there is no particular limitation on a material of a metal substrate, it is favorable to use, for example, a metal such as aluminum, copper, or nickel, an aluminum alloy, or an alloy such as stainless steel.

It is also possible to use a substrate subjected to insulation treatment, e.g., a metal substrate whose surface is oxidized or provided with an insulating layer. For example, an oxide film may be formed on the substrate surface by exposure to or heating in an oxygen atmosphere, an anodic oxidation method, or the like, or the insulating film may be formed by, for example, a coating method such as a spin-coating method or a dipping method, an electrodeposition method, an evaporation method, or a sputtering method.

Examples of the material that has flexibility and transmits visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display device using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are bonded with an adhesive layer may be used.

A hard coat layer (e.g., a silicon nitride layer or an aluminum oxide layer) by which a touch panel surface is protected from damage, a layer (e.g., an aramid resin layer) that can disperse pressure, or the like may be stacked over the flexible substrate. Furthermore, to suppress a decrease in the lifetime of the display element due to moisture and the like, an insulating layer with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. Particularly when a glass layer is used, a barrier property against water and oxygen can be improved and thus the display device 10 can have high reliability.

[Transistor]

The transistor includes a conductive layer serving as the gate electrode, the semiconductor layer, a conductive layer serving as the source electrode, a conductive layer serving as the drain electrode, and an insulating layer serving as the gate insulating layer. In the above, a bottom-gate transistor is used.

Note that there is no particular limitation on the structure of the transistor included in the touch panel of one embodiment of the present invention. For example, a planar transistor, a staggered transistor, or an inverted staggered transistor may be used. A top-gate transistor or a bottom-gate transistor may be used. Gate electrodes may be provided above and below a channel formation region.

[Semiconductor Layer]

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of electrical characteristics of the transistor can be suppressed.

For a semiconductor layer of the transistor, for example, a semiconductor material such as an element of Group 14 (e.g., silicon or germanium), a compound semiconductor, or an oxide semiconductor can be used. Typically, a semiconductor containing silicon, a semiconductor containing gallium arsenide, an oxide semiconductor containing indium, or the like can be used.

In particular, an oxide semiconductor having a wider band gap than silicon is preferably used. A semiconductor material having a wider band gap and a lower carrier density than silicon is preferably used because the off-state leakage current of the transistor can be reduced.

For the semiconductor layer, it is particularly preferable to use an oxide semiconductor including a plurality of crystal parts whose c-axes are aligned substantially perpendicular to a surface on which the semiconductor layer is formed or the top surface of the semiconductor layer and in which a grain boundary is difficult to observe between adjacent crystal parts.

There is no grain boundary in such an oxide semiconductor; therefore, generation of a crack in an oxide semiconductor film which is caused by stress when a display panel is bent is prevented. Therefore, such an oxide semiconductor can be preferably used for a flexible touch panel which is used in a bent state, or the like.

Moreover, the use of such an oxide semiconductor with crystallinity for the semiconductor layer of the transistor makes it possible to provide a highly reliable transistor with a small change in electrical characteristics of the transistor.

A transistor in which an oxide semiconductor whose band gap is larger than the band gap of silicon is used for a semiconductor layer has a low off-state current and therefore charges accumulated in a capacitor that is series-connected to the transistor can be held for a long time. When such a transistor is used for a pixel, operation of a driver circuit can be stopped while a gray scale of an image displayed in each display region is maintained. As a result, the display device 10 can significantly reduce power consumption.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to indium, zinc, and M.

Examples of the stabilizer are gallium, tin, hafnium, aluminum, and zirconium, which are used as the element M described above. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As an oxide semiconductor included in the semiconductor layer of the transistor, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components, and there is no limitation on the ratio of In:Ga:Zn. The In—Ga—Zn-based oxide may contain another metal element in addition to In, Ga, and Zn.

The semiconductor layer and the conductive layer of the transistor may include the same metal elements contained in the above oxides. The use of the same metal elements for the semiconductor layer and the conductive layer can reduce the manufacturing cost. For example, when metal oxide targets with the same metal composition are used, the manufacturing cost can be reduced, and the same etching gas or the same etchant can be used in processing the semiconductor layer and the conductive layer. Note that even when the semiconductor layer and the conductive layer include the same metal elements, they have different compositions in some cases. For example, a metal element in a film is released during the process for manufacturing the transistor and the capacitor, which might vary the metal compositions.

The band gap of the oxide semiconductor included in the semiconductor layer of the transistor is 2 eV or more, preferably 2.5 eV or more, and more preferably 3 eV or more. With the use of the oxide semiconductor having such a wide band gap for the semiconductor layer of the transistor, the off-state current of the transistor can be reduced.

In the case where the oxide semiconductor included in the semiconductor layer of the transistor is an In-M-Zn oxide, it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=3:1:2, In:M:Zn=4:2:4.1, and the like are preferable. Note that the atomic ratio of metal elements in the formed semiconductor layer varies from the above atomic ratio of metal elements of the sputtering target within a range of ±40% as an error.

An oxide semiconductor film with a low carrier density is used as the semiconductor layer. For example, the semiconductor layer is an oxide semiconductor film whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable electrical characteristics of a transistor.

Note that, the oxide semiconductor that can be used for the semiconductor layer of the transistor is not limited to those described above. A material with an appropriate composition may be used depending on required semiconductor characteristics and electrical characteristics (e.g., field-effect mobility and threshold voltage) of a transistor. To obtain the required electrical characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the oxide semiconductor included in the semiconductor layer of the transistor, the semiconductor layer includes an increased number of oxygen vacancies, and thus becomes n-type. Hence, the concentration of silicon or carbon (measured by secondary ion mass spectrometry) in the semiconductor layer is lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor using the oxide semiconductor for the semiconductor layer might be increased. Therefore, the concentration of alkali metal or alkaline earth metal of the semiconductor layer of the transistor, which is measured by secondary ion mass spectrometry, is lower than or equal to $1\times10^{18}$ atoms/cm$^3$, preferably lower than or equal to $2\times10^{16}$ atoms/cm$^3$.

When nitrogen is contained in the oxide semiconductor included in the semiconductor layer of the transistor, electrons serving as carriers are generated and the carrier density increases, so that the semiconductor layer easily becomes n-type. Thus, a transistor using an oxide semiconductor which contains nitrogen for a semiconductor layer is likely to be normally on. Hence, the concentration of nitrogen which is measured by secondary ion mass spectrometry is preferably set to lower than or equal to $5\times10^{18}$ atoms/cm$^3$.

The semiconductor layer may have a non-single-crystal structure, for example. The non-single-crystal structure includes, for example, CAAC-OS (c-axis aligned crystalline oxide semiconductor, or c-axis aligned and a-b-plane-anchored crystalline oxide semiconductor), a polycrystalline structure, a microcrystalline structure, or an amorphous structure. Among the non-single-crystal structures, an amorphous structure has the highest density of defect states, whereas CAAC-OS has the lowest density of defect states.

An oxide semiconductor film having an amorphous structure has, for example, disordered atomic arrangement and no crystalline component. Alternatively, an oxide semiconductor film having an amorphous structure has, for example, an absolutely amorphous structure and no crystal part.

Note that the semiconductor layer of the transistor may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a stacked-layer structure including two or more of the above regions in some cases.

Alternatively, silicon is preferably used as a semiconductor layer in which a channel region of a transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has higher field effect mobility and higher reliability than amorphous silicon. When such a polycrystalline semiconductor is used for a pixel, for example, the aperture ratio of the pixel can be improved. Even in the case where pixels are provided at extremely high density, a gate driver circuit and a source driver circuit can be formed over a substrate over which the pixels are formed, and the number of components of an electronic device can be reduced.

The bottom-gate transistor described in this embodiment is preferable because the number of manufacturing steps can be reduced. When amorphous silicon, which can be formed at a lower temperature than polycrystalline silicon, is used for the semiconductor layer of the transistor, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner and variation in characteristics can be reduced. In that case, the use of polycrystalline silicon, single crystal silicon, or the like is particularly preferable for the semiconductor layer of the transistor.

[Conductive Layer]

As materials for a gate, a source, and a drain of a transistor, and a conductive layer such as a wiring or an electrode included in the display device 10, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because the controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stacked film of indium tin oxide and an alloy of silver and magnesium is preferably used because the conductivity can be increased. They can also be used for conductive layers such as a variety of wirings and electrodes included in the display device 10, and conductive layers (e.g., conductive layers serving as a pixel electrode or a common electrode) included in a display element.

[Insulating Layer]

Examples of an insulating material that can be used for the insulating layers include a resin such as acrylic or epoxy resin, a resin having a siloxane bond such as silicone, and an inorganic insulating material such as silicon oxide, silicon oxynitride, silicon nitride oxide, silicon nitride, or aluminum oxide.

The light-emitting element is preferably provided between a pair of insulating layers with low water permeability, in which case impurities such as water can be prevented from entering the light-emitting element, preventing a decrease in the reliability of the display device 10.

As an insulating layer with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like may be used.

For example, the water vapor transmittance of the insulating layer with low water permeability is lower than or equal to $1\times10^{-5}$ [g/(m$^2$·day)], preferably lower than or equal to $1\times10^{-6}$ [g/(m$^2$·day)], more preferably lower than or equal to $1\times10^{-7}$ [g/(m$^2$·day)], and still more preferably lower than or equal to $1\times10^{-8}$ [g/(m$^2$·day)].

[Light-Emitting Element]

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include a layer containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer, and an inorganic compound may also be included. The layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between the anode and the cathode, holes are injected to the EL layer from the anode side and electrons are injected to the EL layer from the cathode side. The injected electrons and holes are recombined in the EL layer, so that a light-emitting substance contained in the EL layer emits light.

In the case where a light-emitting element emitting white light is used as the light-emitting element, the EL layer preferably contains two or more kinds of light-emitting substances. For example, light-emitting substances are selected so that two or more light-emitting substances emit complementary colors to obtain white light emission. Specifically, it is preferable to contain two or more light-emitting substances selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., greater than or equal to 350 nm and less than or equal to 750 nm). An emission spectrum of a material emitting light having a peak in the wavelength range of a yellow light preferably includes spectral components also in the wavelength range of a green light and a red light.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used when formed thin so as to have a light-transmitting property. Alternatively, a stacked film of any of the above materials can be used as the conductive layer. For example, a stacked film of indium tin oxide and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium, or an alloy including any of these metal materials can be used. Lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy of silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the conductive film having a property of transmitting visible light and a film containing any of the above metal materials may be stacked. For example, a stack of silver and indium tin oxide, a stack of an alloy of silver and magnesium and indium tin oxide, or the like can be used.

The electrodes may each be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, used for the light-emitting layer, the quantum dot can serve as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, a fringe field switching (FFS) mode, an axially symmetric aligned microcell (ASM) mode, an optically compensated birefringence (OCB) mode, a ferroelectric liquid crystal (FLC) mode, or an antiferroelectric liquid crystal (AFLC) mode can be used.

The liquid crystal element controls the transmission or non-transmission of light utilizing an optical modulation action of a liquid crystal. Note that the optical modulation action of the liquid crystal is controlled by an electric field applied to the liquid crystal (including a horizontal electric field, a vertical electric field, or an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. The blue phase is a liquid crystal phase, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process and reduces the viewing angle dependence. Since the alignment film does not need to be provided, rubbing treatment is not necessary; accordingly, electrostatic discharge damage caused by the rubbing treatment can be prevented, reducing defects and damage of a liquid crystal display device in the manufacturing process.

The liquid crystal element may be a transmissive liquid crystal element, a reflective liquid crystal element, a semi-transmissive liquid crystal element, or the like.

In the case where a transmissive or semi-transmissive liquid crystal element is used, two polarizing plates are provided such that a pair of substrates are sandwiched therebetween. Furthermore, a backlight is provided on the outer side of the polarizing plate. The backlight may be a direct-below backlight or an edge-light backlight. The direct-below backlight including a light-emitting diode (LED) is preferably used because local dimming is easily performed to improve contrast. The edge-light type backlight is preferably used because the thickness of a touch panel module including the backlight can be reduced.

In the case where a reflective liquid crystal element is used, a polarizing plate is provided on a display surface. In addition, a light diffusion plate is preferably provided on the display surface to improve visibility.

[Adhesive Layer]

As the adhesive layer, a variety of curable adhesives such as a reactive curable adhesive, a thermosetting adhesive, an anaerobic adhesive, and a photo-curable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs water by chemical adsorption, such as oxide of an alkaline earth metal (e.g., calcium oxide or barium oxide), can be used. Alternatively, a substance that adsorbs water by physical adsorption, such as zeolite or silica gel, may be used. The drying agent is preferably included because it can prevent impurities such as water from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layers, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, a metal, a metal oxide, and a composite oxide containing a solid solution of a plurality of metal oxides. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of each of the components.

[Structure Example 2]

As examples of the display device 10 of one embodiment of the present invention, structure examples of an input/output device (touch panel), an input device (touch sensor), and the like will be described below.

Note that in this specification and the like, a display panel as one embodiment of the display device 10 has a function of displaying (outputting) an image or the like on (to) a display surface; hence, the display panel is one embodiment of an output device.

In this specification and the like, a structure in which a connector such as a flexible printed circuit (FPC) or a tape carrier package (TCP) is attached to a substrate of a display panel, or a structure in which an integrated circuit (IC) is mounted on a substrate by a chip on glass (COG) method or the like is referred to as a display panel module or a display module, or simply referred to as a display panel or the like in some cases.

In this specification and the like, a touch sensor has a function of sensing contact or approach of an object such as a finger or a stylus; hence, the touch sensor is one embodiment of an input device.

In this specification and the like, a substrate provided with a touch sensor is referred to as a touch sensor panel or simply referred to as a touch sensor or the like in some cases. Furthermore, in this specification and the like, a structure in which a connector such as an FPC or a TCP is attached to a substrate of a touch sensor panel, or a structure in which an IC is mounted on a substrate by a COG method or the like is referred to as a touch sensor panel module, a touch sensor module, or a sensor module, or simply referred to as a touch sensor or the like in some cases.

Note that in this specification and the like, a touch panel which is one embodiment of the display device 10 has a function of displaying (outputting) an image or the like on (to) a display surface and a function as a touch sensor capable of sensing contact or approach of an object such as a finger or a stylus on or to the display surface. Therefore, the touch panel is one embodiment of an input/output device.

A touch panel can be referred to, for example, a display panel (or a display device) with a touch sensor or a display panel (or a display device) having a touch sensor function.

A touch panel can include a display panel and a touch sensor panel. Alternatively, a touch panel can have a function of a touch sensor inside a display panel.

In this specification and the like, a structure in which a connector such as a TCP is attached to a substrate of a touch panel, or a structure in which an IC is mounted on a substrate by a COG method or the like is referred to as a touch panel module or a display module, or simply referred to as a touch panel or the like in some cases.

[Structure Example of Touch Sensor]

A structure example of the input device (touch sensor) will be described below with reference to drawings.

Figure 16A:
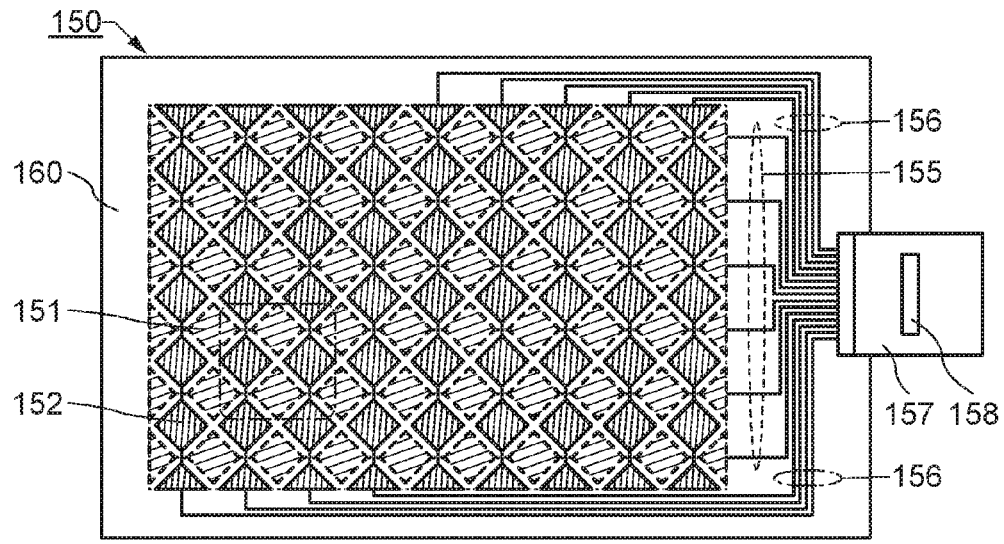
FIGS. 16A to 16D illustrate structure examples of an input device of one embodiment.

FIG. 16A is a schematic top view of an input device 150. The input device 150 includes a plurality of electrodes 151, a plurality of electrodes 152, a plurality of wirings 155, and a plurality of wirings 156 over a substrate 160. The substrate 160 is provided with a flexible printed circuit (FPC) 157 which is electrically connected to each of the plurality of electrodes 151 and the plurality of electrodes 152. FIG. 16A illustrates an example in which the FPC 157 is provided with an IC 158.

Figure 16B:
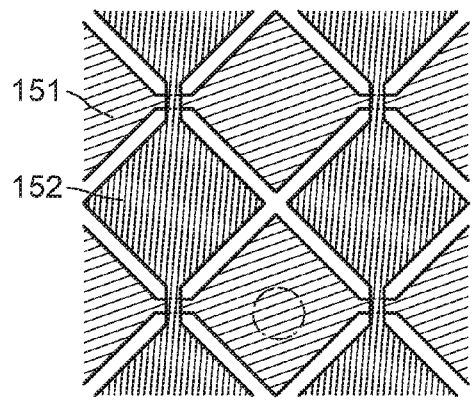

FIG. 16B is an enlarged view of a region surrounded by a dashed dotted line in FIG. 16A. The electrodes 151 are each in the form of a row of rhombic electrode patterns arranged in a lateral direction of this figure. The rhombic electrode patterns aligned in a line are electrically connected to each other. The electrodes 152 are also each in the form of a row of rhombic electrode patterns arranged in a longitudinal direction of this figure, and the rhombic electrode patterns aligned in a line are electrically connected to each other. Part of the electrode 151 and part of the electrode 152 overlap and intersect with each other. At this intersection portion, an insulator is sandwiched in order to avoid an electrical short-circuit between the electrode 151 and the electrode 152.

Figure 16C:
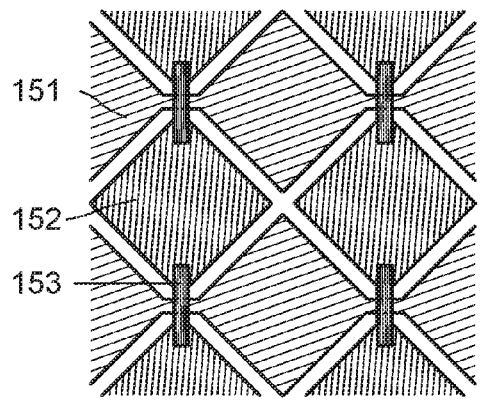

As illustrated in FIG. 16C, the rhombic electrodes 152 may be connected with bridge electrodes 153. The island-shape electrodes 152 are arranged in the longitudinal direction of the figure, and two adjacent electrodes 152 are electrically connected to each other by the bridge electrode 153. Such a structure allows the electrodes 151 and the electrodes 152 to be formed at the same time by processing the same conductive film. This can prevent variations in the thickness of these electrodes, and can prevent the resistance value and the light transmittance of each electrode from varying from place to place. Note that instead of the electrodes 152, the electrodes 151 may include the bridge electrodes 153.

Figure 16D:
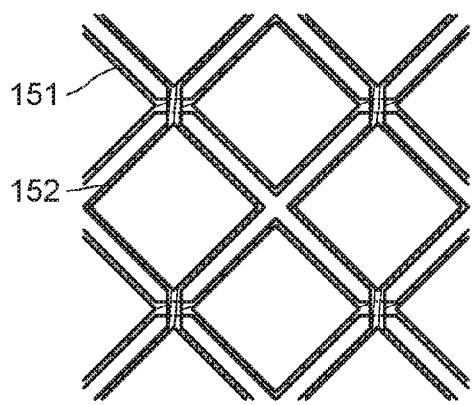

As illustrated in FIG. 16D, a design in which rhombic electrode patterns of the electrodes 151 and 152 illustrated in FIG. 16B are hollowed out and only edge portions are left may be used. At that time, when the electrodes 151 and 152 are narrow enough to be invisible to the users, the electrodes 151 and 152 can be formed using a light-blocking material such as a metal or an alloy, as will be described later. In addition, either the electrodes 151 or the electrodes 152 illustrated in FIG. 16D may include the above bridge electrodes 153.

One of the electrodes 151 is electrically connected to one of the wirings 155. One of the electrodes 152 is electrically connected to one of the wirings 156. Here, either one of the wirings 155 and 156 corresponds to a row wiring, and the other corresponds to a column wiring.

The IC 158 has a function of driving the touch sensor. A signal output from the IC 158 is supplied to either of the electrodes 151 and 152 through the wirings 155 or 156. A current (or a potential) flowing to either of the electrodes 151 and 152 is input to the IC 158 through the wirings 155 or 156.

When a touch panel is formed in such a manner that the input device 150 is stacked over a display screen of the display panel, a light-transmitting conductive material is preferably used for the electrodes 151 and 152. In the case where a light-transmitting conductive material is used for the electrodes 151 and 152 and light from the display panel is extracted through the electrodes 151 or 152, it is preferable that a conductive film containing the same conductive material be arranged between the electrodes 151 and 152 as a dummy pattern. When part of a space between the electrodes 151 and 152 is thus filled with the dummy pattern, variation in light transmittance in the input device 150 can be reduced. As a result, unevenness in luminance of light transmitted through the input device 150 can be reduced.

As the light-transmitting conductive material, a conductive oxide such as indium oxide, indium tin oxide, indium zinc oxide, zinc oxide, or zinc oxide to which gallium is added can be used. Note that a film containing graphene may be used as well. The film containing graphene can be formed, for example, by reducing a film containing graphene oxide. As a reducing method, a method with application of heat or the like can be employed.

Alternatively, a metal film or an alloy film which is thin enough to have a light-transmitting property can be used. For example, a metal such as gold, silver, platinum, magnesium, nickel, tungsten, chromium, molybdenum, iron, cobalt, copper, palladium, or titanium, or an alloy containing any of these metals can be used. Alternatively, a nitride of the metal or the alloy (e.g., titanium nitride), or the like may be used. Alternatively, a stacked film in which two or more of conductive films containing the above materials are stacked may be used.

For the electrodes 151 and 152, a conductive film that is processed to be thin enough to be invisible to the users may be used. Such a conductive film is processed into a lattice shape (a mesh shape), for example, which makes it possible to achieve both high conductivity and high visibility of the display device. It is preferable that the conductive film have a portion in which the width is greater than or equal to 30 nm and less than or equal to 100 μm, preferably greater than or equal to 50 nm and less than or equal to 50 μm, and further preferably greater than or equal to 50 nm and less than or equal to 20 μm. In particular, the conductive film preferably has a pattern width of 10 μm or less because it is hardly visible to the users.

Figure 17A:
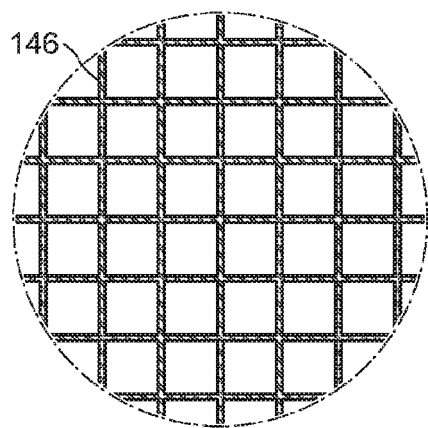
FIGS. 17A to 17D illustrate structure examples of an electrode of an input device of one embodiment.

As examples, enlarged schematic views of part of the electrodes 151 or 152 are illustrated in FIGS. 17A to 17D. FIG. 17A illustrates an example where a lattice-shape conductive film 146 is used. The conductive film 146 is preferably placed so as not to overlap with the display element included in the display device because light from the display device is not blocked. In that case, it is preferable that the direction of the lattice be the same as the direction of the display element arrangement and that the pitch of the lattice be an integer multiple of the pitch of the display element arrangement.

Figure 17B:
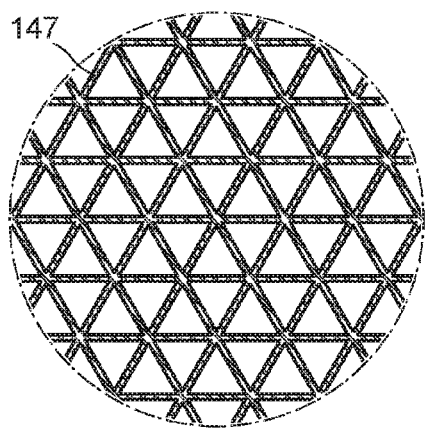

FIG. 17B illustrates an example of a lattice-shape conductive film 147, which is processed so as to be provided with triangle openings. Such a structure makes it possible to further reduce the resistance compared with the conductive film 146 illustrated in FIG. 17A.

Figure 17C:
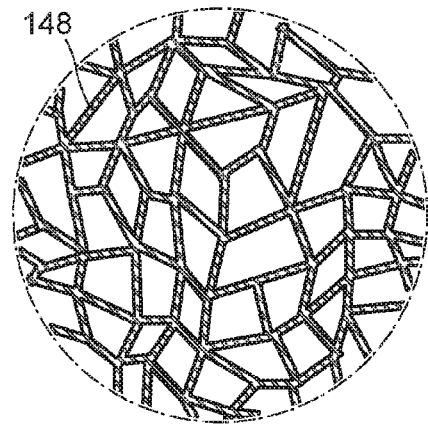

In addition, a conductive film 148, which has an irregular pattern shape, may be used as illustrated in FIG. 17C. Such a structure can prevent generation of moire when overlapping with the display portion of the display device.

Figure 17D:
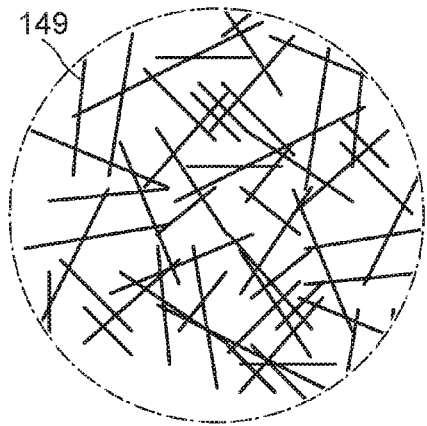

Conductive nanowires may be used for the electrodes 151 and 152. FIG. 17D illustrates an example where nanowires 149 are used. The nanowires 149 are dispersed at appropriate density so as to be in contact with the adjacent nanowires, which can form a two-dimensional network; therefore, the nanowires 149 can function as a conductive film with extremely high light-transmitting property. For example, nanowires which have a mean diameter of greater than or equal to 1 nm and less than or equal to 100 nm, preferably greater than or equal to 5 nm and less than or equal to 50 nm, and further preferably greater than or equal to 5 nm and less than or equal to 25 nm, can be used. As the nanowire 149, a metal nanowire such as an Ag nanowire, a Cu nanowire, or an Al nanowire, a carbon nanotube, or the like can be used. In the case of using an Ag nanowire, a light transmittance of 89% or more and a sheet resistance of 40 ohms per square or more and 100 ohms per square or less can be achieved.

The above is the description of structure examples of a touch sensor.

[Structure Example of Touch Panel]

As an example of the display device 10 of one embodiment of the present invention, a structure example of a touch panel will be described below with reference to drawings.

FIG. 18A is a schematic perspective view of a touch panel 100. FIG. 18B is a schematic perspective view of the structure of FIG. 18A which is developed. Note that only typical components are illustrated for simplicity. In FIG. 18B, the substrate 31 is illustrated only in dashed outline.

The touch panel 100 includes the substrate 21 and the substrate 31 provided with the input device 150, which are provided to overlap with each other. For the structure of the substrate 21, the above description of Structure example 1 or the like can be referred to.

For the structure of the input device 150, the above description of the structure example of the touch sensor can be referred to. FIGS. 18A and 18B illustrate an example in which the input device 150 includes the plurality of electrodes 151, the plurality of electrodes 152, the plurality of wirings 155, and the plurality of wirings 156.

As the input device 150, for example, a capacitive touch sensor can be used. Examples of the capacitive touch sensor include a surface capacitive touch sensor and a projected capacitive touch sensor. Examples of the projected capacitive touch sensor include a self-capacitive touch sensor and a mutual capacitive touch sensor. The use of a mutual capacitive type is preferable because multiple points can be sensed simultaneously. An example of using a projected capacitive touch sensor will be described below.

Note that one embodiment of the present invention is not limited to this example, and any of a variety of sensors capable of sensing the proximity or contact of an object to be sensed, such as a finger or a stylus, can be used as the input device 150.

In the touch panel 100 illustrated in FIGS. 18A and 18B, the input device 150 is provided on the substrate 31. The wirings 155 and 156 and the like of the input device 150 are electrically connected to the FPC 42 connected to the substrate 21 side through a connection portion 169.

With the above structure, the FPC connected to the touch panel 100 can be provided only on one substrate side (here, on the substrate 21 side). Although two or more FPCs may be attached to the touch panel 100, for the simplicity of the structure, the touch panel 100 is preferably provided with one FPC 42 which has a function of supplying signals to both the substrate 21 and the substrate 31 as illustrated in FIGS. 18A and 18B.

The connection portion 169 can include, for example, an anisotropic conductive connector. As the connector, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector, a material capable of elastic deformation or plastic deformation is preferably used. In that case, the conductive particle sometimes has a shape that is vertically crushed. This increases the contact area between the connector and a conductive layer electrically connected to the connector, thereby reducing contact resistance and suppressing the generation of problems such as disconnection.

The connector is preferably provided so as to be covered with the adhesive layer 141 (not illustrated) with which the substrates 21 and 31 are bonded. For example, the connector may be dispersed in the adhesive layer 141 before the adhesive layer 141 is cured. A structure in which the connection portion 169 is provided in a portion where the adhesive layer 141 is provided can be similarly applied not only to a structure in which the adhesive layer 141 is also provided over the display portion 32 (also referred to as a solid sealing structure) but also to, for example, a hollow sealing structure in which the adhesive layer 141 is provided in the periphery of a light-emitting device, a liquid crystal display device, or the like.

Unlike in FIGS. 1A and 1B, an IC 168 is mounted on the FPC 42 in FIGS. 18A and 18B. In that case, the IC 168 may have a function of driving the input device 150, or an IC for driving the input device 150 may be separately provided on the substrate 21, the substrate 31, the FPC 42, or the like.

[Cross-Sectional Structure Example]

Next, an example of a cross-sectional structure of the touch panel 100 will be described. FIG. 19 is a schematic cross-sectional view of the touch panel 100. FIG. 19 is different from FIG. 11 mainly in the structure between the adhesive layer 141 and the substrate 31.

Insulating layers 161, 162, 163, and 164 and the like are stacked on the surface of the substrate 31 that faces the substrate 21. A light-blocking layer 133 is provided between the insulating layers 161 and 162. The electrodes 151 and 152 and the like are provided between the insulating layers 162 and 163. The bridge electrode 153 is provided between the insulating layers 163 and 164. The coloring layer 131a, the light-blocking layer 132, and the like are provided on the surface of the insulating layer 164 that faces the adhesive layer 141.

FIG. 19 clearly illustrates an intersection of the electrodes 151 and 152. Through openings in the insulating layer 163, the bridge electrode 153 is electrically connected to the two electrodes 151 between which the electrode 152 is positioned.

The electrodes 151 and 152 overlap with the light-blocking layer 132. Also in FIG. 19, the electrode 151 does not overlap with the light-emitting element 40. In other words, the electrode 151 has a mesh shape with an opening overlapping with the light-emitting element 40. In such a structure where the electrodes 151 are not arranged on the path of light emitted from the light-emitting element 40, the electrodes 151 do not lead to luminance decrease substantially; thus, the touch panel 100 with high visibility and low power consumption can be achieved. Note that the electrode 152 can have a similar structure.

In addition, since the electrodes 151 and 152 do not overlap with the light-emitting element 40, a light-transmitting conductive material is not needed and a metal material having lower resistance than the conductive material can be used for the electrodes 151 and 152. This increases the sensitivity of the touch sensor as compared with the case where a light-transmitting conductive material is used for the electrodes 151 and 152.

FIG. 19 illustrates an example in which the light-blocking layer 133 is provided between the electrodes 151 and 152 (and the bridge electrode 153) and the substrate 31 so as to overlap with the electrodes 151 and 152. Even in the case where a metal material is used for the electrode 151 and the like, external light reflection on the electrode 151 and the like can be hindered by the light-blocking layer 133, achieving the touch panel 100 with higher visibility. Although the two light-blocking layers 132 and 133 are provided in this example, either one light-blocking layer may be provided.

The polarizing plate 130 is not necessarily provided over the substrate 31, and an object to be sensed, such as a finger or a stylus, may be in direct contact with the substrate 31. In that case, a protective layer (such as a ceramic coat) is preferably provided over the substrate 31. The protective layer can be formed using an inorganic insulating material such as silicon oxide, aluminum oxide, yttrium oxide, or yttria-stabilized zirconia (YSZ). Alternatively, tempered glass may be used for the substrate 31. Physical or chemical processing by an ion exchange method, a wind tempering method, or the like may be performed on the tempered glass, so that compressive stress is applied on the surface. In the case where the touch sensor is provided on one side of the tempered glass and the opposite side of the tempered glass is provided on, for example, the outermost surface of an electronic device for use as a touch surface, the thickness of the whole device can be decreased.

When the light-emitting element 40, the plurality of transistors, the electrodes of the touch sensor, and the like are arranged between the substrates 21 and 31 as illustrated in FIG. 19, the touch panel 100 with a reduced number of components can be achieved.

Note that the structure of the touch panel 100 is not limited to the above, and for example, the touch panel 100 may be fabricated by overlapping the substrate provided with the input device 150 with the display device 10 illustrated in FIGS. 1A and 1B and the like.

Figure 20:
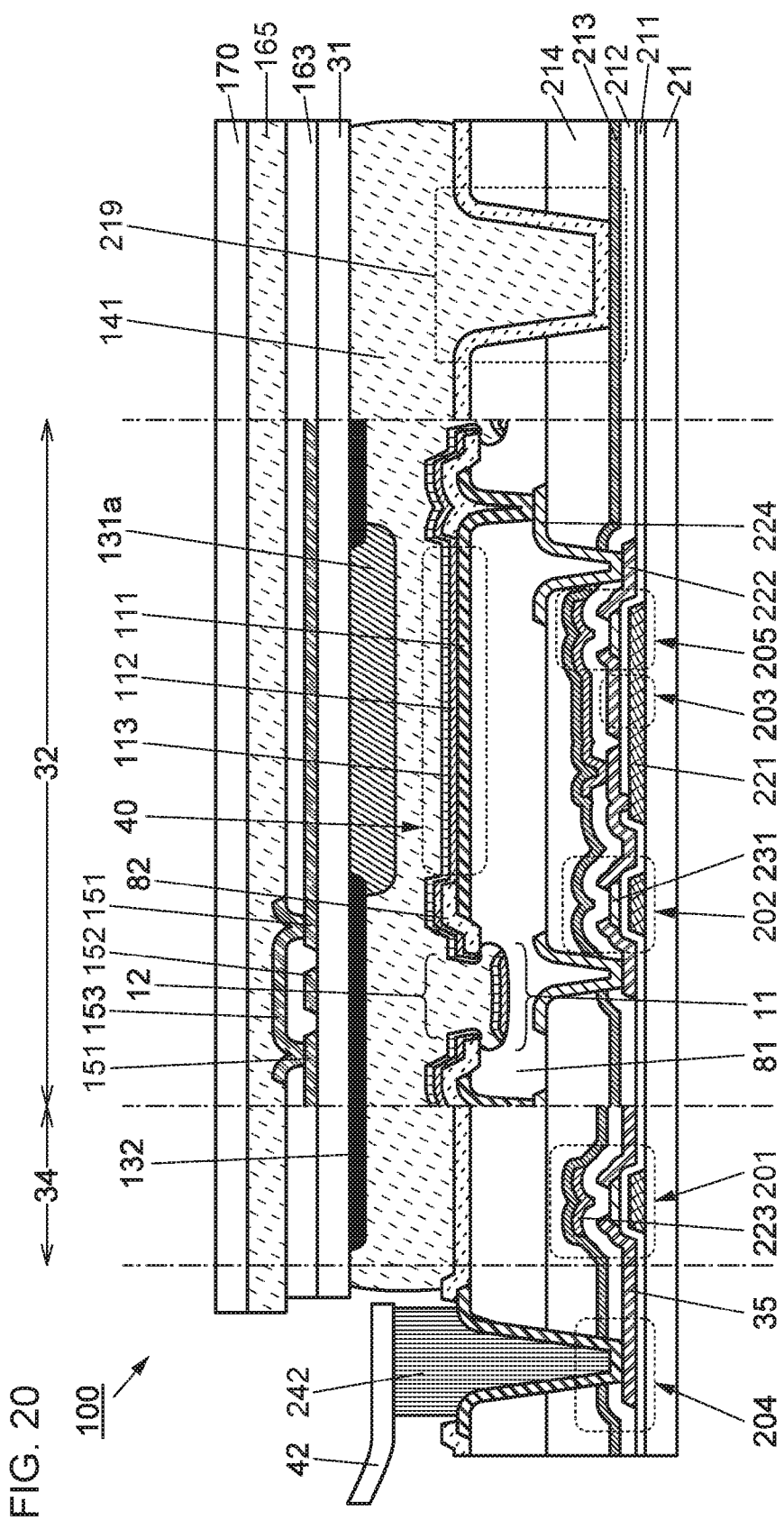
FIG. 20 illustrates a structure example of a display device of one embodiment.

FIG. 20 illustrates an example in which the electrodes 151 and 152 and the like of the touch sensor are formed on the surface of the substrate 31 that is opposite to the surface facing the substrate 21. This structure can be referred to as an on-cell touch panel.

The electrodes 151 and 152 are formed over the substrate 31 and covered with the insulating layer 163. The bridge electrode 153 is provided over the insulating layer 163.

A substrate 170 is a substrate serving as a touch surface, and for example, serves as part of a housing, protective glass, or the like of an electronic device where the touch panel 100 is incorporated. The substrates 170 and 31 are bonded with an adhesive layer 165.

FIG. 20 illustrates an example in which the electrode 151 is arranged not only in a region overlapping with the light-blocking layer 132 but also in a region overlapping with the light-emitting element 40, the coloring layer 131a, and the like. In that case, the electrode 151 can be formed using a material transmitting visible light. For example, a film containing a metal oxide, a film containing graphene, or a film that contains a metal or an alloy and is thin enough to transmit visible light can be used for the electrode 151. The same applies to the electrode 152. The bridge electrode 153 can also be formed using a material transmitting visible light; however, a material blocking visible light, such as a metal or an alloy, may also be used in the case where the bridge electrode 153 overlaps with the light-blocking layer 132 or the area of the bridge electrode 153 is extremely small.

The above is the description of the cross-sectional structure example of the touch panel 100.

[Structure Example 3]

As an example of the display device 10 of one embodiment of the present invention, a display device (display panel) that includes both a reflective liquid crystal element and a light-emitting element and can display an image both in a transmissive mode and in a reflective mode will be described below. Such a display panel can also be referred to as a transmissive OLED and reflective LC hybrid display (TR-hybrid display).

One example of such a display panel is a structure in which a liquid crystal element including an electrode that reflects visible light and a light-emitting element are stacked. In this structure, it is preferable that the electrode reflecting visible light have an opening and the opening overlap with the light-emitting element. This enables driving in the transmissive mode by which light is emitted from the light-emitting element through the opening. It is also preferable that a transistor for driving the liquid crystal element and a transistor included in the light-emitting element be positioned on the same plane. In addition, the light-emitting element and the liquid crystal element are preferably stacked with an insulating layer therebetween.

Such a display panel can be driven with extremely low power consumption by displaying an image in the reflective mode in a place with bright external light such as an outdoor space. At night or in a place with weak external light such an indoor space, the display panel can display an image with an optimal luminance by displaying the image in the transmissive mode. Furthermore, by displaying an image in both the transmissive and reflective modes, the display panel can display the image with less power consumption and a higher contrast than a conventional display panel even in a place with extremely bright external light.

[Structure Example]

FIG. 21A is a block diagram illustrating an example of the structure of a display device 200. The display device 200 includes a plurality of pixels 210 which are arranged in a matrix in the display portion 32. The display device 200 also includes a circuit GD and a circuit SD. The display device 200 includes the plurality of pixels 210 arranged in a direction R, and a plurality of wirings G1, a plurality of wirings G2, a plurality of wirings ANO, and a plurality of wirings CSCOM which are electrically connected to the circuit GD. The display device 200 includes the plurality of pixels 210 arranged in a direction C, and a plurality of wirings 51 and a plurality of wirings S2 which are electrically connected to the circuit SD.

The pixel 210 includes a reflective liquid crystal element and a light-emitting element. In the pixel 210, the liquid crystal element and the light emitting element partly overlap with each other.

FIG. 21B1 illustrates a structure example of a conductive layer 191 included in the pixel 210. The conductive layer 191 serves as a reflective electrode of the liquid crystal element in the pixel 210. The conductive layer 191 includes an opening 251.

In FIG. 21B1, the light-emitting element 40 in a region overlapping with the conductive layer 191 is denoted by a dashed line. The light-emitting element 40 overlaps with the opening 251 included in the conductive layer 191. Thus, light from the light-emitting element 40 is emitted to a display surface side through the opening 251.

In FIG. 21B1, the pixels 210 adjacent in the direction R correspond to different colors. As illustrated in FIG. 21B1, the openings 251 are preferably provided in different positions in the conductive layers 191 so as not to be aligned in the two pixels adjacent to each other in the direction R. This allows the two light-emitting elements 40 to be apart from each other, thereby preventing light emitted from the light-emitting element 40 from entering a coloring layer in the adjacent pixel 210 (such a phenomenon is also referred to as crosstalk). Furthermore, since the two adjacent light-emitting elements 40 can be arranged apart from each other, the display device 200 can have high resolution even when EL layers of the light-emitting elements 40 are separately formed with a shadow mask or the like.

Alternatively, the pixels 210 may be arranged as illustrated in FIG. 21B2.

If the ratio of the total area of the opening 251 to the total area of the conductive layer 191 in the pixel 210 except for the opening is too large, display performed using the liquid crystal element is dark. If the ratio of the total area of the opening 251 to the total area except for the opening is too small, display performed using the light-emitting element 40 is dark.

If the area of the opening 251 in the conductive layer 191 serving as a reflective electrode is too small, light emitted from the light-emitting element 40 is not efficiently extracted for display.

The opening 251 may have a polygonal shape, a quadrangular shape, an elliptical shape, a circular shape, a cross-like shape, a stripe shape, a slit-like shape, or a checkered pattern, for example. The opening 251 may be close to the adjacent pixel. Preferably, the opening 251 is provided close to another pixel emitting light of the same color, in which case crosstalk can be suppressed.

[Circuit Structure Example]

Figure 22:
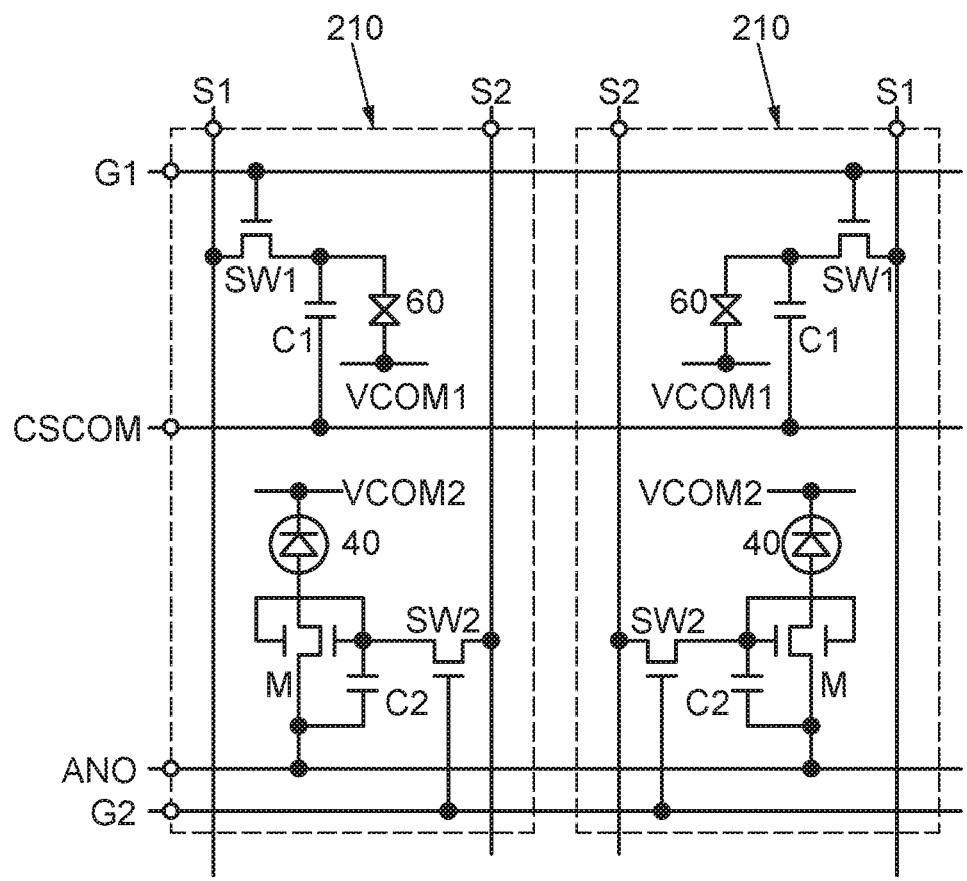
FIG. 22 illustrates a structure example of a display device of one embodiment.

FIG. 22 is a circuit diagram illustrating a structure example of the pixel 210. FIG. 22 illustrates two adjacent pixels 210.

The pixel 210 includes a switch SW1, a capacitor C1, the liquid crystal element 60, a switch SW2, a transistor M, a capacitor C2, the light-emitting element 40, and the like. The pixel 210 is electrically connected to the wiring G1, the wiring G2, the wiring ANO, the wiring CSCOM, the wiring S1, and the wiring S2. FIG. 22 also illustrates a wiring VCOM1 electrically connected to the liquid crystal element 60 and a wiring VCOM2 electrically connected to the light-emitting element 40.

FIG. 22 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 60. The other electrode of the capacitor C1 is connected to the wiring CSCOM. The other electrode of the liquid crystal element 60 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 40. The other electrode of the light-emitting element 40 is connected to the wiring VCOM2.

FIG. 22 illustrates an example in which the transistor M includes two gates between which a semiconductor where a channel region is formed is provided and which are connected to each other. This structure can increase the amount of current flowing through the transistor M.

The wiring G1 can be supplied with a signal for changing the on/off state of the transistor SW1. A predetermined potential can be supplied to the wiring VCOM1. The wiring S1 can be supplied with a signal for changing the orientation of liquid crystals of the liquid crystal element 60. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 40 emit light. The wiring S2 can be supplied with a signal for changing the conduction state of the transistor M.

In the pixel 210 of FIG. 22, for example, an image can be displayed in the reflective mode by driving the pixel with the signals supplied to the wiring G1 and the wiring S1 and utilizing the optical modulation of the liquid crystal element 60. In the case where an image is displayed in the transmissive mode, the pixel is driven with the signals supplied to the wiring G2 and the wiring S2 and the light-emitting element 40 emits light. In the case where both modes are performed for display at the same time, the pixel can be driven with the signals to the wiring G1, the wiring G2, the wiring S1, and the wiring S2, and the liquid crystal element 60 and the light-emitting element 40 can be used for display.

[Cross-Sectional Structure Example of Display Device]

FIG. 23 is a schematic cross-sectional view of the display device 200.

The display device 200 includes an insulating layer 220 between the substrates 21 and 31. The display device 200 also includes the light-emitting element 40, the transistor 205, a transistor 206, a coloring layer 134, and the like between the substrate 21 and the insulating layer 220. Furthermore, the display device 200 includes the liquid crystal element 60, a coloring layer 131, a structure body 244, and the like between the substrate 31 and the insulating layer 220.

The substrate 21 and the insulating layer 82 or the like are bonded with the adhesive layer 141. The substrate 31 and the insulating layer 220 are bonded with an adhesive layer 142 with which a liquid crystal is sealed.

The liquid crystal element 60 is a reflective liquid crystal element. The liquid crystal element 60 has a stacked structure of a conductive layer 192, a liquid crystal 193, and a conductive layer 194. The conductive layer 191 is provided in contact with the surface of the conductive layer 192 that faces the substrate 21. The conductive layer 191 serves as a reflective electrode of the liquid crystal element 60. The conductive layer 191 includes the opening 251. The conductive layer 192 contains a material transmitting visible light.

The light-emitting element 40 is a bottom-emission light-emitting element. The light-emitting element 40 has a structure in which the conductive layer 111, the EL layer 112, and the conductive layer 113 are stacked in this order from the side of the insulating layer 220. The conductive layer 113 contains a material reflecting visible light, and the conductive layer 111 contains a material transmitting visible light. Light is emitted from the light-emitting element 40 to the substrate 31 side through the coloring layer 134, the insulating layer 220, the opening 251, the conductive layer 192, and the like.

The opening 11 and the opening 12 are provided in the insulating layer 81 and the insulating layer 82. In a top view, the periphery of the opening 12 is positioned on an inner side than the periphery of the opening 11. The opening 11 and the opening 12 are integrated and form a wedge-shaped opening in a cross-sectional view. This opening is filled with the adhesive layer 141.

One of the source and the drain of the transistor 205 is electrically connected to the conductive layer 111 of the light-emitting element 40. The transistor 205 corresponds to, for example, the transistor M in FIG. 22.

One of a source and a drain of the transistor 206 is electrically connected to the conductive layers 191 and 192 through a terminal portion 207. That is, the terminal portion 207 electrically connects the conductive layers provided on both surfaces of the insulating layer 220 through openings in the insulating layer 220 in the display portion 32. The transistor 206 corresponds to, for example, the switch SW1 in FIG. 22.

The terminal portion 204 is provided in a region where the substrates 21 and 31 do not overlap with each other. Similarly to the terminal portion 207, the terminal portion 204 electrically connects the conductive layers provided on both surfaces of the insulating layer 220. On the top surface of the terminal portion 204, a conductive layer obtained by processing the same conductive film as the conductive layer 192 is exposed. Thus, the terminal portion 204 and the FPC 42 can be electrically connected to each other through the connection layer 242.

The coloring layer 131 and the light-blocking layer 132 are provided on the surface of the substrate 31 that faces the substrate 21. In addition, an insulating layer 195 is provided to cover the coloring layer 131 and the light-blocking layer 132. The insulating layer 195 serves as an overcoat. The conductive layer 194 is provided on the surface of the insulating layer 195 that faces the substrate 21.

A connection portion 252 is provided in part of a region where the adhesive layer 142 is provided. In the connection portion 252, the conductive layer obtained by processing the same conductive film as the conductive layer 192 and part of the conductive layer 194 are electrically connected with a connector 243. Accordingly, a signal or a potential input from the FPC 42 connected to the substrate 21 side can be supplied to the conductive layer 194 formed on the substrate 31 side through the connection portion 252.

The structure body 244 is provided between the conductive layers 192 and 194. The structure body 244 has a function of maintaining a cell gap of the liquid crystal element 60.

Although not illustrated here, an alignment film for adjusting the alignment of the liquid crystal 193 may be provided between the conductive layer 194 and the liquid crystal 193 and between the conductive layer 192 and the liquid crystal 193. In that case, part of the alignment film may be provided to cover the surface of the structure body 244.

An example of the method for manufacturing the display device 200 will be described. For example, the conductive layer 192, the conductive layer 191, and the insulating layer 220 are formed in order over a supporting substrate provided with a separation layer, and the transistor 205, the light-emitting element 40, and the like are formed. Then, a surface of the substrate 21 on which elements are formed and a surface of the supporting substrate on which elements are formed are bonded with the adhesive layer 141. After that, separation is performed at the interface between the separation layer and each of the insulating layer 220 and the conductive layer 192, whereby the supporting substrate and the separation layer are removed. Separately, the coloring layer 131, the light-blocking layer 132, the structure body 244, and the like are formed over the substrate 31 in advance. Then, the liquid crystal 193 is dropped onto one of the surfaces of the substrate 21 and 31 on which elements are formed and the surfaces of the substrates 21 and 31 on which elements are formed are bonded with the adhesive layer 142, whereby the display device 200 can be manufactured.

A material for the separation layer can be selected such that separation at the interface with the insulating layer 220 and the conductive layer 192 occurs. In particular, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating layer 220 over the separation layer. The use of the high-melting-point metal material for the separation layer can increase the formation temperature of a layer formed in a later step, which reduces impurity concentration in the layer and achieves the highly reliable display device 200.

As the conductive layer 192, a metal oxide, a metal nitride, or an oxide such as an oxide semiconductor whose resistance is reduced is preferably used. In the case of using an oxide semiconductor, a material in which at least one of the concentrations of hydrogen, boron, phosphorus, nitrogen, and other impurities and the number of oxygen vacancies is made to be higher than those in a semiconductor layer of a transistor is used for the conductive layer 192.

The above is the description of Structure example 3.

At least part of this embodiment can be implemented in combination with any of the other embodiments described in this specification as appropriate.

Embodiment 2

Described in this embodiment is an example of a method for driving an input device (touch sensor) which can be applied to the display device 10 or 200 of one embodiment of the present invention.

Figure 24A:
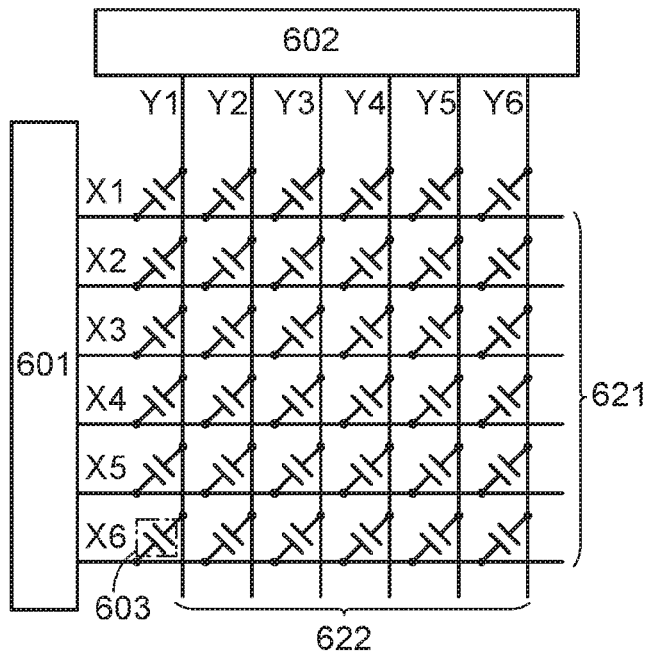
FIGS. 24A and 24B illustrate an example of a method for driving an input device of one embodiment.

FIG. 24A is a block diagram illustrating the structure of a mutual capacitive touch sensor. FIG. 24A illustrates a pulse voltage output circuit 601 and a current sensing circuit 602. Note that in FIG. 24A, six wirings X1 to X6 represent electrodes 621 to which a pulse voltage is applied, and six wirings Y1 to Y6 represent electrodes 622 that sense changes in current. The number of such electrodes is not limited to those illustrated in this example. FIG. 24A also illustrates a capacitor 603 that is formed with the electrodes 621 and 622 overlapping with each other or being provided close to each other. Note that functional replacement between the electrodes 621 and 622 is possible.

For example, the electrode 151 described in Embodiment 1 corresponds to one of the electrodes 621 and 622, and the electrode 152 described in Embodiment 1 corresponds to the other of the electrodes 621 and 622.

The pulse voltage output circuit 601 is, for example, a circuit for sequentially inputting a pulse voltage to the wirings X1 to X6. The current sensing circuit 602 is, for example, a circuit for sensing current flowing through each of the wirings Y1 to Y6.

By application of a pulse voltage to one of the wirings X1 to X6, an electric field is generated between the electrodes 621 and 622 of the capacitor 603, and current flows through the electrode 622. Part of the electric field generated between the electrodes is blocked when an object such a finger or a stylus contacts or approaches the device, so that the electric field intensity between the electrodes is changed. Consequently, the amount of current flowing through the electrode 622 is changed.

For example, in the case where there is no approach or no contact of an object, the amount of current flowing in each of the wirings Y1 to Y6 depends on the amount of capacitance of the capacitor 603. In the case where part of an electric field is blocked by the approach or contact of an object, the amount of current flowing in the wirings Y1 to Y6 decreases, and the decrease is sensed by the current sensing circuit 602. The touch sensor illustrated in FIG. 24A can sense the approach or contact of an object by utilizing this change.

Sensing by the current sensing circuit 602 may be performed using an integral value (time integral value) of current flowing in a wiring. In that case, sensing may be performed with an integrator circuit, for example. Alternatively, the peak current value may be sensed. In that case, for example, current may be converted into voltage, and the peak voltage value may be sensed.

Figure 24B:
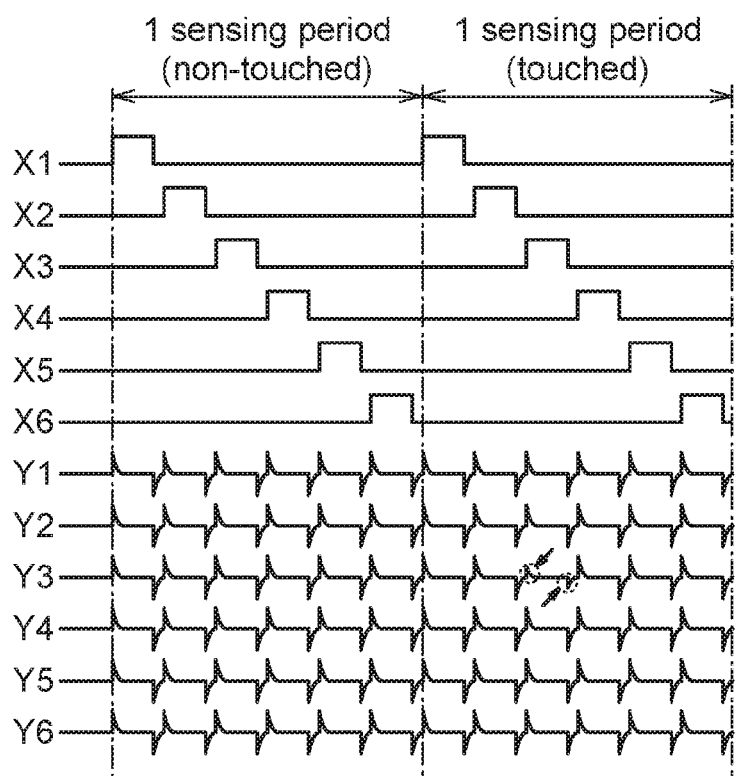

FIG. 24B is an example of a timing chart illustrating input and output waveforms in the mutual capacitive touch sensor in FIG. 24A. In FIG. 24B, sensing in each row and each column is performed in one sensing period. FIG. 24B shows a period when the contact or approach of an object is not sensed (when the touch sensor is not touched) and a period when the contact or approach of an object is sensed (when the touch sensor is touched). Here, the wirings Y1 to Y6 each show a waveform of a voltage corresponding to the amount of current to be sensed.

As shown in FIG. 24B, the wirings X1 to X6 are sequentially supplied with a pulse voltage. Accordingly, current flows in the wirings Y1 to Y6. When the touch sensor is not touched, substantially the same current flows in the wirings Y1 to Y6 in accordance with pulsed voltages applied to the wirings X1 to X6; thus, the wirings Y1 to Y6 have similar output waveforms. Meanwhile, when the touch sensor is touched, current flowing in a wiring in a position which an object contacts or approaches among the wirings Y1 to Y6 is reduced; thus, the output waveforms are changed as shown in FIG. 24B.

FIG. 24B illustrates an example in which an object contacts or approaches the intersection of the wiring X3 and the wiring Y3 or the vicinity thereof.

A change in current due to block of an electric field generated between a pair of electrodes is sensed in this manner in a mutual capacitive touch sensor, so that positional information of an object can be obtained. When the detection sensitivity is high, the coordinates of the object can be determined even when the object is far from a detection surface (e.g., a surface of the touch panel).

By driving a touch panel by a method in which a display period of a display portion and a sensing period of a touch sensor do not overlap with each other, the detection sensitivity of the touch sensor can be increased. For example, a display period and a sensing period may be separately provided in one display frame period. In that case, two or more sensing periods are preferably provided in one frame period. When the frequency of sensing is increased, the detection sensitivity can be increased.

It is preferable that, as an example, the pulse voltage output circuit 601 and the current sensing circuit 602 be formed in an IC. For example, the IC is preferably mounted on a touch panel or a substrate in a housing of an electronic device. In the case where the touch panel has flexibility, parasitic capacitance might be increased in a bent portion of the touch panel, and the influence of noise might be increased. In view of this, it is preferable to use an IC to which a driving method less influenced by noise is applied. For example, it is preferable to use an IC to which a driving method capable of increasing a signal-noise ratio (S/N ratio) is applied.

At least part of this embodiment can be implemented in combination with any of the other embodiments described in this specification as appropriate.

Embodiment 3

In this embodiment, an example of a transistor that can be used as the transistors described in the above embodiments will be described with reference to drawings.

The display device 10 or 200 of one embodiment of the present invention can be fabricated by using a transistor with any of various modes, such as a bottom-gate transistor or a top-gate transistor. Therefore, a material for a semiconductor layer or the structure of a transistor can be easily changed in accordance with the existing production line.

[Bottom-Gate Transistor]

FIG. 25A1 is a cross-sectional view of a transistor 810 that is a channel-protective transistor, which is a type of bottom-gate transistor. In FIG. 25A1, the transistor 810 is formed over a substrate 771. The transistor 810 includes an electrode 746 over the substrate 771 with an insulating layer 772 provided therebetween. The transistor 810 includes a semiconductor layer 742 over the electrode 746 with an insulating layer 726 provided therebetween. The electrode 746 can serve as a gate electrode. The insulating layer 726 can serve as a gate insulating layer.

The transistor 810 includes an insulating layer 741 over a channel formation region in the semiconductor layer 742. The transistor 810 includes an electrode 744a and an electrode 744b which are partly in contact with the semiconductor layer 742 and over the insulating layer 726. The electrode 744a can serve as one of a source electrode and a drain electrode. The electrode 744b can serve as the other of the source electrode and the drain electrode. Part of the electrode 744a and part of the electrode 744b are formed over the insulating layer 741.

The insulating layer 741 can serve a channel protective layer. With the insulating layer 741 provided over the channel formation region, the semiconductor layer 742 can be prevented from being exposed at the time of forming the electrodes 744a and 744b. Thus, the channel formation region in the semiconductor layer 742 can be prevented from being etched at the time of forming the electrodes 744a and 744b. According to one embodiment of the present invention, a transistor with favorable electrical characteristics can be provided.

The transistor 810 includes an insulating layer 728 over the electrode 744a, the electrode 744b, and the insulating layer 741 and further includes an insulating layer 729 over the insulating layer 728.

For example, the insulating layer 772 can be formed using a material and a method similar to those of insulating layers 173 and 220. Note that the insulating layer 772 may be formed of a stack of insulating layers. For example, the semiconductor layer 742 can be formed using a material and a method similar to those of the semiconductor layer 231. Note that the semiconductor layer 742 may be formed of a stack of semiconductor layers. For example, the electrode 746 can be formed using a material and a method similar to those of the conductive layer 221. Note that the electrode 746 may be formed of a stack of conductive layers. The insulating layer 726 can be formed using a material and a method similar to those of the insulating layer 211. Note that the insulating layer 726 may be formed of a stack of insulating layers. For example, the electrodes 744a and 744b can be formed using a material and a method similar to those of the wiring 35 or the conductive layer 222. Note that the electrodes 744a and 744b may be formed of a stack of conductive layers. For example, the insulating layer 741 can be formed using a material and a method similar to those of the insulating layer 726. Note that the insulating layer 741 may be formed of a stack of insulating layers. For example, the insulating layer 728 can be formed using a material and a method similar to those of the insulating layer 212. Note that the insulating layer 728 may be formed of a stack of insulating layers. For example, the insulating layer 729 can be formed using a material and a method similar to those of the insulating layer 213. Note that the insulating layer 729 may be formed of a stack of insulating layers.

The electrode, the semiconductor layer, the insulating layer, and the like used in the transistor disclosed in this embodiment can be formed using a material and a method disclosed in any of the other embodiments.

In the case where an oxide semiconductor is used for the semiconductor layer 742, a material capable of removing oxygen from part of the semiconductor layer 742 to generate oxygen vacancies is preferably used for regions of the electrodes 744a and 744b that are in contact with at least the semiconductor layer 742. The carrier concentration in the regions of the semiconductor layer 742 where oxygen vacancies are generated is increased, so that the regions become n-type regions ($n^+$ layers). Accordingly, the regions can serve as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce the contact resistance between the semiconductor layer 742 and each of the electrodes 744a and 744b. Accordingly, the electrical characteristics of the transistor, such as the field-effect mobility and the threshold voltage, can be favorable.

In the case where a semiconductor such as silicon is used for the semiconductor layer 742, a layer that serves as an n-type semiconductor or a p-type semiconductor is preferably provided between the semiconductor layer 742 and the electrode 744a and between the semiconductor layer 742 and the electrode 744b. The layer that serves as an n-type semiconductor or a p-type semiconductor can serve as the source region or the drain region in the transistor.

The insulating layer 729 is preferably formed using a material that can prevent or reduce entry of impurities into the transistor from the outside. The insulating layer 729 is not necessarily formed.

When an oxide semiconductor is used for the semiconductor layer 742, heat treatment may be performed before and/or after the insulating layer 729 is formed. The heat treatment can fill oxygen vacancies in the semiconductor layer 742 by diffusing oxygen contained in the insulating layer 729 or other insulating layers into the semiconductor layer 742. Alternatively, the insulating layer 729 may be formed while the heat treatment is performed, so that oxygen vacancies in the semiconductor layer 742 can be filled.

Note that a CVD method can be generally classified into a plasma enhanced CVD (PECVD) method using plasma, a thermal CVD (TCVD) method using heat, and the like. A CVD method can be further classified into a metal CVD (MCVD) method, a metal organic CVD (MOCVD) method, and the like according to a source gas to be used.

Furthermore, an evaporation method can be generally classified into a resistance heating evaporation method, an electron beam evaporation method, a molecular beam epitaxy (MBE) method, a pulsed laser deposition (PLD) method, an ion beam assisted deposition (IBAD) method, an atomic layer deposition (ALD) method, and the like.

By using a PECVD method, a high-quality film can be formed at a relatively low temperature. By using a deposition method that does not use plasma for deposition, such as an MOCVD method or an evaporation method, a film with few defects can be formed because damage is not easily caused on a surface on which the film is deposited.

A sputtering method is generally classified into a DC sputtering method, a magnetron sputtering method, an RF sputtering method, an ion beam sputtering method, an electron cyclotron resonance (ECR) sputtering method, a facing-target sputtering method, and the like.

In the facing-target sputtering method, plasma is confined between targets; thus, plasma damage to a substrate can be reduced. Furthermore, step coverage can be improved because the incident angle of a sputtered particle to a substrate can be made smaller depending on the inclination of a target.

A transistor 811 illustrated in FIG. 25A2 is different from the transistor 810 in that an electrode 723 that can serve as a back gate electrode is provided over the insulating layer 729. The electrode 723 can be formed using a material and a method similar to those of the electrode 746.

In general, the back gate electrode is formed using a conductive layer and positioned so that a channel formation region of a semiconductor layer is positioned between the gate electrode and the back gate electrode. Thus, the back gate electrode can function in a manner similar to that of the gate electrode. The potential of the back gate electrode may be the same as that of the gate electrode or may be a ground (GND) potential or a predetermined potential. By changing the potential of the back gate electrode independently of the potential of the gate electrode, the threshold voltage of the transistor can be changed.

The electrode 746 and the electrode 723 can each serve as a gate electrode. Thus, the insulating layers 726, 728, and 729 can each serve as a gate insulating layer. The electrode 723 may also be provided between the insulating layers 728 and 729.

In the case where one of the electrodes 746 and 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. Alternatively, one of the electrodes 746 and 723 may be referred to as a "first gate electrode", and the other may be referred to as a "second gate electrode".

By providing the electrodes 746 and 723 with the semiconductor layer 742 provided therebetween and setting the potentials of the electrodes 746 and 723 to be the same, a region of the semiconductor layer 742 through which carriers flow is enlarged in the film thickness direction; thus, the number of transferred carriers is increased. As a result, the on-state current and field-effect mobility of the transistor 811 are increased.

Therefore, the transistor 811 has a high on-state current for its area. That is, the area of the transistor 811 can be small for a required on-state current. According to one embodiment of the present invention, the area occupied by a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel formation region is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrodes 746 and 723 each have a function of blocking an electric field generated outside, electric charge of charged particles and the like generated on the insulating layer 772 side or above the electrode 723 do not influence the channel formation region in the semiconductor layer 742. Thus, degradation by a stress test (e.g., a negative gate bias temperature (−GBT) stress test in which a negative potential is applied to a gate) can be reduced. Furthermore, a change in gate voltage (rising voltage) at which on-state current starts flowing depending on drain voltage can be reduced. Note that this effect is obtained when the electrodes 746 and 723 have the same potential or different potentials.

The BT stress test is one kind of acceleration test and can evaluate, in a short time, a change by long-term use (i.e., a change over time) in characteristics of a transistor. In particular, the amount of change in the threshold voltage of a transistor before and after the BT stress test is an important indicator when examining the reliability of the transistor. As the change in threshold voltage is smaller, the transistor has higher reliability.

By providing the electrodes 746 and 723 and setting the potentials of the electrodes 746 and 723 to be the same, the amount of change in threshold voltage of the transistor is reduced. Accordingly, variations in electrical characteristics among a plurality of transistors are also reduced.

A transistor including a back gate electrode has a smaller change in threshold voltage before and after a positive GBT stress test, in which a positive potential is applied to a gate, than a transistor including no back gate electrode.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with high reliability can be provided. Moreover, a semiconductor device with high reliability can be provided.

FIG. 25B1 is a cross-sectional view of a channel-protective transistor 820 that is a type of bottom-gate transistor. The transistor 820 has substantially the same structure as the transistor 810 but is different from the transistor 810 in that the insulating layer 741 covers an end portion of the semiconductor layer 742. The semiconductor layer 742 is electrically connected to the electrode 744a through an opening formed by selectively removing part of the insulating layer 741 which overlaps with the semiconductor layer 742. The semiconductor layer 742 is electrically connected to the electrode 744b through another opening formed by selectively removing part of the insulating layer 741 which overlaps with the semiconductor layer 742. A region of the insulating layer 741 which overlaps with the channel formation region can serve as a channel protective layer.

A transistor 821 illustrated in FIG. 25B2 is different from the transistor 820 in that the electrode 723 that can serve as a back gate electrode is provided over the insulating layer 729.

With the insulating layer 741, the semiconductor layer 742 can be prevented from being exposed at the time of forming the electrodes 744a and 744b. Thus, the channel formation region in the semiconductor layer 742 can be prevented from being etched at the time of forming the electrodes 744a and 744b.

The length between the electrode 744a and the electrode 746 and the length between the electrode 744b and the electrode 746 in the transistors 820 and 821 are larger than those in the transistors 810 and 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

A transistor 825 illustrated in FIG. 25C1 is a channel-etched transistor that is a type of bottom-gate transistor. In the transistor 825, the electrodes 744a and 744b are formed without providing the insulating layer 741. Thus, part of the semiconductor layer 742 that is exposed at the time of forming the electrodes 744a and 744b is etched in some cases. However, since the insulating layer 741 is not provided, the productivity of the transistor can be increased.

A transistor 826 illustrated in FIG. 25C2 is different from the transistor 825 in that the electrode 723 which can serve as a back gate electrode is provided over the insulating layer 729.

[Top-Gate Transistor]

FIG. 26A1 is a cross-sectional view of a transistor 830 that is a type of top-gate transistor. The transistor 830 includes the semiconductor layer 742 over the insulating layer 772, the electrodes 744a and 744b that are over the semiconductor layer 742 and the insulating layer 772 and in contact with part of the semiconductor layer 742, the insulating layer 726 over the semiconductor layer 742 and the electrodes 744a and 744b, and the electrode 746 over the insulating layer 726.

Since the electrode 746 overlaps with neither the electrode 744a nor the electrode 744b in the transistor 830, the parasitic capacitance generated between the electrodes 746 and 744a and the parasitic capacitance generated between the electrodes 746 and 744b can be reduced. After the formation of the electrode 746, an impurity 755 is introduced into the semiconductor layer 742 using the electrode 746 as a mask, so that an impurity region can be formed in the semiconductor layer 742 in a self-aligned manner (see FIG. 26A3). According to one embodiment of the present invention, a transistor with favorable electrical characteristics can be provided.

The introduction of the impurity 755 can be performed with an ion implantation apparatus, an ion doping apparatus, or a plasma treatment apparatus.

As the impurity 755, for example, at least one kind of element of Group 13 elements and Group 15 elements can be used. In the case where an oxide semiconductor is used for the semiconductor layer 742, it is possible to use at least one kind of element of a rare gas, hydrogen, and nitrogen as the impurity 755.

A transistor 831 illustrated in FIG. 26A2 is different from the transistor 830 in that the electrode 723 and the insulating layer 727 are included. The transistor 831 includes the electrode 723 formed over the insulating layer 772 and the insulating layer 727 formed over the electrode 723. The electrode 723 can serve as a back gate electrode. Thus, the insulating layer 727 can serve as a gate insulating layer. The insulating layer 727 can be formed using a material and a method similar to those of the insulating layer 726.

Like the transistor 811, the transistor 831 has a high on-state current for its area. That is, the area of the transistor 831 can be small for a required on-state current. According to one embodiment of the present invention, the area occupied by a transistor can be reduced. Therefore, according to one embodiment of the present invention, a semiconductor device having a high degree of integration can be provided.

A transistor 840 illustrated in FIG. 26B1 is a type of top-gate transistor. The transistor 840 is different from the transistor 830 in that the semiconductor layer 742 is formed after the formation of the electrodes 744a and 744b. A transistor 841 illustrated in FIG. 26B2 is different from the transistor 840 in that the electrode 723 and the insulating layer 727 are included. In the transistors 840 and 841, part of the semiconductor layer 742 is formed over the electrode 744a and another part of the semiconductor layer 742 is formed over the electrode 744b.

Like the transistor 811, the transistor 841 has a high on-state current for its area. That is, the area of the transistor 841 can be small for a required on-state current. According to one embodiment of the present invention, the area occupied by a transistor can be reduced. Therefore, according to one embodiment of the present invention, a semiconductor device having a high degree of integration can be provided.

A transistor 842 illustrated in FIG. 27A1 is a type of top-gate transistor. The transistor 842 is different from the transistor 830 or 840 in that the electrodes 744a and 744b are formed after the formation of the insulating layer 729. The electrodes 744a and 744b are electrically connected to the semiconductor layer 742 through openings formed in the insulating layers 728 and 729.

Part of the insulating layer 726 that does not overlap with the electrode 746 is removed, and the impurity 755 is introduced into the semiconductor layer 742 using the electrode 746 and the insulating layer 726 that is left as a mask, so that an impurity region can be formed in the semiconductor layer 742 in a self-aligned manner (see FIG. 27A3). The transistor 842 includes a region where the insulating layer 726 extends beyond an end portion of the electrode 746. The semiconductor layer 742 in a region into which the impurity 755 is introduced through the insulating layer 726 has a lower impurity concentration than the semiconductor layer 742 in a region into which the impurity 755 is introduced without through the insulating layer 726. Thus, a lightly doped drain (LDD) region is formed in a region of the semiconductor layer 742 which does not overlap with the electrode 746.

A transistor 843 illustrated in FIG. 27A2 is different from the transistor 842 in that the electrode 723 is included. The transistor 843 includes the electrode 723 that is formed over the substrate 771 and overlaps with the semiconductor layer 742 with the insulating layer 772 provided therebetween. The electrode 723 can serve as a back gate electrode.

As in a transistor 844 illustrated in FIG. 27B1 and a transistor 845 illustrated in FIG. 27B2, the insulating layer 726 in a region that does not overlap with the electrode 746 may be completely removed. Alternatively, as in a transistor 846 illustrated in FIG. 27C1 and a transistor 847 illustrated in FIG. 27C2, the insulating layer 726 may be left.

In the transistors 842 to 847, after the formation of the electrode 746, the impurity 755 is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

At least part of this embodiment can be implemented in combination with any of the other embodiments described in this specification as appropriate.

Embodiment 4

In this embodiment, a display module and electronic devices that include the display device 10 or 200 of embodiments of the present invention will be described with reference to drawings.

Figure 28:
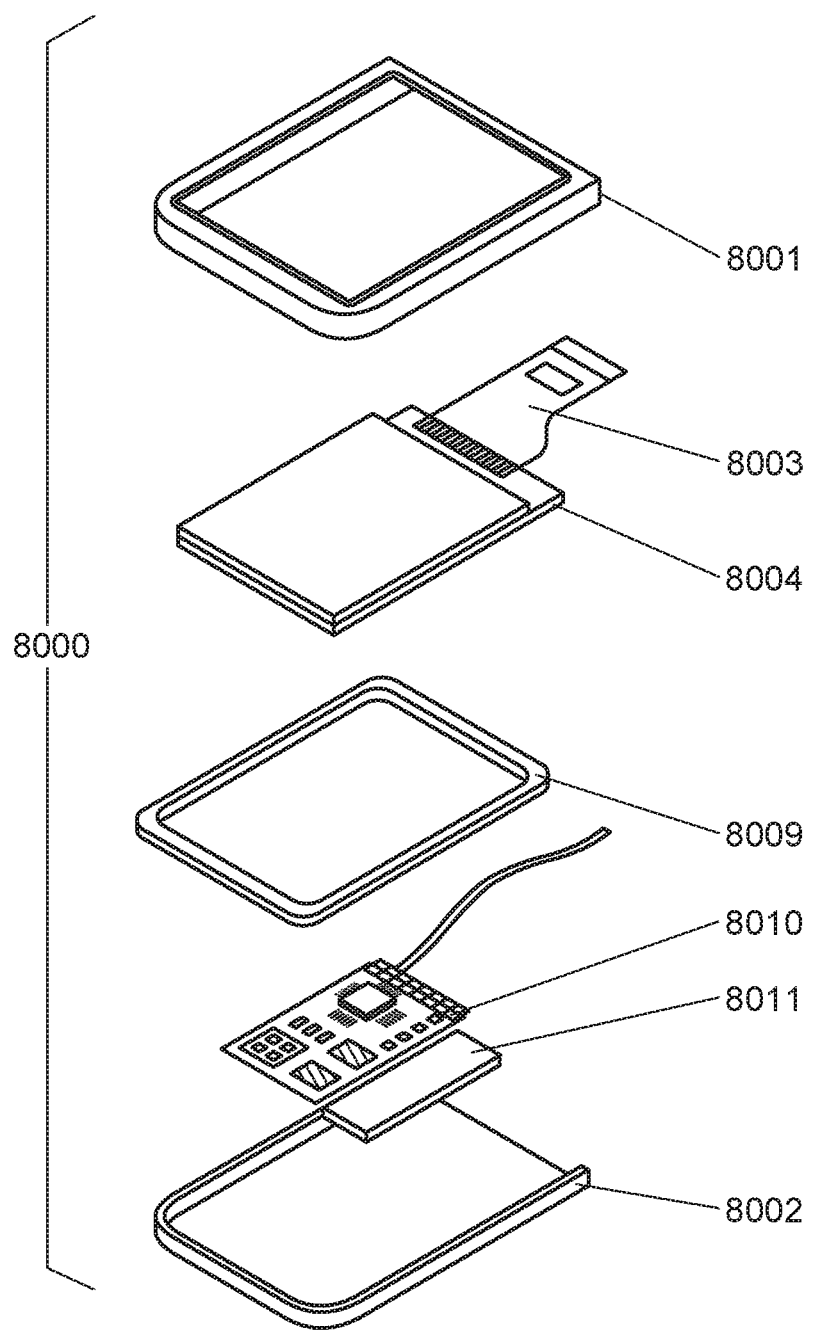
FIG. 28 illustrates a display module of one embodiment.

In a display module 8000 illustrated in FIG. 28, a touch panel 8004 connected to an FPC 8003, a frame 8009, a printed board 8010, and a battery 8011 are provided between an upper cover 8001 and a lower cover 8002.

The display panel, the touch panel, or the touch panel module of one embodiment of the present invention can be used for, for example, the touch panel 8004.

The shapes and sizes of the upper cover 8001 and the lower cover 8002 can be changed as appropriate in accordance with the size of the touch panel 8004.

The touch panel 8004 can be a resistive touch panel or a capacitive touch panel and may be formed so as to overlap with a display panel. A counter substrate (sealing substrate) of the touch panel 8004 can have a touch panel function. A photosensor may be provided in each pixel of the touch panel 8004 so that an optical touch panel can be obtained.

In the case where a transmissive or a semi-transmissive liquid crystal element is used, a backlight may be provided between the touch panel 8004 and the frame 8009. The backlight includes a light source. Note that the light source may be provided over the backlight; alternatively, the light source may be provided at an end portion of the backlight and a light diffusion plate may be further provided. Note that the backlight need not be provided in the case where a self-luminous light-emitting element such as an organic EL element is used or in the case where a reflective panel or the like is employed.

The frame 8009 protects the touch panel 8004 and also serves as an electromagnetic shield for blocking electromagnetic waves generated by the operation of the printed board 8010. The frame 8009 can also serve as a radiator plate.

The printed board 8010 is provided with a power supply circuit and a signal processing circuit for outputting a video signal and a clock signal. As a power source for supplying electric power to the power supply circuit, an external commercial power source or a power source using the battery 8011 provided separately may be used. The battery 8011 can be omitted in the case of using a commercial power source.

The touch panel 8004 can be additionally provided with a component such as a polarizing plate, a retardation plate, or a prism sheet.

Electronic devices and lighting devices can be manufactured by using the display panel, the light-emitting panel, the sensor panel, the touch panel, the touch panel module, the input device, the display device, or the input/output device of one embodiment of the present invention. Highly reliable electronic devices and lighting devices with curved surfaces can be manufactured by using the input device, the display device, or the input/output device of one embodiment of the present invention. In addition, flexible and highly reliable electronic devices and lighting devices can be manufactured by using the input device, the display device, or the input/ output device of one embodiment of the present invention. Furthermore, electronic devices and lighting devices including touch sensors with improved sensitivity can be manufactured by using the input device or the input/output device of one embodiment of the present invention.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, and a large game machine such as a pachinko machine.

In the case of having flexibility, the electronic device or the lighting device of one embodiment of the present invention can be incorporated along a curved inside/outside wall surface of a house or a building or a curved interior/exterior surface of a car.

Furthermore, the electronic device of one embodiment of the present invention may include a secondary battery. Preferably, the secondary battery is capable of being charged by contactless power transmission.

Examples of the secondary battery include a lithium ion battery such as a lithium polymer battery (lithium ion polymer battery) using a gel electrolyte, a nickel-hydride battery, a nickel-cadmium battery, an organic radical battery, a lead-acid battery, an air battery, a nickel-zinc battery, and a silver-zinc battery.

The electronic device of one embodiment of the present invention may include an antenna. When a signal is received by the antenna, an image, data, or the like can be displayed on a display portion. When the electronic device includes a secondary battery, the antenna may be used for contactless power transmission.

FIGS. 29A to 29H and FIGS. 30A and 30B illustrate electronic devices. These electronic devices can each include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, and the like.

Figure 29A:
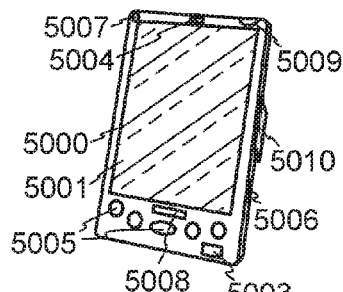
FIGS. 29A to 29H illustrate electronic devices of one embodiment.

FIG. 29A illustrates a mobile computer, which can include a switch 5009, an infrared port 5010, and the like in addition to the above components.

Figure 29B:
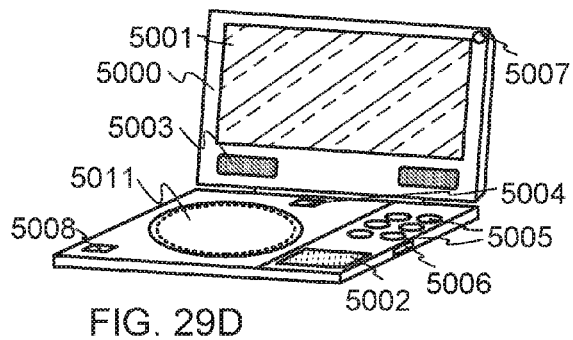

FIG. 29B illustrates a portable image reproducing device provided with a recording medium (e.g., a DVD reproducing device), which can include a second display portion 5002, a recording medium reading portion 5011, and the like in addition to the above components.

Figure 29C:
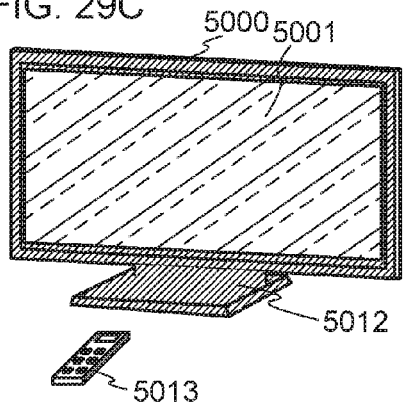

FIG. 29C illustrates a television device, which can include a stand 5012 and the like in addition to the above components. The television device can be operated by an operation switch of the housing 5000 or a separate remote controller 5013. With operation keys of the remote controller 5013, channels and volume can be controlled, and images displayed on the display portion 5001 can be controlled. The remote controller 5013 may be provided with a display portion for displaying data output from the remote controller 5013.

Figure 29D:
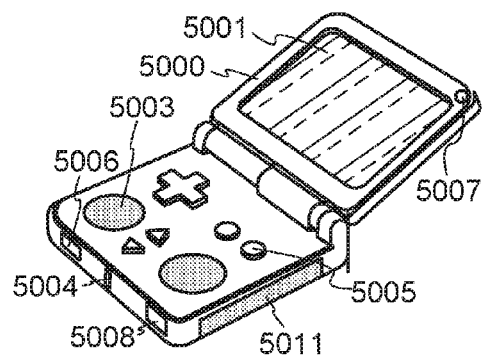

FIG. 29D illustrates a portable game machine, which can include the recording medium reading portion 5011 and the like in addition to the above components.

Figure 29E:
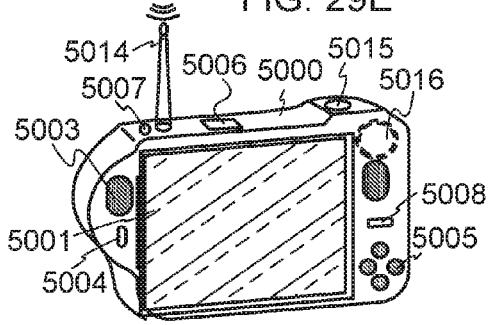

FIG. 29E illustrates a digital camera that has a television reception function and can include an antenna 5014, a shutter button 5015, an image receiving portion 5016, and the like in addition to the above components.

Figure 29F:
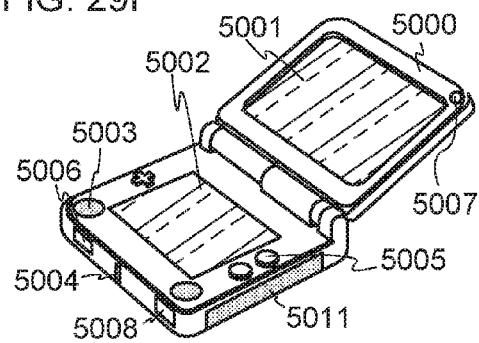

FIG. 29F illustrates a portable game machine, which can include the second display portion 5002, the recording medium reading portion 5011, and the like in addition to the above components.

Figure 29G:
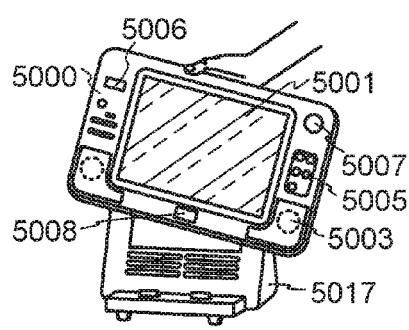

FIG. 29G illustrates a portable television receiver, which can include a charger 5017 capable of transmitting and receiving signals, and the like in addition to the above components.

Figure 29H:
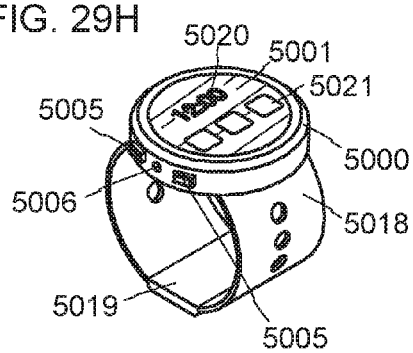

FIG. 29H illustrates a wrist-watch-type information terminal, which can include a band 5018, a clasp 5019, and the like in addition to the above components. The display portion 5001 mounted in the housing 5000 also serving as a bezel includes a non-rectangular display region. The display portion 5001 can display an icon 5020 indicating time, another icon 5021, and the like.

Figure 30A:
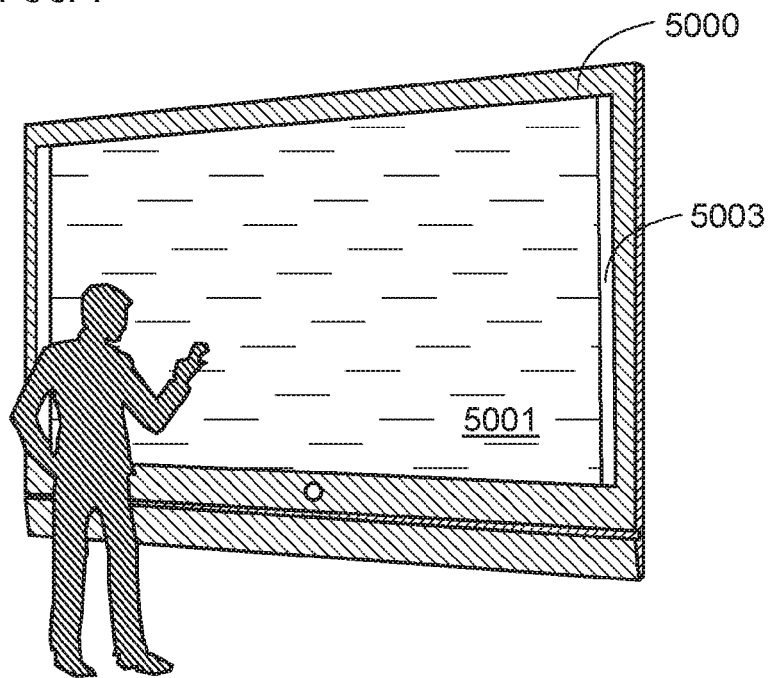
FIGS. 30A and 30B illustrate electronic devices of one embodiment.
Figure 30B:
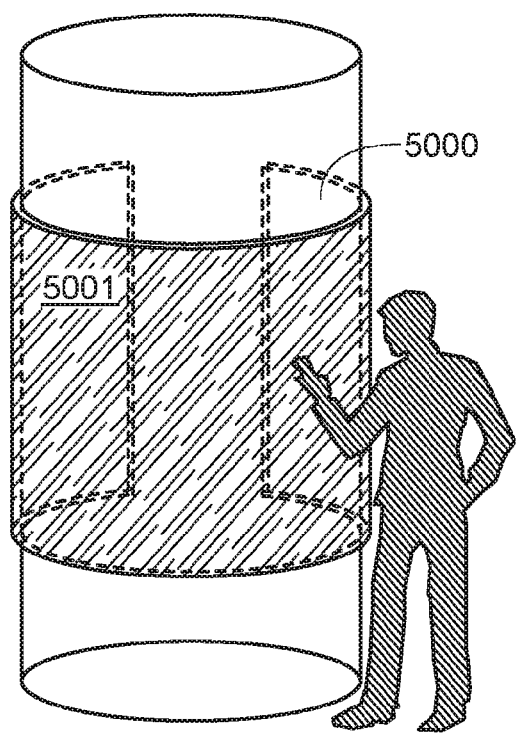

FIG. 30A illustrates a digital signage. FIG. 30B illustrates a digital signage mounted on a cylindrical pillar.

The electronic devices illustrated in FIGS. 29A to 29H and FIGS. 30A and 30B can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion. Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a recording medium (an external recording medium or a recording medium incorporated in the camera), a function of displaying a photographed image on a display portion, or the like. Note that the functions of the electronic devices illustrated in FIGS. 29A to 29H and FIGS. 30A and 30B are not limited thereto, and the electronic devices can have a variety of functions.

FIGS. 31A, 31B, 31C1, 31C2, 31D, and 31E illustrate examples of an electronic device including a display portion 7000 with a curved surface. The display surface of the display portion 7000 is bent, and images can be displayed on the bent display surface. The display portion 7000 may have flexibility.

The display portion 7000 can be formed using the functional panel, the display panel, the light-emitting panel, the sensor panel, the touch panel, the display device, the input/output device, or the like of one embodiment of the present invention. One embodiment of the present invention makes it possible to provide a highly reliable electronic device having a curved display portion.

FIG. 31A illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 31A includes a touch sensor in the display portion 7000. Operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; for example, switching from a mail creation screen to a main menu screen can be performed.

FIG. 31B illustrates an example of a television set. In a television set 7200, the display portion 7000 is incorporated into a housing 7201. Here, the housing 7201 is supported by a stand 7203.

The television set 7200 illustrated in FIG. 31B can be operated with an operation switch of the housing 7201 or a separate remote controller 7211. The display portion 7000 may include a touch sensor, and can be operated by touch on the display portion 7000 with a finger or the like. The remote controller 7211 may be provided with a display portion for displaying data output from the remote controller 7211. With operation keys or a touch panel of the remote controller 7211, channels and volume can be controlled and images displayed on the display portion 7000 can be controlled.

Note that the television set 7200 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

FIGS. 31C1, 31C2, 31D, and 31E illustrate examples of a portable information terminal. Each of the portable information terminals includes a housing 7301 and the display portion 7000. Each of the portable information terminals may also include an operation button, an external connection port, a speaker, a microphone, an antenna, a battery, or the like. The display portion 7000 is provided with a touch sensor. An operation of the portable information terminal can be performed by touch on the display portion 7000 with a finger, a stylus, or the like.

FIG. 31C1 is a perspective view of a portable information terminal 7300. FIG. 31C2 is a top view of the portable information terminal 7300. FIG. 31D is a perspective view of a portable information terminal 7310. FIG. 31E is a perspective view of a portable information terminal 7320.

Each of the portable information terminals illustrated in this embodiment functions as, for example, one or more of a telephone set, a notebook, and an information browsing system. Specifically, the portable information terminals each can be used as a smartphone. Each of the portable information terminals illustrated in this embodiment is capable of executing, for example, a variety of applications such as mobile phone calls, e-mailing, reading and editing texts, music reproduction, Internet communication, and a computer game.

The portable information terminals 7300, 7310, and 7320 can display characters and image information on its plurality of surfaces. For example, as illustrated in FIGS. 31C1 and 31D, three operation buttons 7302 can be displayed on one surface, and information 7303 indicated by a rectangle can be displayed on another surface. FIGS. 31C1 and 31C2 illustrate an example in which information is displayed at the top of the portable information terminal. FIG. 31D illustrates an example in which information is displayed on the side of the portable information terminal. Information may be displayed on three or more surfaces of the portable information terminal. FIG. 31E illustrates an example in which information 7304, information 7305, and information 7306 are displayed on different surfaces.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information.

For example, a user of the portable information terminal 7300 can see the display (here, the information 7303) on the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

FIGS. 31F to 31H each illustrate an example of a lighting device having a curved light-emitting portion.

The light-emitting portion included in each of the lighting devices illustrated in FIGS. 31F to 31H can be manufactured using the functional panel, the display panel, the light-emitting panel, the sensor panel, the touch panel, the display device, the input/output device, or the like of one embodiment of the present invention. According to one embodiment of the present invention, a highly reliable lighting device having a curved light-emitting portion can be provided.

A lighting device 7400 illustrated in FIG. 31F includes a light-emitting portion 7402 with a wave-shaped light-emitting surface and thus is a good-design lighting device.

A light-emitting portion 7412 included in a lighting device 7410 illustrated in FIG. 31G has two convex-curved light-emitting portions symmetrically placed. Thus, all directions can be illuminated with the lighting device 7410 as a center.

A lighting device 7420 illustrated in FIG. 31H includes a concave-curved light-emitting portion 7422. This is suitable for illuminating a specific range because light emitted from the light-emitting portion 7422 is collected to the front of the lighting device 7420. In addition, with this structure, a shadow is less likely to be produced.

The light-emitting portion included in each of the lighting devices 7400, 7410 and 7420 may have flexibility. The light-emitting portion may be fixed on a plastic member, a movable frame, or the like so that a light-emitting surface of the light-emitting portion can be bent freely depending on the intended use.

The lighting devices 7400, 7410, and 7420 each include a stage 7401 provided with an operation switch 7403 and the light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular region can be brightly illuminated, or the light-emitting surface is curved to have a convex shape, whereby a whole room can be brightly illuminated.

FIGS. 32A1, 32A2, and 32B to 32I each illustrate an example of a portable information terminal including a display portion 7001 having flexibility.

The display portion 7001 is manufactured using the functional panel, the display panel, the light-emitting panel, the sensor panel, the touch panel, the display device, the input/output device, or the like of one embodiment of the present invention. For example, a display device or an input/output device that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a display portion having flexibility.

FIGS. 32A1 and 32A2 are a perspective view and a side view illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501.

The portable information terminal 7500 can receive a video signal with a control portion incorporated therein and can display the received image on the display portion 7001. The portable information terminal 7500 incorporates a battery. A terminal portion for connecting a connector may be included in the housing 7501 so that a video signal or power can be directly supplied from the outside with a wiring.

By pressing the operation buttons 7503, power ON/OFF, switching of displayed images, and the like can be performed. Although FIGS. 32A1, 32A2, and 32B show an example in which the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 32B illustrates the portable information terminal 7500 in a state where the display portion 7001 is pulled out with the display portion tab 7502. Images can be displayed on the display portion 7001 in this state. In addition, the portable information terminal 7500 may perform different displays in the state where part of the display portion 7001 is rolled as shown in FIG. 32A1 and in the state where the display portion 7001 is pulled out with the display portion tab 7502 as shown in FIG. 32B. For example, in the state shown in FIG. 32A1, the rolled portion of the display portion 7001 is put in a non-display state, reducing the power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 32C to 32E illustrate an example of a foldable portable information terminal. FIG. 32C illustrates a portable information terminal 7600 that is opened. FIG. 32D illustrates the portable information terminal 7600 that is being opened or being folded. FIG. 32E illustrates the portable information terminal 7600 that is folded. The portable information terminal 7600 is highly portable when folded, and is highly browsable when opened because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 32F and 32G illustrate an example of a foldable portable information terminal. FIG. 32F illustrates a portable information terminal 7650 that is folded so that the display portion 7001 is on the inside. FIG. 32G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

FIG. 32H illustrates an example of a flexible portable information terminal. A portable information terminal 7700 includes a housing 7701 and the display portion 7001. The portable information terminal 7700 may further include buttons 7703a and 7703b which serve as input means, speakers 7704a and 7704b which serve as sound output means, an external connection port 7705, a microphone 7706, or the like. A flexible battery 7709 can be included in the portable information terminal 7700. The battery 7709 may be arranged to overlap with the display portion 7001, for example.

The housing 7701, the display portion 7001, and the battery 7709 have flexibility. Thus, it is easy to curve the portable information terminal 7700 into a desired shape or to twist the portable information terminal 7700. For example, the portable information terminal 7700 can be folded so that the display portion 7001 is on the inside or on the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 is lightweight and therefore can be used conveniently in various situations. For example, the portable information terminal 7700 can be used in the state where the upper portion of the housing 7701 is suspended by a clip or the like, or in the state where the housing 7701 is fixed to a wall by magnets or the like.

FIG. 32I illustrates an example of a wrist-watch-type portable information terminal. The portable information terminal 7800 includes a band 7801, the display portion 7001, an input/output terminal 7802, operation buttons 7803, and the like. The band 7801 has a function as a housing. A flexible battery 7805 can be included in the portable information terminal 7800. The battery 7805 may be arranged to overlap with the display portion 7001 and the band 7801, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, application can be started.

The portable information terminal 7800 can employ near field communication conformable to a communication standard. For example, mutual communication between the portable information terminal and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

Figure 33A:
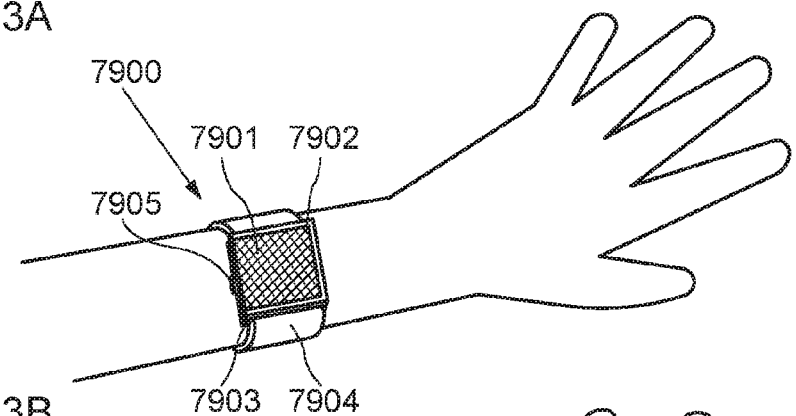
FIGS. 33A to 33E illustrate electronic devices of one embodiment.
Figure 33B:
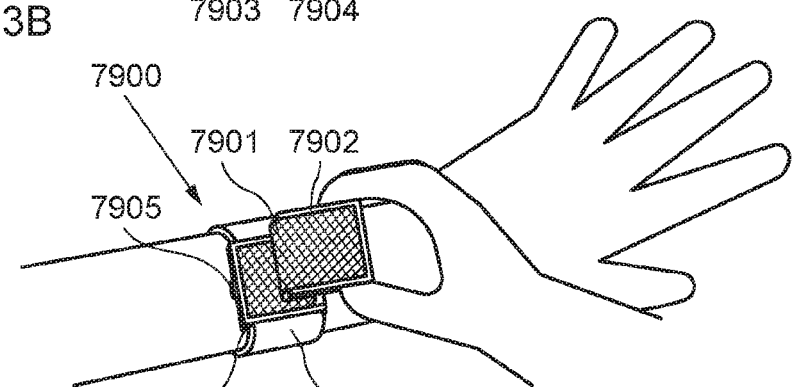
Figure 33C:
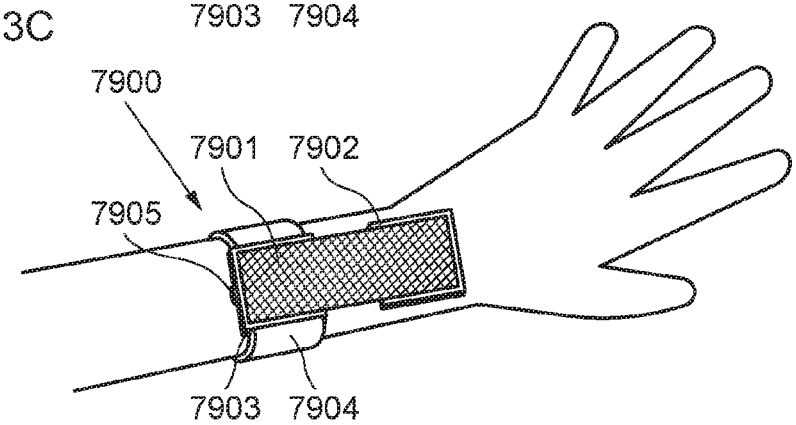

FIGS. 33A to 33C illustrate an example of a watch-type foldable portable information terminal. A portable information terminal 7900 includes a display portion 7901, a housing 7902, a housing 7903, a band 7904, an operation button 7905, and the like.

The portable information terminal 7900 can be reversibly changed in shape from a state in which the housing 7902 overlaps with the housing 7903 as illustrated in FIG. 33A into a state in which the display portion 7901 is opened as illustrated in FIG. 33C by lifting the housing 7902 as illustrated in FIG. 33B. Therefore, the portable information terminal 7900 can be generally used in a state where the display portion 7901 is folded and can be used with a wide display region by developing the display portion 7901.

When the display portion 7901 functions as a touch panel, the portable information terminal 7900 can be operated by touch on the display portion 7901. The portable information terminal 7900 can be operated by pushing, turning, or sliding the operation button 7905 vertically, forward, or backward.

A lock mechanism is preferably provided so that the housing 7902 and the housing 7903 are not detached from each other accidentally when overlapping with each other as illustrated in FIG. 33A. In that case, preferably, the lock state can be canceled by pushing the operation button 7905, for example. Alternatively, the lock state may be canceled by utilizing restoring force of a spring or the like as a mechanism in which the portable information terminal is automatically changed in form from the state illustrated in FIG. 33A into the state illustrated in FIG. 33C. Alternatively, the position of the housing 7902 relative to the housing 7903 may be fixed by utilizing magnetic force instead of the lock mechanism. By utilizing magnetic force, the housing 7902 and the housing 7903 can be easily attached or detached.

Figure 33D:
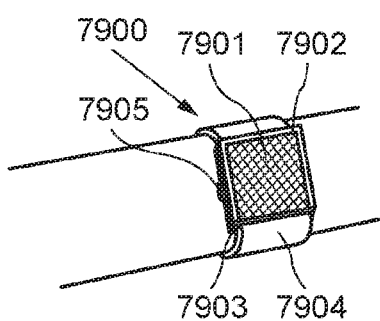
Figure 33E:
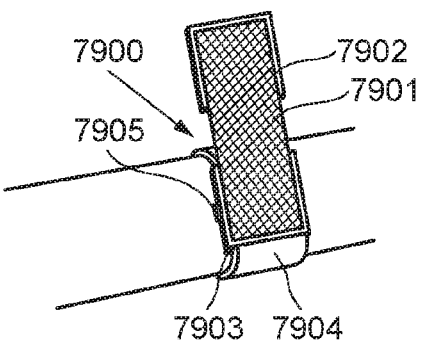

Although the display portion 7901 can be opened in a direction substantially perpendicular to the bending direction of the band 7904 in FIGS. 33A to 33C, the display portion 7901 may be opened in a direction substantially parallel to the bending direction of the band 7904 as illustrated in FIGS. 33D and 33E. In that case, the display portion 7901 may be used in a bent state to be wound to the band 7904.

The electronic devices described in this embodiment each include a display portion for displaying some kind of information. The display device such as the display panel, the touch panel, or the touch panel module of one embodiment of the present invention can be used for the display portion.

At least part of this embodiment can be implemented in combination with any of the other embodiments described in this specification as appropriate.

EXPLANATION OF REFERENCE

10: display device, 11: opening, 11A: opening, 11B: opening, 12: opening, 15: region, 15A: region, 21: substrate, 23: pixel electrode, 24: EL layer, 25: conductive layer, 31: substrate, 32: display portion, 32A: region, 32B: region, 34: circuit, 35: wiring, 39: adhesive layer, 40: light-emitting element, 42: FPC, 43: IC, 51a: coloring layer, 51b: coloring layer, 52: light-blocking layer, 60: liquid crystal element, 70: transistor, 71: conductive layer, 72: semiconductor layer, 73: insulating layer, 74a: conductive layer, 74b: conductive layer, 81: insulating layer, 82: insulating layer, 82A: projecting portion, 83: insulating layer, 100: touch panel, 111: conductive layer, 112: EL layer, 113: conductive layer, 130: polarizing plate, 131: coloring layer, 131a: coloring layer, 131b: coloring layer, 132: light-blocking layer, 133: light-blocking layer, 134: coloring layer, 135: structure body, 136: insulating layer, 141: adhesive layer, 142: adhesive layer, 146: conductive film, 147: conductive film, 148: conductive film, 149: nanowire, 150: input device, 151: electrode, 152: electrode, 153: bridge electrode, 155: wiring, 156: wiring, 157: FPC, 158: IC, 160: substrate, 161: insulating layer, 162: insulating layer, 163: insulating layer, 164: insulating layer, 165: adhesive layer, 168: IC, 169: connection portion, 170: substrate, 171: substrate, 172: adhesive layer, 173: insulating layer, 181: substrate, 182: adhesive layer, 183: insulating layer, 191: conductive layer, 192: conductive layer, 193: liquid crystal, 194: conductive layer, 195: insulating layer, 200: display device, 201: transistor, 202: transistor, 203: capacitor, 204: terminal portion, 205: transistor, 206: transistor, 207: terminal portion, 210: pixel, 211: insulating layer, 212: insulating layer, 213: insulating layer, 214: insulating layer, 219: opening, 220: insulating layer, 221: conductive layer, 222: conductive layer, 223: conductive layer, 224: conductive layer, 231: semiconductor layer, 242: connection layer, 243: connector, 244: structure body, 251: opening, 252: connection portion, 601: pulse voltage output circuit, 602: current sensing circuit, 603: capacitance, 621: electrode, 622: electrode, 723: electrode, 726: insulating layer, 727: insulating layer, 728: insulating layer, 729: insulating layer, 741: insulating layer, 742: semiconductor layer, 744a: electrode, 744b: electrode, 746: electrode, 755: impurity, 771: substrate, 772: insulating layer, 810: transistor, 811: transistor, 820: transistor, 821: transistor, 825: transistor, 826: transistor, 830: transistor, 831: transistor, 840: transistor, 841: transistor, 842: transistor, 843: transistor, 844: transistor, 845: transistor, 846: transistor, 847: transistor, 5000: housing, 5001: display portion, 5002: display portion, 5003: speaker, 5004: LED lamp, 5005: operation key, 5006: connection terminal, 5007: sensor, 5008: microphone, 5009: switch, 5010: infrared port, 5011: recording medium reading portion, 5012: stand, 5013: remote controller, 5014: antenna, 5015: shutter button, 5016: image receiving portion, 5017: charger, 5018: band, 5019: clasp, 5020: icon, 5021: icon, 7000: display portion, 7001: display portion, 7100: mobile phone device, 7101: housing, 7103: operation button, 7104: external connection port, 7105: speaker, 7106: microphone, 7200: television device, 7201: housing, 7203: stand, 7211: remote controller, 7300: portable information terminal, 7301: housing, 7302: operation button, 7303: information, 7304: information, 7305: information, 7306: information, 7310: portable information terminal, 7320: portable information terminal, 7400: lighting device, 7401: stage, 7402: light-emitting portion, 7403: operation switch, 7410: lighting device, 7412: light-emitting portion, 7420: lighting device, 7422: light-emitting portion, 7500: portable information terminal, 7501: housing, 7502: display portion tab, 7503: operation button, 7600: portable information terminal, 7601: housing, 7602: hinge, 7650: portable information terminal, 7651: non-display portion, 7700: portable information terminal, 7701: housing, 7703a: button, 7703b: button, 7704a: speaker, 7704b: speaker, 7705: external connection port, 7706: microphone, 7709: battery, 7800: portable information terminal, 7801: band, 7802: input/output terminal, 7803: operation button, 7804: icon, 7805: battery, 7900: portable information terminal, 7901: display portion, 7902: housing, 7903: housing, 7904: band, 7905: operation button, 8000: display module, 8001: upper cover, 8002: lower cover, 8003: FPC, 8004: touch panel, 8009: frame, 8010: printed board, 8011: battery.

This application is based on Japanese Patent Application serial No. 2016-054682 filed with Japan Patent Office on Mar. 18, 2016, the entire contents of which are hereby incorporated by reference.

The invention claimed is:

1. A display device comprising:
a first insulating layer having a first opening;
a first pixel electrode and a second pixel electrode over the first insulating layer;
a second insulating layer having a second opening, the second insulating layer being over and in contact with each of a top surface of the first pixel electrode and a top surface of the second pixel electrode; and
an adhesive layer over the second insulating layer,
wherein a bottom surface of the first opening is positioned above a bottom surface of the first insulating layer,
wherein the second opening penetrates the second insulating layer to be integrated with the first opening,
wherein the first opening and the second opening are between the first pixel electrode and the second pixel electrode,
wherein a periphery of the second opening is positioned on an inner side than a periphery of the first opening in a top view, and
wherein the adhesive layer includes a region overlapping with the second insulating layer below the second insulating layer.

2. The display device according to claim 1,
wherein a length of an eave-shaped projecting portion of the second insulating layer over the first insulating layer is greater than or equal to 0.05 µm and less than or equal to 5.0 µm.

3. The display device according to claim 1,
wherein a width of a short side of the second opening in a top view is greater than or equal to 0.5 µm and less than or equal to 20 µm.

4. The display device according to claim 1,
wherein the first insulating layer includes an organic resin material, and
wherein the second insulating layer includes an inorganic insulating material.

5. The display device according to claim 1,
wherein the first insulating layer includes acrylic, and
wherein the second insulating layer includes silicon oxynitride.

6. The display device according to claim 1,
wherein the display device is incorporated in one selected from the group consisting of a mobile computer, a portable image reproducing device, a television device, a portable game machine, a digital camera, a wrist-watch-type information terminal, a digital signage, and a mobile phone.

7. A display device comprising:
a first insulating layer having a first opening;
a first pixel electrode and a second pixel electrode over the first insulating layer;
a second insulating layer over and in contact with each of a top surface of the first pixel electrode and a top surface of the second pixel electrode; and
an adhesive layer over the second insulating layer,
wherein a top surface of the first opening is covered with the second insulating layer, wherein a bottom surface of the first opening is positioned above a bottom surface of the first insulating layer, wherein the first opening is between the first pixel electrode and the second pixel electrode, wherein the second insulating layer includes a first projecting portion that is an eave-shaped portion positioned above a side surface of the second insulating layer in the first opening, and wherein the adhesive layer includes a region overlapping with the second insulating layer below the first projecting portion.

8. The display device according to claim 7, wherein a length of the first projecting portion is greater than or equal to 0.05 µm and less than or equal to 5.0 µm.

9. The display device according to claim 7, wherein the first insulating layer includes an organic resin material, and wherein the second insulating layer includes an inorganic insulating material.

10. The display device according to claim 7, wherein the first insulating layer includes acrylic, and wherein the second insulating layer includes silicon oxynitride.

11. The display device according to claim 7, wherein the display device is incorporated in one selected from the group consisting of a mobile computer, a portable image reproducing device, a television device, a portable game machine, a digital camera, a wristwatch-type information terminal, a digital signage, and a mobile phone.

* * * * *